(12) United States Patent
Kakehata et al.

(10) Patent No.: US 7,416,928 B2
(45) Date of Patent: Aug. 26, 2008

(54) MANUFACTURING METHOD OF SEMICONDUCTOR DEVICE

(75) Inventors: Tetsuya Kakehata, Kanagawa (JP); Yuuichi Takehara, Kanagawa (JP); Yasuhiro Jinbo, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 356 days.

(21) Appl. No.: 11/218,329

(22) Filed: Sep. 2, 2005

(65) Prior Publication Data

US 2006/0051914 A1 Mar. 9, 2006

(30) Foreign Application Priority Data

Sep. 8, 2004 (JP) ............................. 2004-260846

(51) Int. Cl.
*H01L 21/84* (2006.01)
(52) U.S. Cl. ................ 438/166; 438/476; 257/E21.414
(58) Field of Classification Search ................ 438/166, 438/402, 476; 257/E21.414
See application file for complete search history.

(56) References Cited

U.S. PATENT DOCUMENTS

| | | |
|---|---|---|
| 5,147,826 A | 9/1992 | Liu et al. |
| 5,275,851 A | 1/1994 | Fonash et al. |
| 6,066,518 A | 5/2000 | Yamazaki |
| 6,121,660 A | 9/2000 | Yamazaki et al. |
| 6,165,824 A | 12/2000 | Takano et al. |
| 6,197,624 B1 | 3/2001 | Yamazaki |
| 6,197,626 B1 | 3/2001 | Yamazaki et al. |
| 6,303,415 B1 | 10/2001 | Yamazaki |
| 6,310,363 B1 | 10/2001 | Ohnuma et al. |
| 6,346,730 B1 * | 2/2002 | Kitakado et al. ............ 257/350 |
| 6,362,866 B1 | 3/2002 | Yamazaki et al. |
| 6,368,904 B1 | 4/2002 | Yamazaki |
| 6,432,756 B1 | 8/2002 | Ohtani et al. |
| 6,433,363 B1 | 8/2002 | Yamazaki et al. |
| 6,479,333 B1 | 11/2002 | Takano et al. |
| 6,664,145 B1 * | 12/2003 | Yamazaki et al. ........... 438/149 |
| 6,680,223 B1 | 1/2004 | Yamazaki et al. |
| 6,893,503 B1 | 5/2005 | Ohnuma et al. |

(Continued)

FOREIGN PATENT DOCUMENTS

JP 11-097706 4/1999

(Continued)

*Primary Examiner*—Chandra Chaudhari
(74) *Attorney, Agent, or Firm*—Nixon Peabody LLP; Jeffrey L. Costellia

(57) ABSTRACT

An amorphous semiconductor film and a semiconductor film including an element selected from Group 15 of the periodic table are formed over a substrate. An island-shaped region including an island-shaped amorphous semiconductor film and an island-shaped semiconductor film is formed. A source electrode and a drain electrode are formed over the island-shaped region. The island-shaped semiconductor film that is not covered by the source electrode and the drain electrode is removed using the source electrode and the drain electrode as a mask. At this time, the thickness of the island-shaped amorphous semiconductor film is reduced, and a portion of the island-shaped amorphous semiconductor film is exposed. A catalytic element promoting crystallization is added into a region in which the island-shaped amorphous semiconductor film is exposed. By a heat treatment, the island-shaped amorphous semiconductor film is crystallized and the catalytic element is gettered.

19 Claims, 44 Drawing Sheets

U.S. PATENT DOCUMENTS

| | | |
|---|---|---|
| 6,900,873 B2 | 5/2005 | Yamazaki et al. |
| 6,924,528 B2 | 8/2005 | Yamazaki et al. |
| 2002/0006712 A1 | 1/2002 | Yamazaki |
| 2002/0094612 A1 | 7/2002 | Nakamura et al. |
| 2004/0101997 A1 | 5/2004 | Maekawa et al. |
| 2004/0227197 A1 | 11/2004 | Maekawa |
| 2005/0012096 A1 | 1/2005 | Yamazaki et al. |
| 2005/0045950 A1 | 3/2005 | Yamazaki |
| 2005/0157242 A1 | 7/2005 | Yamazaki et al. |
| 2007/0115416 A1 | 5/2007 | Yamazaki et al. |

FOREIGN PATENT DOCUMENTS

| | | |
|---|---|---|
| JP | 11-160734 | 6/1999 |

* cited by examiner

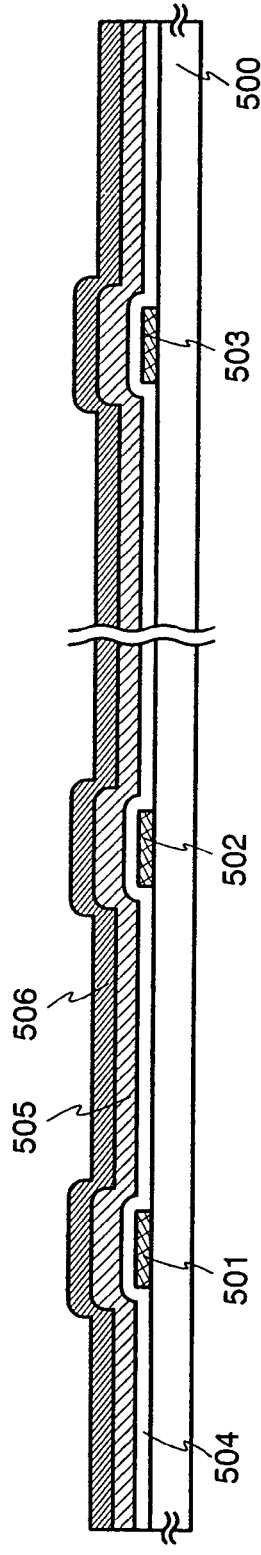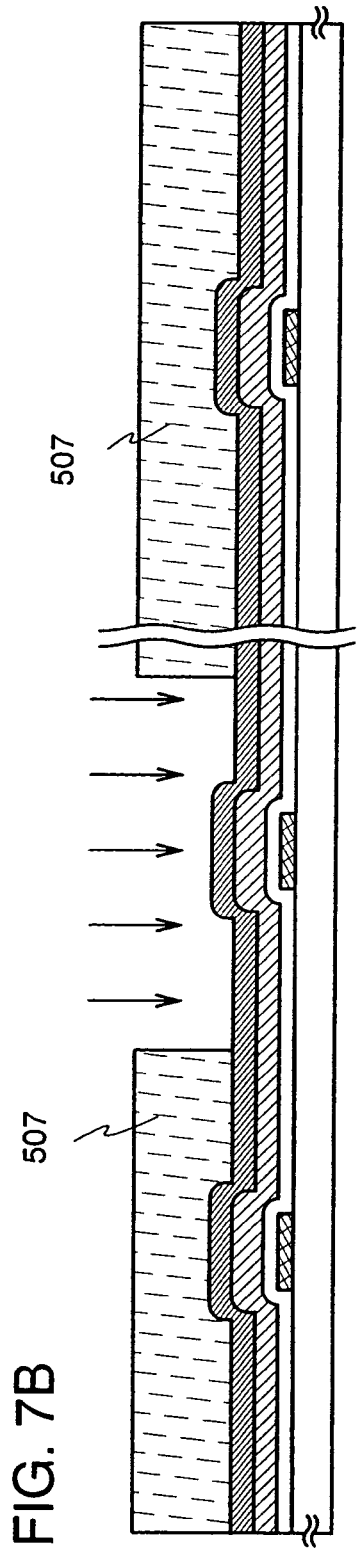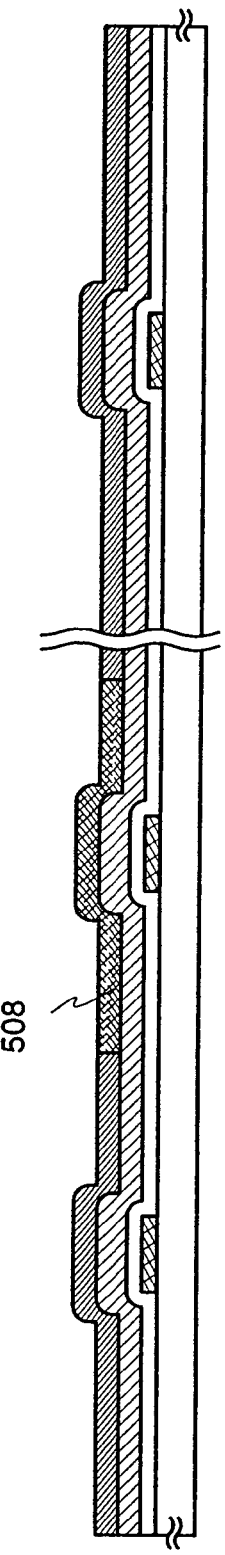

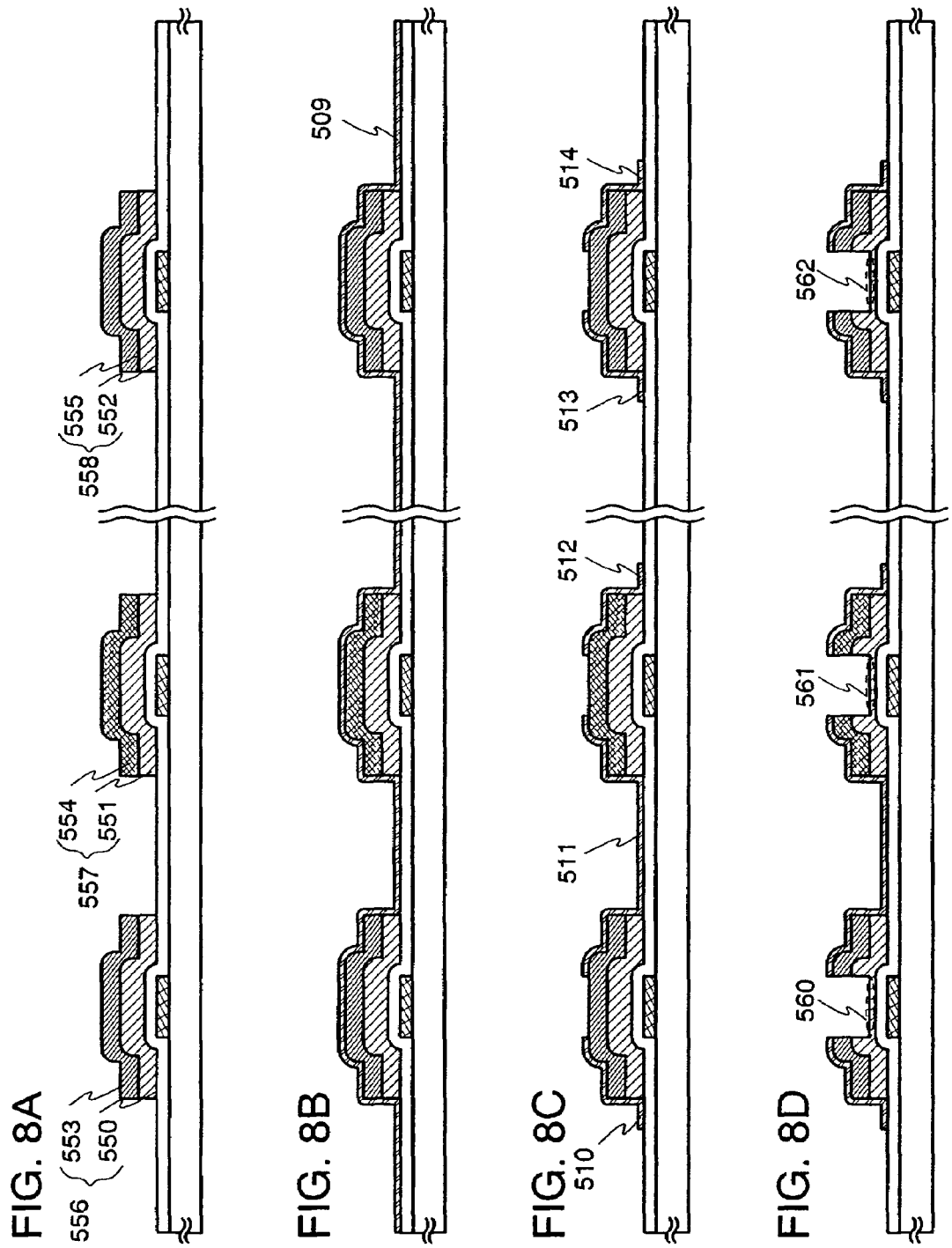

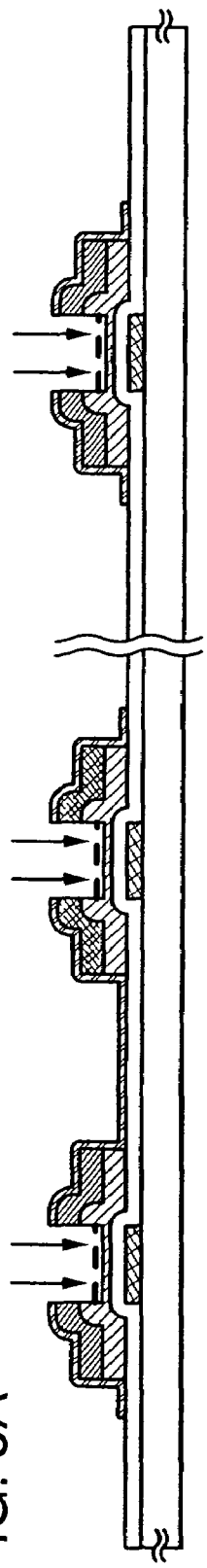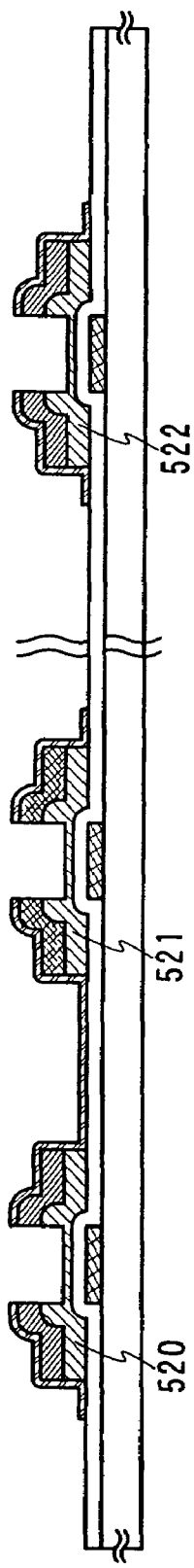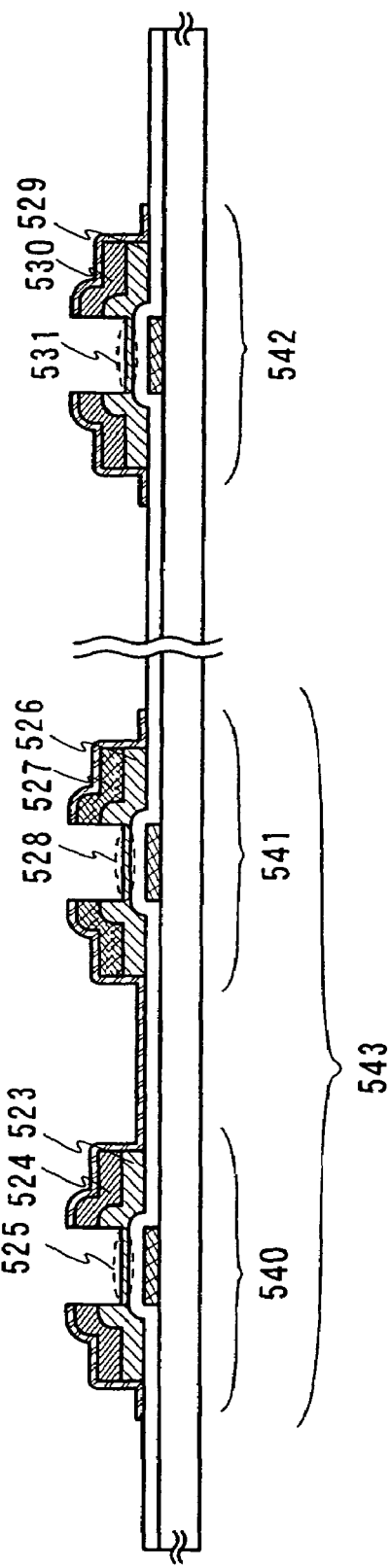

FIG. 30A
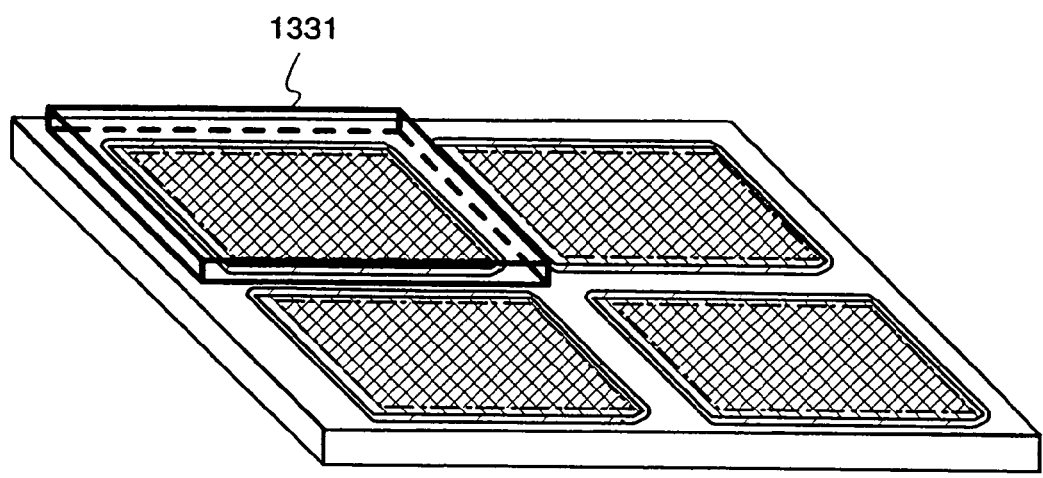
FIG. 30B
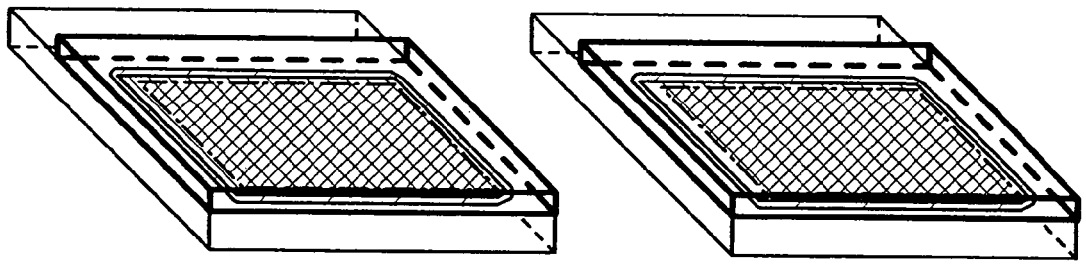
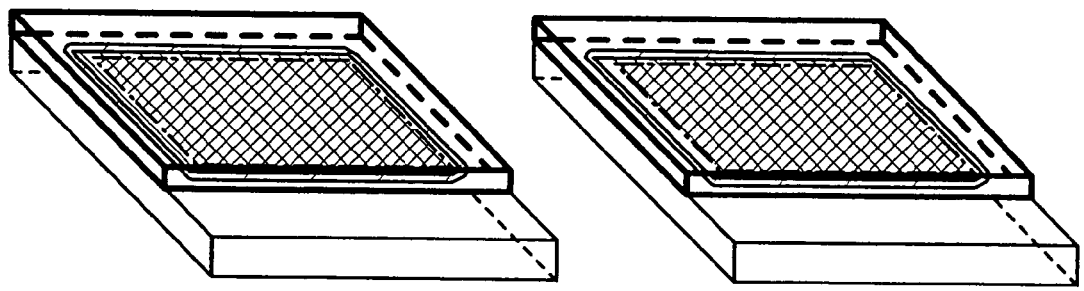

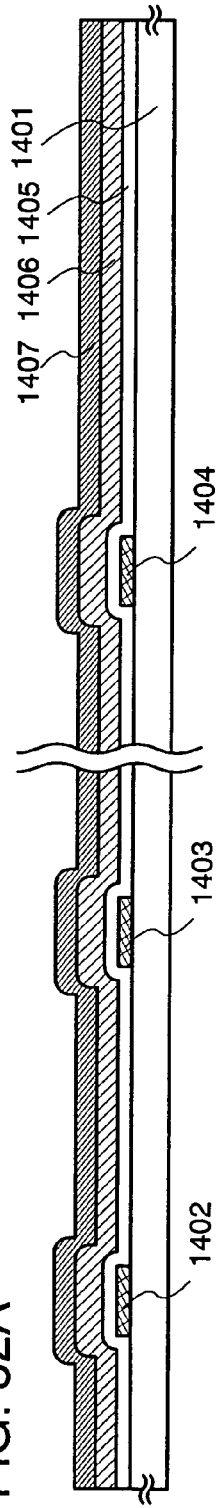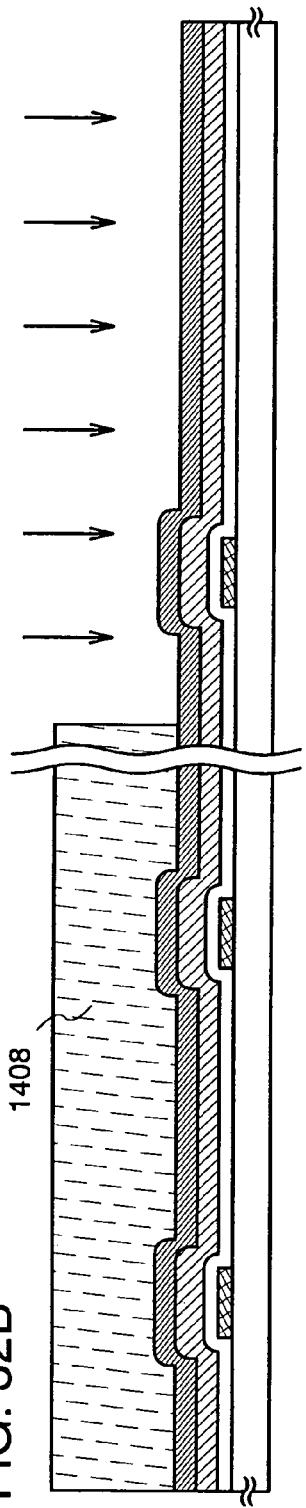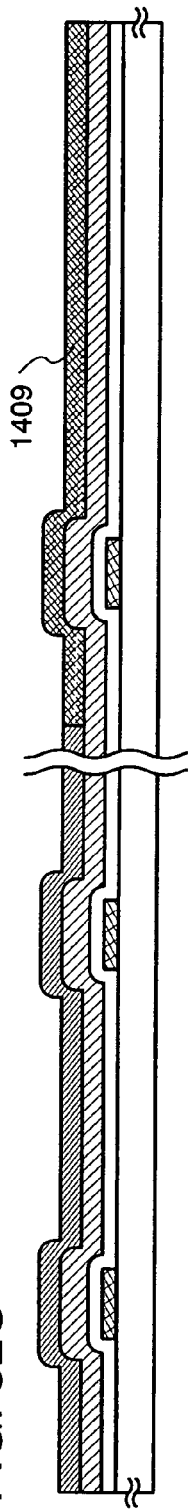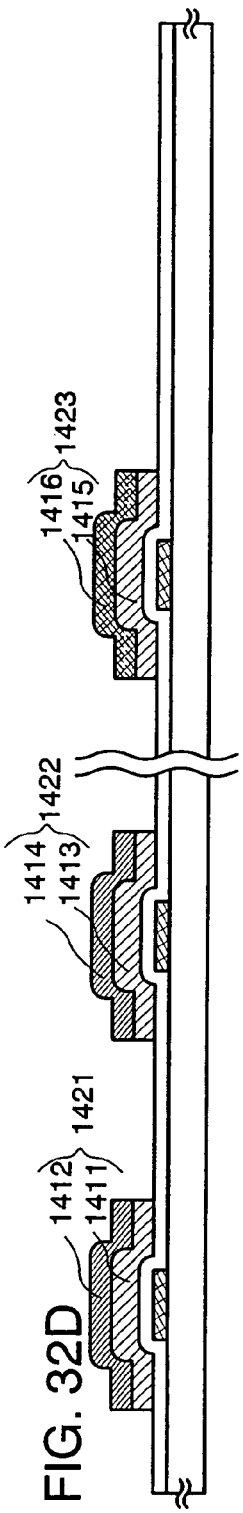

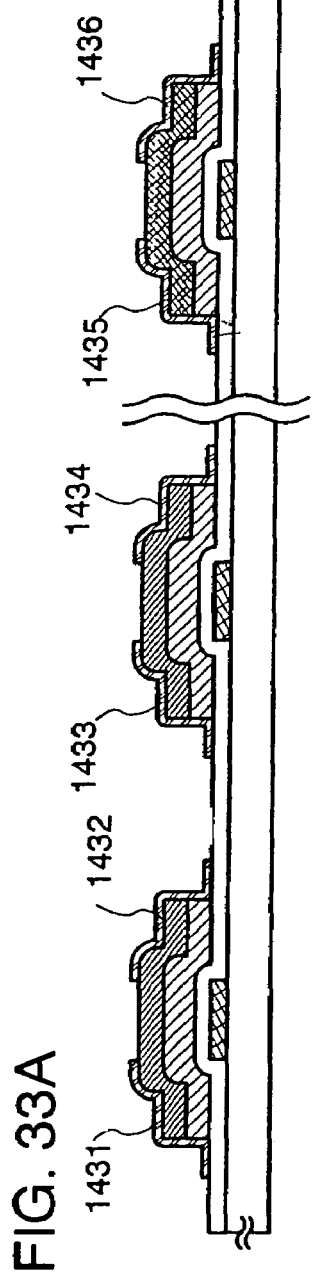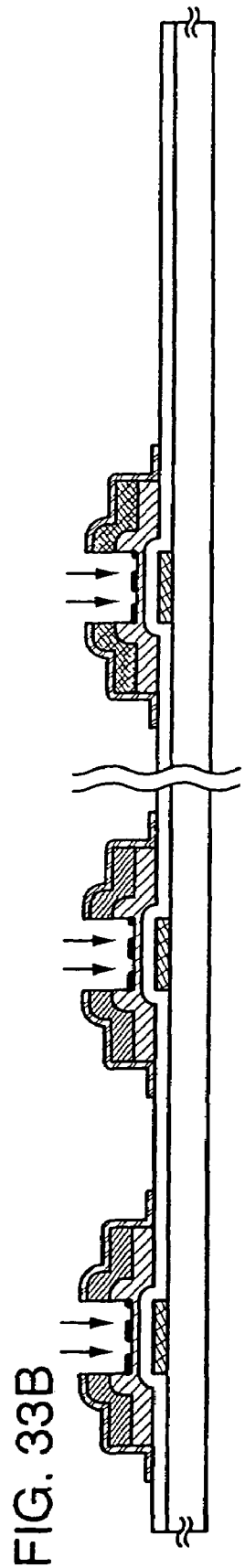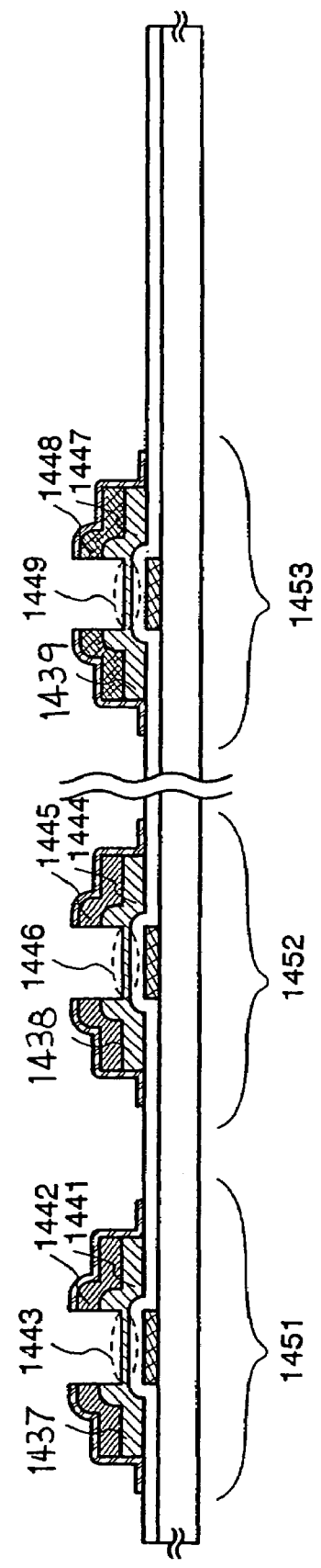

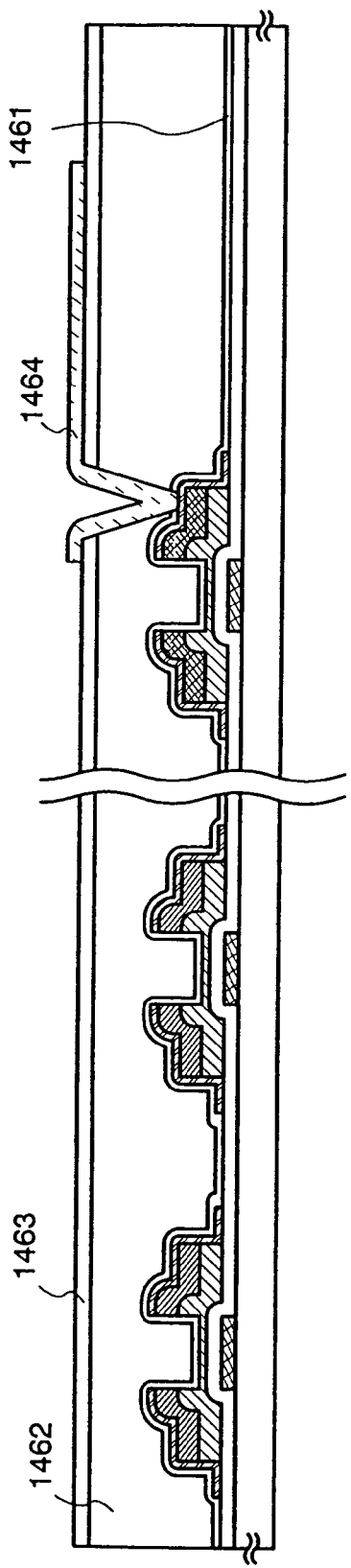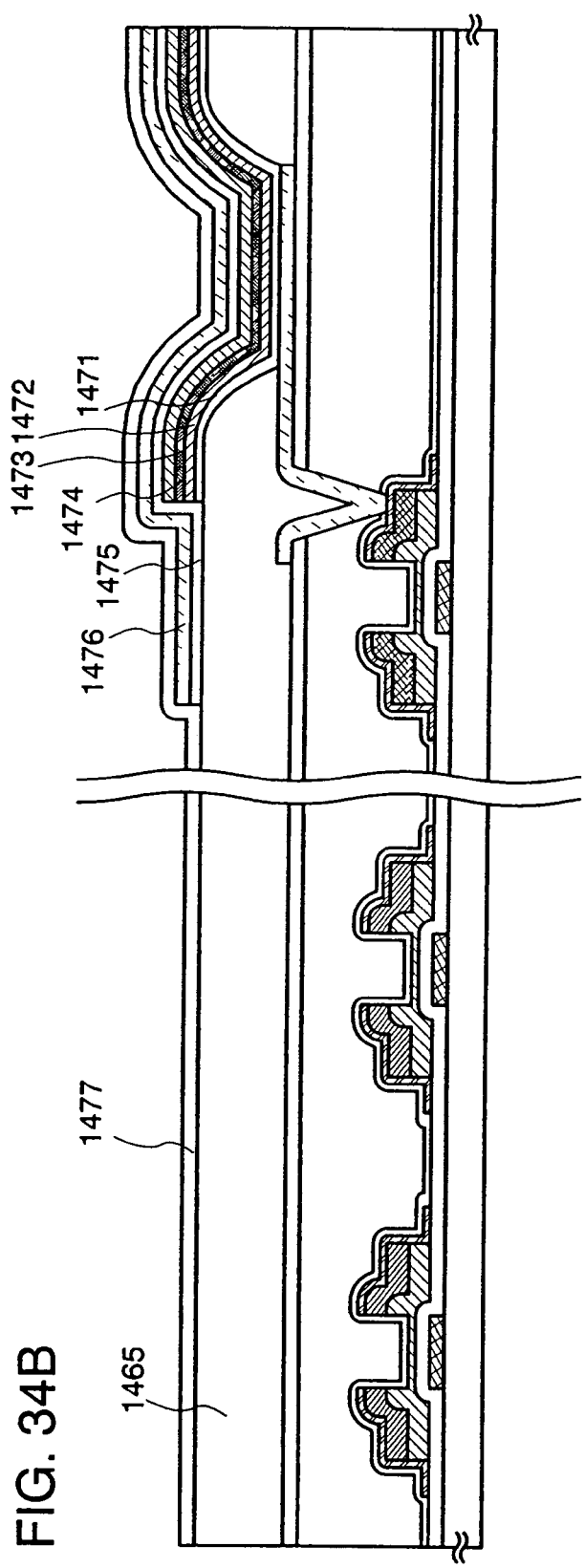

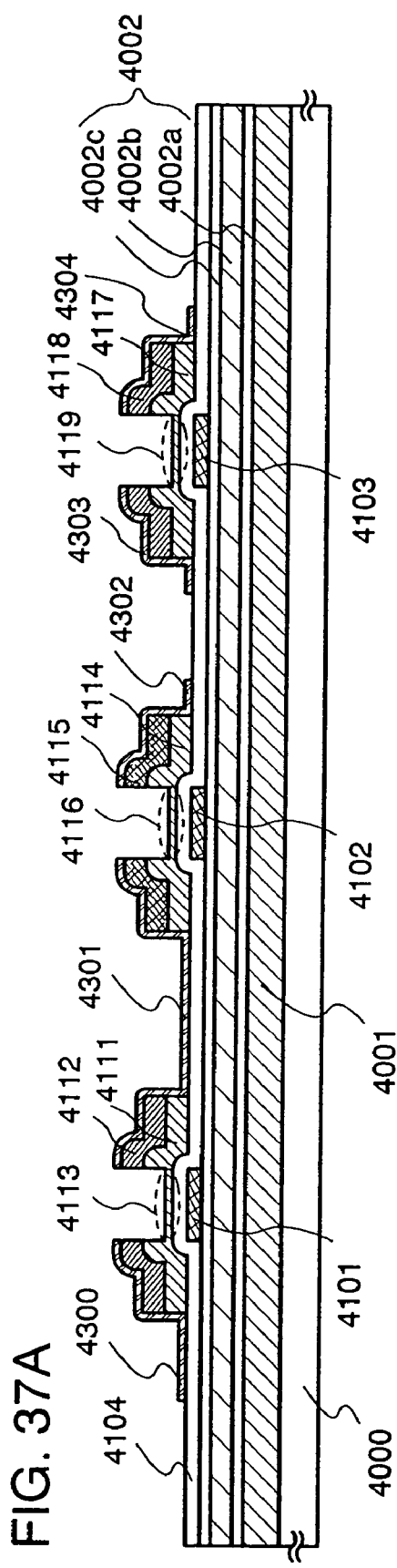
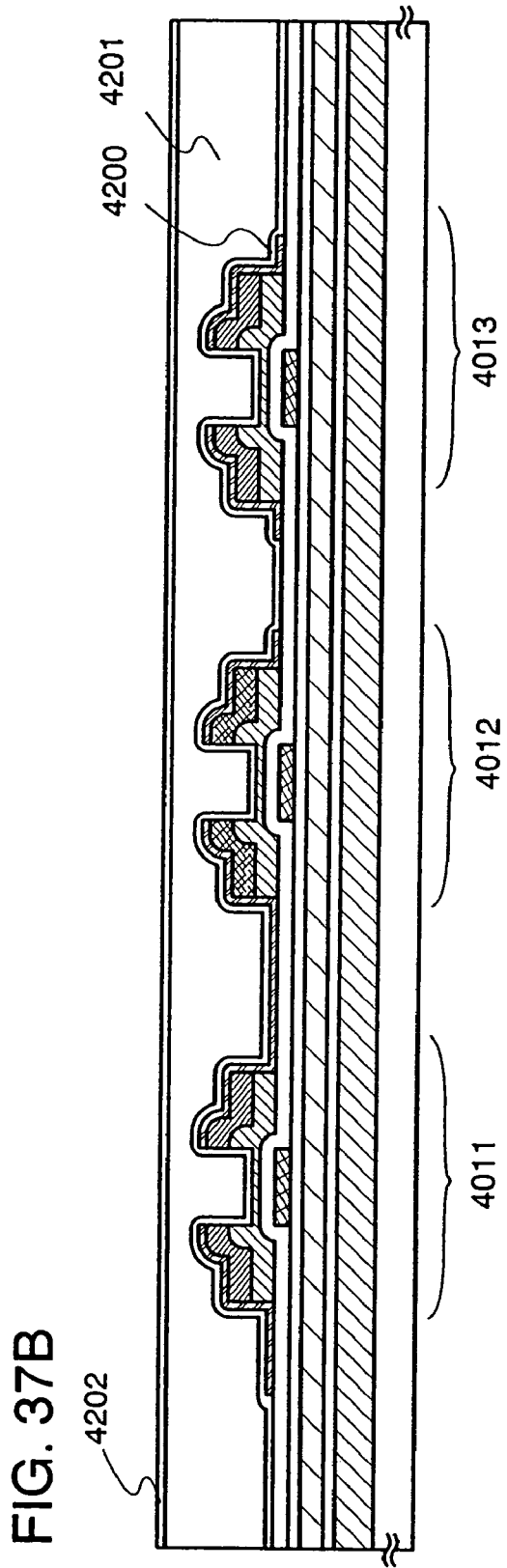
FIG. 37A
FIG. 37B

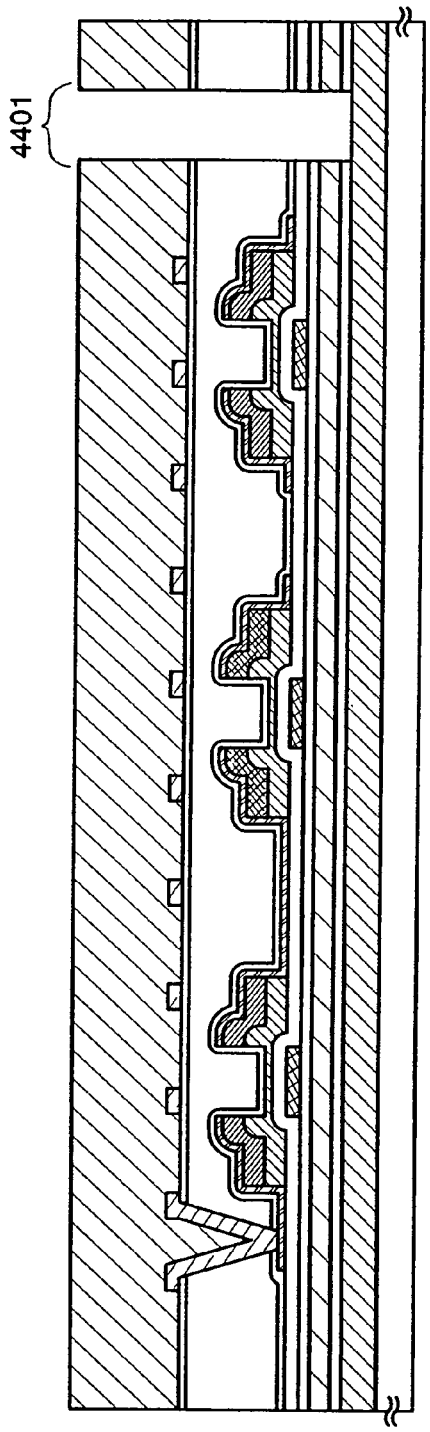
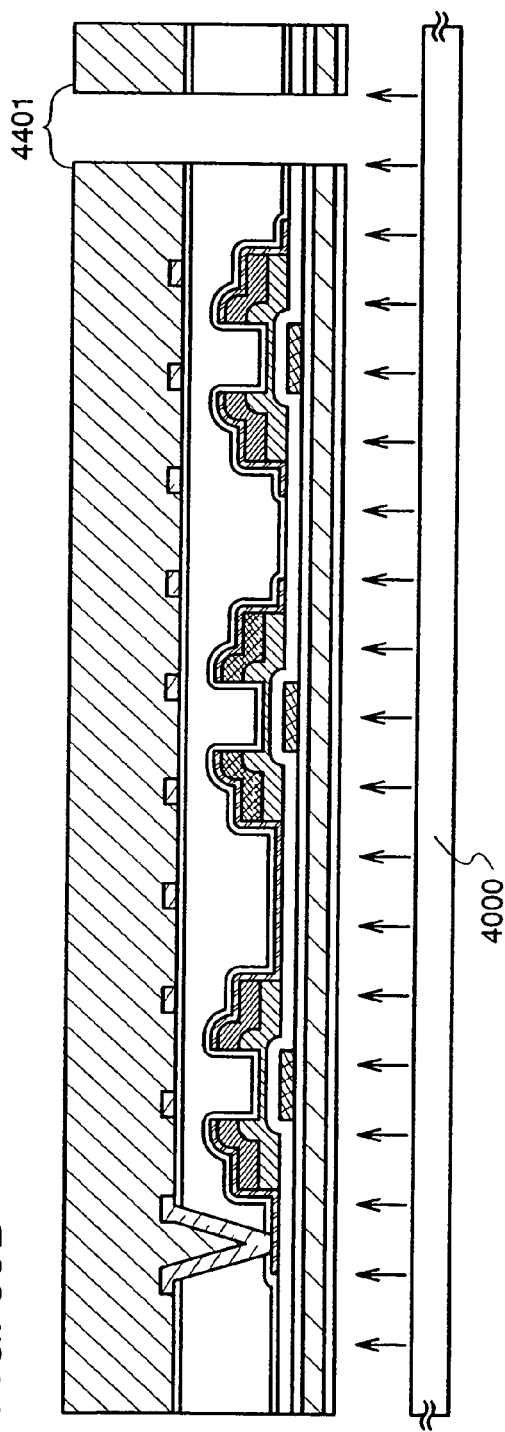

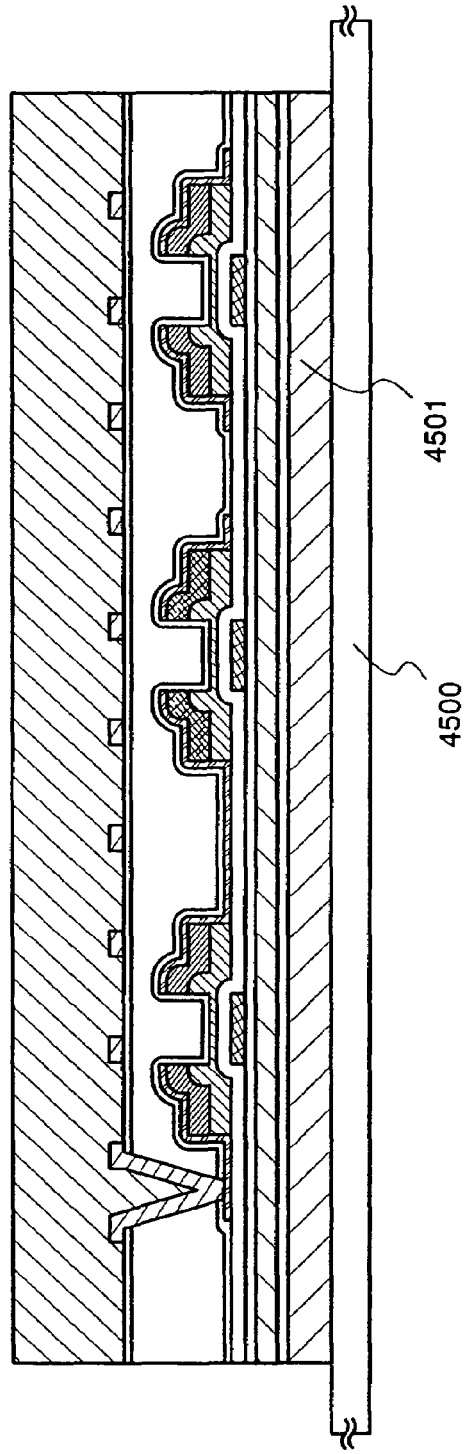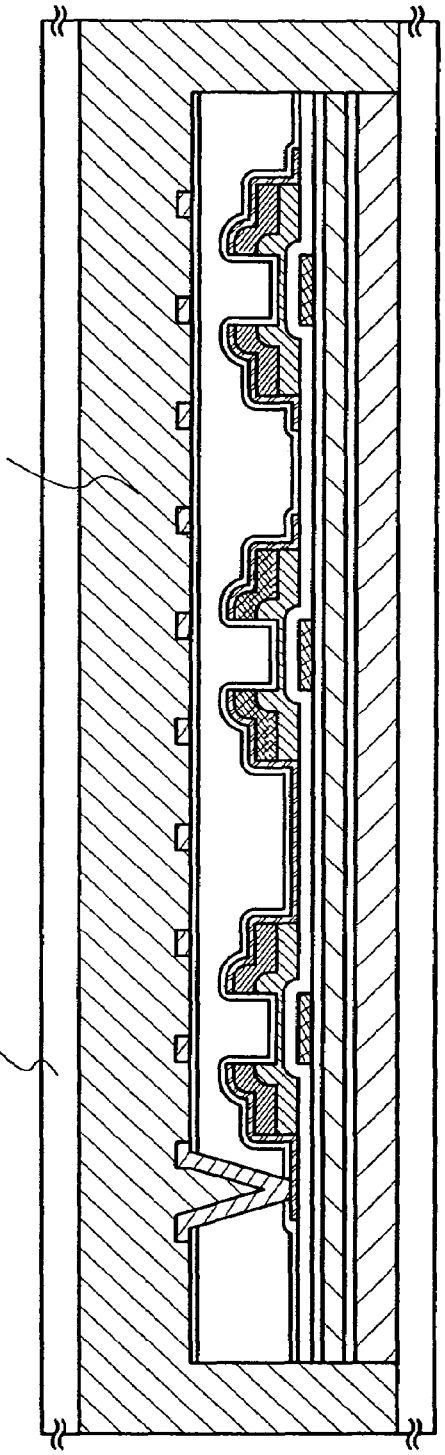
FIG. 40A
FIG. 40B

MANUFACTURING METHOD OF SEMICONDUCTOR DEVICE

BACKGROUND OF THE INVENTION

1. Field of the Invention

The present invention relates to a semiconductor element such as a thin film transistor (hereinafter, referred to as a TFT) and a method for manufacturing a semiconductor device having a circuit including such a semiconductor element. For example, the present invention relates to an electro-optical device typified by a liquid crystal display, an EL (electroluminescense) display device, an EC display device, and the like. The present invention also relates to an electrical unit for improving processing speed formed using a TFT, for example, a central processing unit (CPU), and the manufacturing method thereof. Further, the present invention relates to an electronic device with the electro-optical device and the electrical unit mounted as a part.

2. Description of the Related Art

Recently, the technique for manufacturing a semiconductor element such as a TFT over a substrate has improved drastically and has been developed so as to be applied to an active-matrix display device. Especially, a TFT using a crystalline semiconductor film can operate at high speed since the TFT has a higher field-effect mobility than a TFT using a conventional amorphous semiconductor film.

From a cost standpoint, a glass substrate is more desirable as a substrate used for a semiconductor device than a single-crystal silicon substrate. However, in the case of forming the semiconductor element over the glass substrate, the semiconductor element should be manufactured at such a low temperature that the glass substrate does not melt.

In order to obtain such a crystalline semiconductor film used for the semiconductor element, steps of crystallizing an amorphous semiconductor material or crystallizing an amorphous component included in a semiconductor material to improve crystallinity are required (Reference 1: Japanese Patent Laid-Open No. H11-160734).

In order to obtain such a crystalline semiconductor film, there is a method of conducting a heat treatment after adding a catalytic element promoting crystallization, into an amorphous semiconductor film. However, in the case of using the crystalline semiconductor film obtained by this method, there is a risk of serious deterioration in TFT characteristics due to the catalytic element in the film. Specifically, there is a possibility of increasing off-current in the TFT.

Therefore, the catalytic element in the crystalline semiconductor film needs to be removed (gettered) so as to suppress such deteriorations of the TFT characteristics.

In order to getter a catalytic element, there is a method of using a semiconductor film doped with phosphorus. For example, the catalytic element in the semiconductor film is moved to a part where the concentration of phosphorus is high so as to gettered by conducting a heat treatment after forming a silicon layer anew on a top layer or by conducting a heat treatment after doping a part of a semiconductor film with phosphorus to make a region including phosphorus at a high concentration (Reference 2: Japanese Patent Laid-Open No: H11-97706).

FIGS. 3A to 4B show a conventional process for manufacturing a TFT. First, a gate electrode 1001, a gate insulating film 1002, and an amorphous semiconductor film 1003 are formed over a substrate 1000.

Next, a solution 1004 containing a catalytic element is applied over the amorphous semiconductor film 1003 by a spin coating method (FIG. 3A).

After applying the aqueous solution containing a catalytic element, the amorphous semiconductor film 1003 is crystallized by a first heat treatment to form a crystalline semiconductor film 1005 (FIG. 3B).

Further, a semiconductor film 1006 containing an element selected from Group 15 of the periodic table (typically, phosphorus (P), arsenic (As), or antimony (Sb)) is formed over the crystalline semiconductor film 1005, and then a second heat treatment is conducted. By the second heat treatment, the catalytic element in the crystalline semiconductor film 1005 is moved to the semiconductor film 1006 containing the element selected from Group 15 of the periodic table, that is, the catalytic element is gettered (FIG. 3C).

Next, the crystalline semiconductor film 1005 and the semiconductor film 1006 containing the element selected from Group 15 of the periodic table are patterned to form an island-shaped stacked film (FIG. 3D). A conductive film 1007 is formed to cover the island-shaped stacked film (FIG. 3E). A portion of the conductive film is removed using a mask to form a source electrode and/or a drain electrode 1008 (FIG. 4A).

Subsequently, the semiconductor film 1006 containing the element selected from Group 15 of the periodic table of the island-shaped stacked film is completely removed using the a source electrode and/or drain electrode 1008 as a mask. A portion of the crystalline semiconductor film 1005 is removed to reduce the thickness thereof (FIG. 4B).

Through the above steps, an inversely staggered TFT having source region and/or drain region 1009 and a channel region 1010 is formed.

Conventionally, two steps of heat treatments are needed. In other words, (1) a heat treatment for crystallization, and (2) a heat treatment for gettering a catalytic elementare needed. In a process of manufacturing a semiconductor element, it is preferable that the number of steps is as small as possible since the increase of steps directly leads to increase in cost and decrease in yield.

SUMMARY OF THE INVENTION

In view of the above described problem, it is an object of the present invention to make it to gettering a catalytic element possible and to reduce the number of steps of heat treatment.

The present invention relates to a method for manufacturing a semiconductor device, including the steps of: forming a gate electrode over a substrate; forming a gate insulating film over the gate electrode; forming an amorphous semiconductor film over the gate insulating film; forming a semiconductor film including an element selected from Group 15 of the periodic table over the amorphous semiconductor film; patternig the amorphous semiconductor film and the semiconductor film including the element selected from Group 15 of the periodic table to form an island-shaped amorphous semiconductor film and an island-shaped semiconductor film, respectively; forming a source electrode and/or a drain electrode over the island-shaped semiconductor film; removing a portion of the island-shaped semiconductor film to form a source region and a drain region using the source electrode and/or the drain electrode as a mask and reducing a thickness of the island-shaped amorphous semiconductor film to partially expose the island-shaped amorphous semiconductor film; adding a catalytic element, which promotes crystallization of the island-shaped amorphous semiconductor film, into a region where the island-shaped amorphous semiconductor film is exposed; and gettering the catalytic element by the source region and/or the drain region simultaneously with crystallizing the island-shaped amorphous semiconductor film to form an island-shaped crystalline semiconductor film by heating the source region and/or the drain region and the island-shaped amorphous semiconductor film.

According to the present invention, when a semiconductor device is manufactured using a crystalline semiconductor film formed by using a catalytic element promoting crystallization, the total number of steps can be reduced by gettering the catalytic element simultaneously with crystallization.

Further, the present invention relates to a method for manufacturing a semiconductor device, including the steps of: forming a gate electrode over a substrate; forming a gate insulating film over the gate electrode; forming an amorphous semiconductor film over the gate insulating film; forming a semiconductor film including an element selected from Group 15 of the periodic table over the amorphous semiconductor film; patterning the amorphous semiconductor film and the semiconductor film including the element selected from Group 15 of the periodic table to form an island-shaped amorphous semiconductor film and an island-shaped semiconductor film, respectively; forming a source electrode and/or a drain electrode over the island-shaped semiconductor film; removing a portion of the island-shaped semiconductor film to form a source region and/or a drain region using the source electrode and/or the drain electrode as a mask and reducing a thickness of the island-shaped amorphous semiconductor film to partially expose the island-shaped amorphous semiconductor film; forming a mask to cover the source electrode and/or the drain electrode and a region in which the island-shaped amorphous semiconductor film is exposed; forming an opening by etching the mask over a region in which the island-shaped amorphous semiconductor film is exposed to expose a portion of the island-shaped amorphous semiconductor film; adding a catalytic element promoting crystallization of the island-shaped amorphous semiconductor film into the portion of the island-shaped amorphous semiconductor film thorough the opening; and gettering the catalytic element to the source region and/or the drain region simultaneously with crystallizing the island-shaped amorphous semiconductor film to form an island-shaped crystalline semiconductor film by heating the source region and/or the drain region and the island-shaped amorphous semiconductor film.

By providing an opening for adding the catalytic element, the catalytic element to be added can be further reduced, and a lateral growth region, where a crystal grows parallel to a substrate, can be increased.

The present invention also relates to a method for manufacturing a semiconductor device, including the steps of: forming a gate electrode over a substrate; forming a gate insulating film over the gate electrode; forming an amorphous semiconductor film over the gate insulating film; forming a semiconductor film including an element selected from Group 15 of the periodic table over the amorphous semiconductor film; patterning the amorphous semiconductor film and the semiconductor film including the element selected from Group 15 of the periodic table to form an island-shaped amorphous semiconductor film and an island-shaped semiconductor film, respectively; forming a source electrode and/or a drain electrode over the island-shaped semiconductor film; removing a portion of the island-shaped semiconductor film to form a source region and/or a drain region using the source electrode and/or the drain electrode as a mask and reducing a thickness of the island-shaped amorphous semiconductor film to partially expose the island-shaped amorphous semiconductor film; adding a catalytic element promoting crystallization of the island-shaped amorphous semiconductor film into a region where the island-shaped amorphous semiconductor film is exposed; gettering the catalytic element by the source region and/or the drain region simultaneously with crystallizing the island-shaped amorphous semiconductor film to form an island-shaped crystalline semiconductor film by heating the source region and/or the drain region and the island-shaped amorphous semiconductor film; and forming a wiring which electrically connects to the source electrode or the drain electrode.

The present invention further relates to a method for manufacturing a semiconductor device, including the steps of: forming a gate electrode over a substrate; forming a gate insulating film over the gate electrode; forming a amorphous semiconductor film over the gate insulating film; forming a semiconductor film including an element selected from Group 15 of the periodic table over the amorphous semiconductor film; patterning the amorphous semiconductor film and the semiconductor film including the element selected from Group 15 of the periodic table to form an island-shaped amorphous semiconductor film and an island-shaped semiconductor film, respectively; forming a mask over the island-shaped semiconductor film; removing a portion of the island-shaped semiconductor film to form a source region and/or a drain region using the mask and reducing a thickness of the island-shaped amorphous semiconductor film to partially expose the island-shaped amorphous semiconductor film; adding a catalytic element promoting crystallization of the island-shaped amorphous semiconductor film into a region where the island-shaped amorphous semiconductor film is exposed; gettering the catalytic element by the source region and/or the drain region simultaneously with crystallizing the island-shaped amorphous semiconductor film to form an island-shaped crystalline semiconductor film by heating the source region and/or the drain region and the island-shaped amorphous semiconductor film; and forming a wiring which electrically connects to the source region or the drain region.

The present invention relates to a method for manufacturing a semiconductor device, including the steps of: forming a gate electrode over substrate; forming a gate insulating film over the gate insulating film; forming an amorphous semiconductor film over the gate insulating film; forming a semiconductor film including an element selected from Group 15 of the periodic table over the amorphous semiconductor film; adding an element selected from Group 13 of the periodic table into the semiconductor film including the element selected from Group 15 of the periodic table; patterning the amorphous semiconductor film and the semiconductor film including the elements selected from Group 15 and Group 13 of the periodic table to form an island-shaped amorphous semiconductor film and an island-shaped semiconductor film, respectively; forming a source electrode and/or a drain electrode over the island-shaped semiconductor film; removing a portion of the island-shaped semiconductor film to form a source region and/or a drain region using the source electrode and/or the drain electrode as a mask and exposing a portion of the island-shaped amorphous semiconductor film by reducing the thickness of the island-shaped amorphous semiconductor film; adding a catalytic element promoting crystallization of the island-shaped amorphous semiconductor film into a region where the island-shaped amorphous semiconductor film is exposed; and gettering the catalytic element by the source region and/or the drain region simultaneously with crystallizing the island-shaped amorphous semiconductor film to form an island-shaped crystalline semiconductor film by heating the source region and/or the drain region and the island-shaped amorphous semiconductor film.

In the present invention, the wiring may be formed using a low-melting point conductive material.

In the present invention, the wiring may be formed by a sputtering method, a droplet discharge method, or a CVD method.

In the present invention, the catalytic element is an element or a plurarity of elements selected from nickel (Ni), iron (Fe), palladium (Pd), tin (Sn), lead (Pb), cobalt (Co), platinum (Pt), copper (Cu), and gold (Au).

In the present invention, the source electrode and/or the drain electrode are/is formed with an element selected from tantalum (Ta), tungsten (W), titanium (Ti), and molybdenum (Mo); or an alloy material or a compound material containing the element as its main component.

In the present invention, the element selected from Group 15 of the periodic table and/or the element selected from Group 13 of the periodic table can be activated by the heat treatment.

According to the present invention, since crystallization and gettering can be performed simultaneously, only one-time heat treatment step is required and the number of processes can be reduced drastically. Further, the crystallinity can be improved since crystallization is made with a lateral growth process. By reducing the number of steps, increase in cost and decrease in yield can be suppressed.

BRIEF DESCRIPTION OF THE DRAWINGS

In the accompanying drawings:

FIGS. 7A to 7C each show a manufacturing step of a semiconductor device according to one aspect of the present invention;

FIGS. 8A to 8D each show a manufacturing step of a semiconductor device according to one aspect of the present invention;

FIGS. 9A to 9C each show a manufacturing step of a semiconductor device according to one aspect of the present invention;

FIGS. 30A and 30B each show a manufacturing step of a liquid crystal display device using a liquid-crystal dropping method, according to one aspect of the present invention;

FIGS. 32A to 32D each show a manufacturing step of an EL display device of according to one aspect of the present invention;

FIGS. 33A to 33C each show a manufacturing step of an EL display device according to one aspect of the present invention;

FIGS. 34A and 34B each show a manufacturing step of an EL display device according to one aspect of the present invention;

FIGS. 37A and 37B each show a manufacturing step of an ID chip according to one aspect of the present invention;

FIGS. 39A and 39B each show a manufacturing step of an ID chip according to one aspect of the present invention;

FIGS. 40A and 40B each show a manufacturing step of an ID chip according to one aspect of the present invention;

DETAILED DESCRIPTION OF THE INVENTION

EMBODIMENT MODE

Embodiment Mode is described with reference to FIGS. 1A to 2E.

First, a conductive film is formed over a substrate 100. The conductive film is patterned to form a gate electrode 101. A glass substrate such as barium borosilicate glass or alumino borosilicate glass, a quartz substrate, a stainless substrate, or the like can be used as the substrate 100. A substrate formed from a synthetic resin having flexibility such as plastic typified by PET, PES, and PEN, or acrylic may be used.

The gate electrode 101 is formed to have a single layer structure of a conductive film or a stacked structure of two or more conductive films. A stacked layer of an element selected from tantalum (Ta), tungsten (W), titanium (Ti), and molybdenum (Mo); or an alloy or a compound material that contain the element as its main component can be used for the conductive film. A gate electrode 105 may be formed using a semiconductor film typified by a polycrystalline silicon film doped with an impurity element such as phosphorus (P). In this embodiment mode, the gate electrode 101 is formed using tungsten (W) or molybdenum (Mo).

The gate electrode 101 may be integrated with a wiring. Alternatively, the gate electrode 101 and a gate wiring may be separately formed and electrically connected to each other.

After forming the gate electrode 101, a gate insulating film 102 is formed over the gate electrode 101 and the substrate 100. An insulating film such as a silicon oxide film, a silicon nitride film, a silicon nitride film containing oxygen, or a silicon oxide film containing nitrogen can be used as the gate insulating film 102. The gate insulating film 102 has a function of preventing an alkali metal such as Na or an alkaline earth metal in the substrate 100 from diffusing into a semiconductor film, which the alkali metal such as Na or the alkaline earth metal has an adverse effect on the characteristic of the semiconductor element. In the embodiment mode, the gate insulating film 102 is formed from silicon oxide by a plasma CVD method.

Although the example using a single layer film as the gate insulating film 102 has been described here, a stacked structure including two or more insulating films can be used.

Figure 1A:
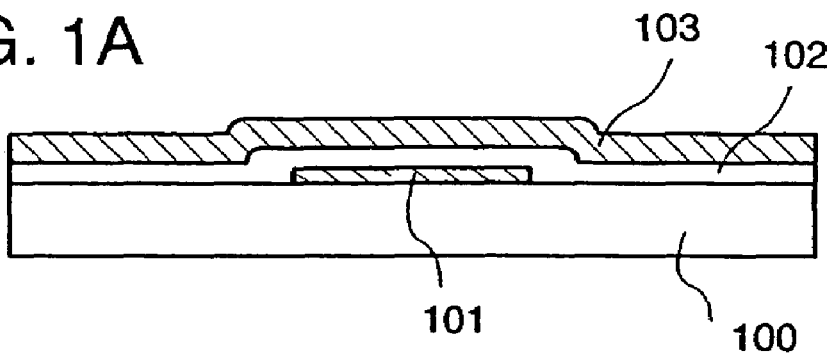
FIGS. 1A to 1D each show a manufacturing step of a semiconductor device according to one aspect of the present invention.

Then, an amorphous semiconductor film 103 is formed over the gate insulating film 102 (FIG. 1A). Silicon (Si), or a silicon-germanium (SiGe) alloy may be used as the amorphous semiconductor film 103. In the case of using the silicon-germanium, the concentration of germanium is preferably about 0.01 to 4.5 atomic %. In this embodiment mode, an amorphous silicon film non-doped or doped with a slight amount of an element selected from Group 13 of the periodic table, e.g., boron (B), is formed as the amorphous semiconductor film 103 by a plasma CVD method.

Figure 1B:
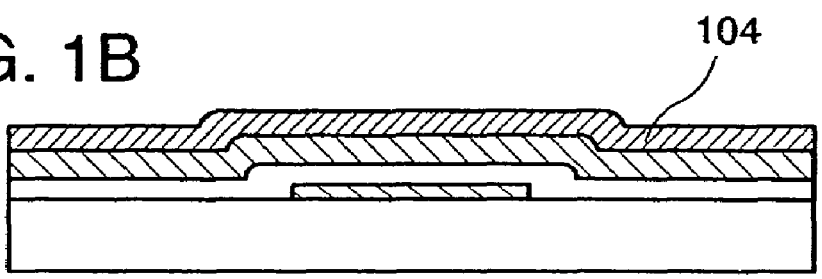

Next, a semiconductor film 104 into which an element selected from Group 15 of the periodic table is added is formed over the amorphous semiconductor film 103. The semiconductor film, into which the element selected from Group 15 of the periodic table is added, serves as a source region and/or a drain region, and further, also serves as a gettering region of a catalytic element for crystallization in a later process (FIG. 1B). In this embodiment, phosphorus (P) is used as the element selected from Group 15 of the periodic table.

Figure 1C:
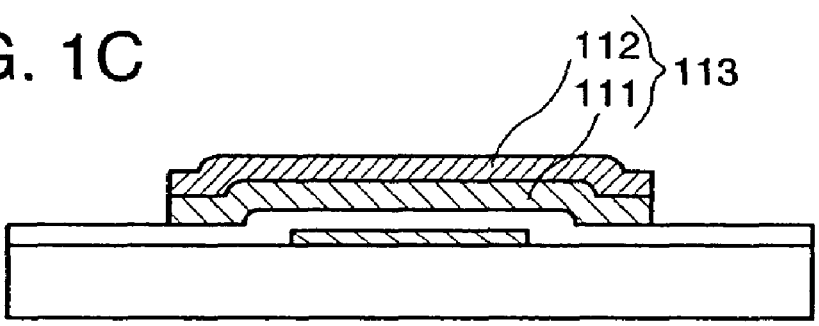

The gate insulating film 102, the amorphous semiconductor film 103, and the semiconductor film 104 into which the element selected from Group 15 of the periodic table is added are patterned using a mask to become an island-like shape. Accordingly, an island-shaped region 113 including an island-shaped amorphous semiconductor film 111 and an island-shaped semiconductor film 112 is formed (FIG. 1C).

Figure 1D:
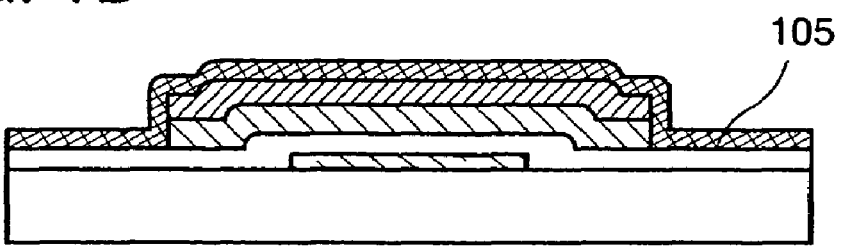

Thereafter, a conductive film 105 is formed to cover the island-shaped region 113 (FIG. 1D). In the case of using a metal film as the conductive film, the conductive film reacts with the island-shaped semiconductor film 112 to form a silicide in a later heat treatment, which improves conductivity. The conductive film is used as a mask for etching the island-shaped amorphous semiconductor film 111 and the island-shaped semiconductor film 112 in a later step. Therefore, the conductive film is preferably formed from a material which has selectivity with respect to the island-shaped semiconductor film 112.

A single layer or a stacked layer of an element selected from tantalum (Ta), tungsten (W), titanium (Ti), and molybdenum (Mo); or an alloy material or a compound material containing the element as its main component can be used for the conductive film 105. In this embodiment mode, tungsten (W) or molybdenum (Mo) is used as the conductive film.

Figure 2A:
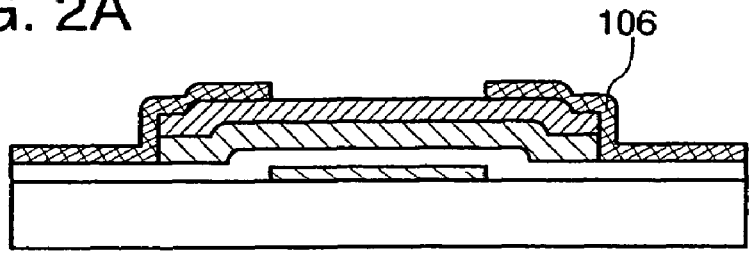
FIGS. 2A to 2E each show a manufacturing step of a semiconductor device according to one aspect of the present invention.

Next, a resist mask is formed over the conductive film. The conductive film is patterned to form a source electrode and/or a drain electrode 106 (FIG. 2A). Further, the island-shaped region 113 is etched using the source electrode and the drain electrode 106 as a mask. In this embodiment mode, wet-etching is performed using a tetramethyl ammonium hydroxide (TMAH) solution. Note that the etching time is adjusted in order not to completely etch the island-shaped amorphous semiconductor film 111. Etching may also be performed using dry etching.

The source electrode and/or the drain electrode 106 may be integrated with a wiring. Alternatively, the gate electrode and the drain electrode 106 and the wiring may be separately formed and electrically connected with each other.

Figure 2B:
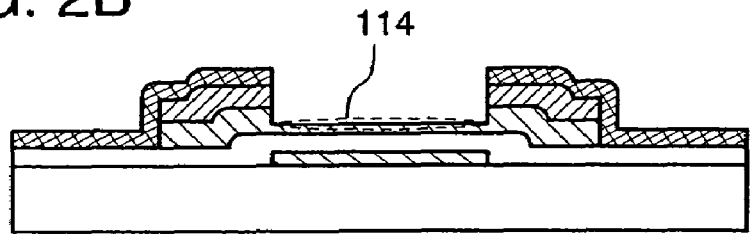

Accordingly, a region in the island-shaped semiconductor film 112 which is not covered with the source electrode and/or the drain electrode 106 is removed to form a source region and/or a drain region 107. The island-shaped amorphous semiconductor film 111 is thinned to expose a region 114 which is not covered with the source electrode and/or the drain electrode 106 (FIG. 2B).

Next, a thin oxide film is formed on the surface of the region 114 where the island-shaped amorphous semiconductor film 111 is exposed. The oxide film is formed so that a solution containing a catalytic element to be applied in a later step may be evenly applied in the region 114.

The thin oxide film is formed by an oxidation treatment using water in which ozone is dissolved (ozone water), a heat treatment or ultraviolet light irradiation in an oxidation atmosphere, or the like. In this embodiment mode, the thin oxide film is formed by applying ozone water.

Figure 2C:
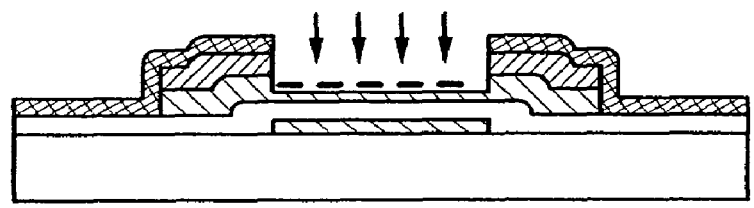

Then, a catalytic element which promotes crystallization of the semiconductor film is added to the region 114. The catalytic element can be added by a spin coating method for applying a solution dispersed with catalytic element therein, or a plasma treatment using an electrode containing the catalytic element (FIG. 2C).

An element selected from nickel (Ni), iron (Fe), palladium (Pd), tin (Sn), lead (Pb), cobalt (Co), platinum (Pt), copper (Cu), and gold (Au), or a plurality of the elements may be used as the catalytic element.

The catalytic element can be added by a spin coating method for applying a solution dispersed with catalytic element therein, or a plasma treatment using an electrode containing the catalytic element. In this embodiment mode, nickel is used as the catalytic element, and a nickel acetate solution is applied to the surface of the region 114 by a spin coating method.

The island-shaped amorphous semiconductor film 111 is kept in a nitrogen atmosphere at a temperature of 450 to 500° C. for 1 hour to dehydrogenate the island-shaped amorphous semiconductor film 111. This is performed to lower the threshold energy in a later crystallization by forming dangling bonds intentionally in the island-shaped amorphous semiconductor film 111.

A heat treatment at a temperature of 550 to 600° C. for 4 to 8 hours in a nitrogen atmosphere is performed to crystallize the island-shaped amorphous semiconductor film 111. Due to the catalytic element, the temperature for crystallizing the island-shaped amorphous semiconductor film 111 can be reduced to 550 to 600° C., which is comparatively low temperature.

Figure 2D:
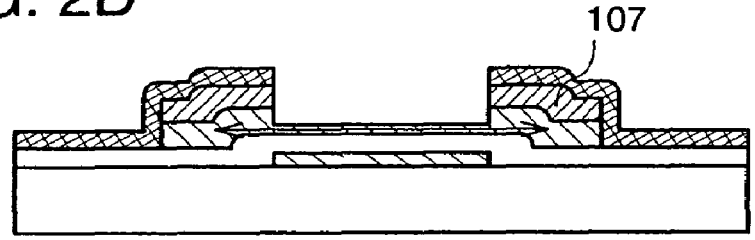

By the heat treatment, the crystallization proceeds parallel to the substrate from the region into which the catalytic element has been added. The catalytic element also moves in accordance with the crystallization from the region into which the catalytic element has been added, and the catalytic element is gettered by the source region and/or the drain region 107. Accordingly, a crystalline semiconductor film 109 where the catalytic element is reduced can be obtained (FIG. 2D).

Figure 2E:
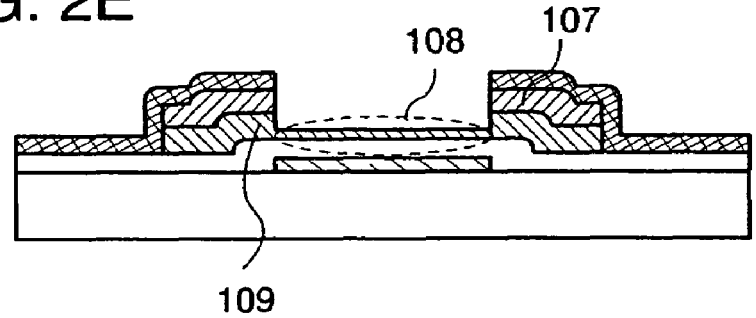
Figure 3A:
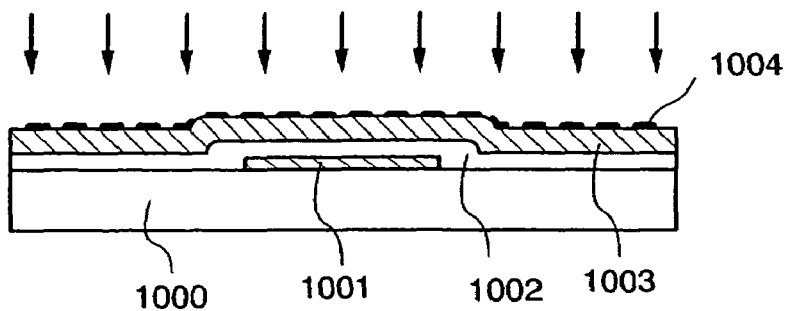
FIGS. 3A to 3E each show a manufacturing step of a conventional semiconductor device.
Figure 3B:
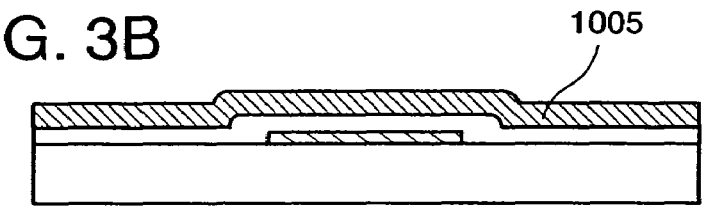
Figure 3C:
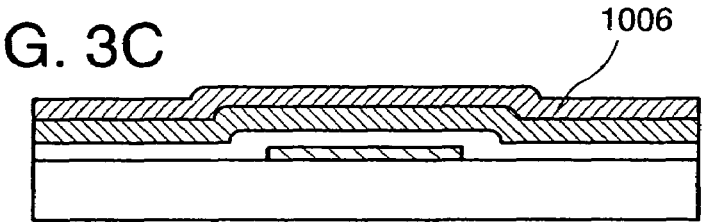
Figure 3D:
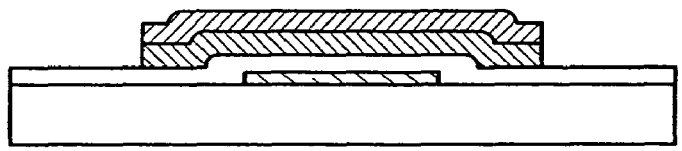
Figure 3E:
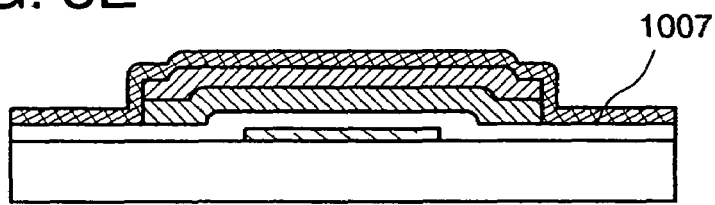
Figure 4A:
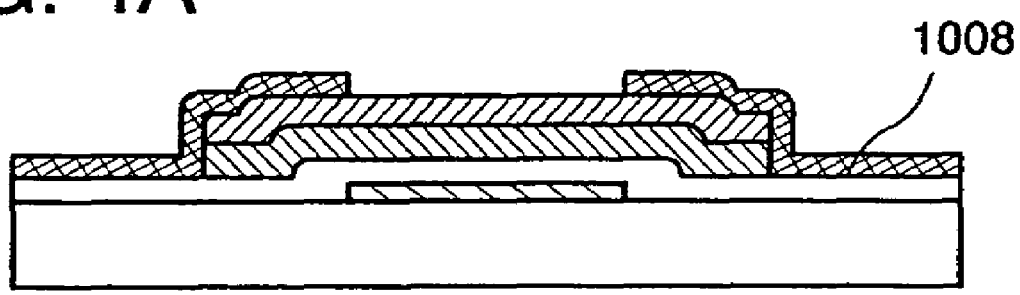
FIGS. 4A and 4B each show a manufacturing step of a conventional semiconductor device.
Figure 4B:
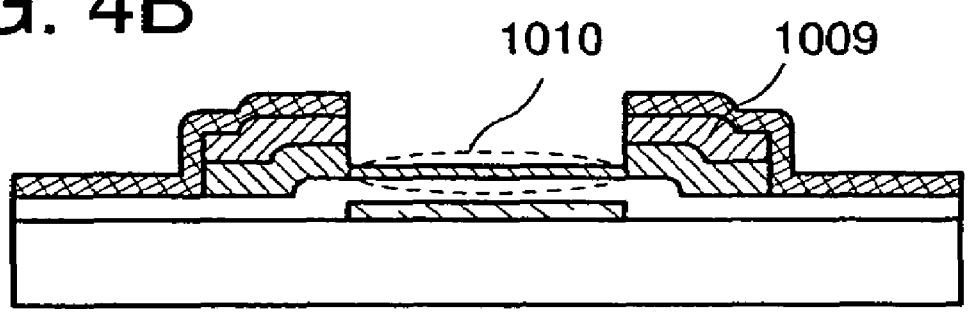

An element selected from Group 15 of the periodic table, for example, phosphorus hardly moves in a circumstance at the temperature of 550 to 600° C. in the semiconductor film. Therefore, a region (channel region) 108 where the element selected from Group 15 of the periodic table and the catalytic element substantially do not exist and a region where the element selected from Group 15 of the periodic table and the catalytic element coexist can be formed in the crystalline semiconductor film 109 by the heat treatment (FIG. 2E).

Further, phosphorus functions as a dopant of an N-channel TFT. In this embodiment mode, although the catalytic element remains in the source region and/or the drain region, it is known that there is almost no effect on element characteristics. It is advantageous that the catalytic element is segregated to the source region and/or the drain region, which results in decreasing resistance of the region.

In this embodiment mode, the N-channel TFT is manufactured; however, in the case of manufacturing a P-channel TFT, an element selected from Group 13 of the periodic table may be added to the semiconductor film 104 into which the element selected from Group 15 of the periodic table has been added.

Boron (B) or gallium (Ga) can be used as the element selected from Group 13 of the periodic table.

By the heat treatment, the element selected from Group 15 or Group 13 of the periodic table, which is contained in the source region and/or the drain region 107, can be activated.

According to the above described steps, an inversely staggered TFT having the source region and/or the drain region 107 and the channel region 108 can be formed.

Conventionally, the heat treatment for crystallization and the heat treatment for gettering are needed to be separately performed. However, according to the present invention, the crystallization and the gettering can be performed by one heat treatment.

Embodiment 1

Embodiment 1 is described with reference to FIGS. 7A to 9C.

First, as shown in FIG. 7A, gate electrodes 501 to 503 are formed over a substrate 500. A glass substrate such as barium borosilicate glass or alumino borosilicate glass; a quartz substrate; a stainless steel substrate; or the like can be used as the substrate 500. In addition, a substrate formed from a synthetic resin having flexibility such as plastic typified by PET, PES, and PEN, or acrylic may be used as the substrate 500.

The gate electrodes 501 to 503 are formed to have a single layer structure of a conductive film or a stacked structure of two or more conductive films. When two or more conductive films are stacked, the gate electrodes 501 to 503 may be formed with a stacked layer of an element selected from tantalum (Ta), tungsten (W), titanium (Ti), and molybdenum (Mo); or an alloy material or a compound material containing the element as its main component. In addition, the gate electrodes may be formed using a semiconductor film typified by a polycrystalline silicon film doped with an impurity element such as phosphorus (P).

In this embodiment, the electrodes 501 to 503 are formed as follows. For example, a tantalum nitride (TaN) film is formed to have a thickness of 10 to 50 nm, for example 30 nm, as a first conductive film. Then, for example a tungsten (W) film is formed to have a thickness of 200 to 400 nm, for example, 370 nm, over the first conductive film, as a second conductive film to form a stacked film of the first conductive film and the second conductive film.

The first conductive film and the second conductive film are etched to form the gate electrodes 501 to 503.

Then, a gate insulating film 504 is formed over the electrodes 501 to 503. The gate insulating film 504 can be formed with, for example, a single layer of an insulating film such as silicon nitride, silicon oxide containing nitrogen or silicon nitride containing oxygen; or a stacked film of plural insulating films such as silicon oxide, silicon nitride, silicon oxide containing nitrogen or silicon nitride containing oxygen. In addition, a plasma CVD method, a sputtering method or the like can be employed as the method for forming the gate insulating film 504. In this embodiment, the gate insulating film 504 is formed from a silicon oxide film containing nitrogen to have a thickness of 10 to 400 nm, for example 50 nm, by the plasma CVD method.

The gate insulating film 504 also serves to prevent an alkali metal such as Na, or an alkaline earth metal contained in the substrate 500 from diffusing in a semiconductor film to be formed later and damaging the characteristic of the semiconductor element.

An amorphous semiconductor film 505 is formed over the gate insulating film 504. The film thickness of the amorphous semiconductor film 505 is 100 to 200 nm. Note that not only silicon (Si) but also silicon germanium (SiGe) can be used as the semiconductor. In the case of using silicon germanium, the concentration of germanium is preferably about 0.01 to 4.5 atomic %.

A semiconductor film 506 into which an element selected from Group 15 of the periodic table is added is formed to have a thickness of 50 to 100 nm over the amorphous semiconductor film 505. The semiconductor film 506 into which the element selected from Group 15 of the periodic table serves as a source region and/or a drain region in a later process, and further, also as a gettering region of a catalytic element for crystallization. In this embodiment, the semiconductor film 506 is formed of an amorphous silicon film which contains phosphorus (P) at a concentration of $1 \times 10^{19}$ cm$^{-3}$ to $8 \times 10^{19}$ cm$^{-3}$ and is formed by a plasma CVD method.

A region of the semiconductor film 506, except for a region to become a P-channel TFT 521 afterward, is covered with a mask 507 to added an element selected from Group 13 of the periodic table (FIG. 7B). In this embodiment, boron (B) is used as the element selected from Group 13 of the periodic table. A P-type impurity region 508 is formed by adding boron by an ion implantation method or an ion doping method so that the concentration of boron in the semiconductor film 506 is $1 \times 10^{19}$ cm$^{-3}$ to $5 \times 10^{21}$ cm$^{-3}$ (FIG. 7C).

As shown in FIG. 8A, the island-shaped amorphous semiconductor film 505 and the semiconductor film 506 are patterned to form an island-shaped region 556 including an island-shaped amorphous semiconductor film 550 and an island-shaped semiconductor film 553; an island-shaped region 557 including an island-shaped amorphous semiconductor film 551 and an island-shaped semiconductor film 554; an island-shaped region 558 including an island-shaped amorphous semiconductor film 552 and an island-shaped semiconductor film 555.

A conductive film 509 is formed to cover the island-shaped regions 556 to 558 (FIG. 8B). The conductive film 509 may be formed by stacking an element selected from tantalum (Ta), tungsten (W), titanium (Ti), and molybdenum (Mo); or an alloy material or a compound material containing the element as its main component.

Electrodes 510 to 514 are formed by patterning the conductive film 509. The electrodes 510 to 514 are each connected to a source region and/or drain region of TFTs, specifically the electrode 511 connects a source region or a drain region of an N-channel TFT to a source region or a drain region of a P-channel TFT (FIG. 8C).

The island-shaped semiconductor films 553 to 555 into which the element selected from Group 15 of the periodic table is added and the island-shaped amorphous semiconductor films 550 to 552 are etched using the electrodes 510 to 514 as masks. In this embodiment, the dry etching using $CF_4$ and $O_2$ as an etching gas is employed. However, an etching time is controlled so that the island-shaped amorphous semiconductor films 550 to 552 in the lower layer are not completely etched. Needless to say, the etching may be performed by wet etching (FIG. 8D).

A catalytic element is added into regions 560 to 562 which are not covered with the electrodes 510 to 514 of the island-shaped amorphous semiconductor films 550 to 552 and which are exposed by etching (FIG. 9A).

An element or a plurality of elements selected from nickel (Ni), iron (Fe), palladium (Pd), tin (Sn), lead (Pb), cobalt (Co), platinum (Pt), copper (Cu) and gold (Au) can be used as a catalytic element.

In addition, as a method for introducing the catalytic element, a spin coating method for applying a solution dispersed with the catalytic element or a plasma treatment using an electrode containing the catalytic element can be employed. In this embodiment, nickel (Ni) is used as the catalytic element, and nickel acetate solution is applied to the regions which are not covered with the electrodes 510 to 514 of the island-shaped amorphous semiconductor film 505 by the spin coating method.

In the case of adding a catalytic element by using a solution containing a catalytic element, the wearability of the solution containing the catalytic element with respect to the island-shaped amorphous semiconductor films 550 to 552 can be improved by forming a thin oxide film on the surface of the regions 560 to 562, before adding the catalytic element to the regions 560 to 562. In this embodiment, the thin oxide film is formed by UV light irradiation.

The island-shaped amorphous semiconductor films 550 to 552 are kept in a nitrogen atmosphere at a temperature of 450 to 500° C. for 1 hour to dehydrogenate the island-shaped amorphous semiconductor films 550 to 552. This is performed to lower the threshold energy in a later crystallization by forming dangling bonds intentionally in the island-shaped amorphous semiconductor films 550 to 552.

Then, the island-shaped amorphous semiconductor films 550 to 552 are subjected to a heat treatment in a nitrogen atmosphere at a temperature of 550 to 600° C. for 4 to 8 hours so that the island-shaped amorphous semiconductor films 550 to 552 are crystallized to form island-shaped crystalline semiconductor films 520 to 522. By this heat treatment, at the same time as the crystallization, the added catalytic element moves from the region into which the catalytic element is added, and the catalytic element is gettered by the source regions and/or the drain regions 524, 527, and 530. Thus, the island-shaped crystalline semiconductor films 520 to 522 in which the catalytic element is reduced can be obtained (FIG. 9B).

In addition, by this heat treatment, the element of Group 13 or 15 of the periodic table which is included in the source regions and/or the drain regions 524, 527, and 530 can be activated.

As described above, an N-channel TFT 540, a P-channel TFT 541, and an N-channel TFT 542 that are each an inversely staggered TFT are formed. In addition, a CMOS circuit 543 includes the N-channel TFT 540 and the P-channel TFT 541.

The N-channel TFT 540 includes a channel region 525, a source region and/or a drain region 524, and an intrinsic region 523. The P-channel TFT 541 includes a channel region 528, a source region and/or a drain region 527, and an intrinsic region 526. The N-channel TFT 542 includes a channel region 531, a source region and/or a drain region 530, and an intrinsic region 529 (FIG. 9C).

In addition, only the P-channel TFT can be manufactured by the process shown in this embodiment. In other words, as shown in FIGS. 7B and 7C, the P-type impurity region can be formed by adding an element selected from Group 13 of the periodic table into the amorphous semiconductor film containing an element selected from Group 15 of the periodic table. Thereafter, the process shown in FIGS. 8A to 9C is employed to form the P-channel TFT alone.

This embodiment can be freely combined with any content of Embodiment Mode if necessary.

Embodiment 2

In Embodiment 2, an example of adding a catalytic element more selectively is described with reference to FIGS. 5A to 6B.

Figure 5A:
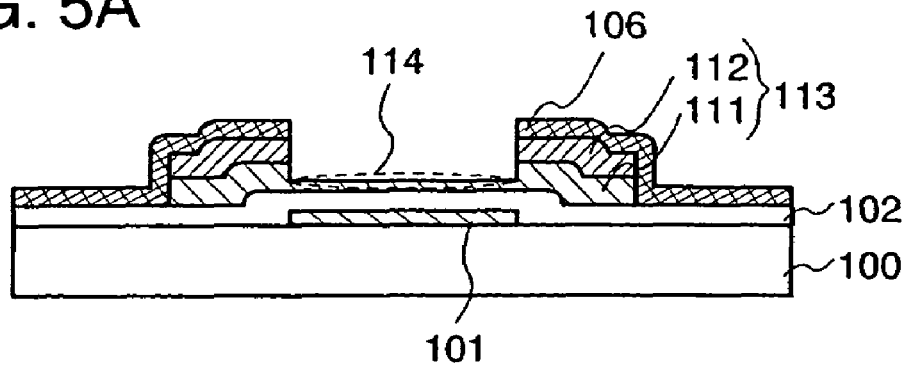
FIGS. 5A to 5D each show a manufacturing step of a semiconductor device according to one aspect of the present invention.
Figure 5B:
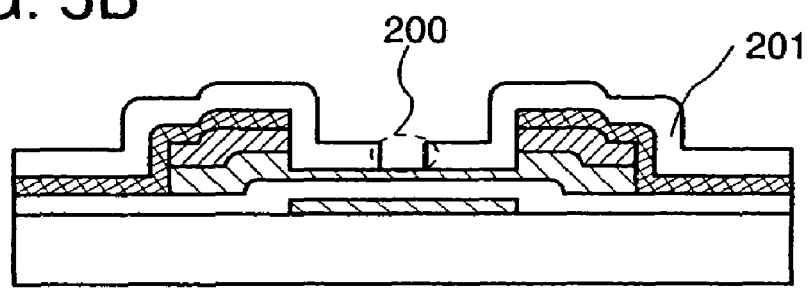

First, the process up to etching the island-shaped region 113 shown in FIG. 2B is performed according to the process described in Embodiment Mode. Note that the same portions as those in Embodiment Mode are denoted with the same reference numerals (FIG. 5A).

A mask 201 is formed to cover a region 114 in which a source region and/or a drain region 106 and an island-shaped amorphous semiconductor film 111 are exposed. The mask 201 may be formed using a heat-resistant material because a heat treatment is performed in a later process. For example, silicon oxide, silicon nitride, silicon nitride containing oxygen, or silicon oxide containing nitrogen is used. In this embodiment, the mask 201 is formed with silicon oxide. In addition, the mask 201 is etched to be provided with an opening 200 for adding a catalytic element over the region 114.

Figure 5C:
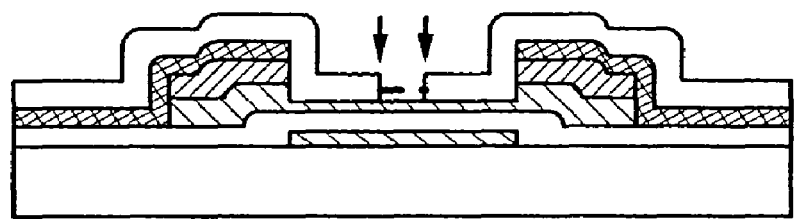

Then, a catalytic element which promotes a crystallization of a semiconductor film is added through the opening 200. A spin coating method for applying a solution dispersed with a catalytic element or a plasma treatment using an electrode including a catalytic element is used as the method for adding a catalytic element (FIG. 5C).

An element or a plurality of elements selected from nickel (Ni), iron (Fe), palladium (Pd), tin (Sn), lead (Pb), cobalt (Co), platinum (Pt), copper (Cu) and gold (Au) can be used as the catalytic element.

In this embodiment, nickel (Ni) is used as the catalytic element, and nickel acetate solution is applied onto the surface of the island-shaped amorphous semiconductor film 111 through the opening 200 by the spin coating method.

When such a catalytic element is dispersed in a solution and the catalytic element by the spin coating method, before the catalytic element is added, a thin oxide film is preferably formed on the surface of a region of the island-shaped amorphous semiconductor film 111, which is exposed due to the opening 200, so as to improve the wearability of the aqueous solution with respect to the island-shaped amorphous semiconductor film 111. The thin oxide film is formed by an oxidation treatment using water in which ozone is dissolved (ozone water), a heat treatment or UV light irradiation in an oxidation atmosphere, or the like. In this embodiment, the thin oxide film is formed by applying ozone water.

The island-shaped amorphous semiconductor film 111 is kept in a nitrogen atmosphere at a temperature of 450 to 500° C. for 1 hour to dehydrogenate the island-shaped amorphous semiconductor film 111. This is performed to lower the threshold energy in a later crystallization by forming dangling bonds intentionally in the island-shaped amorphous semiconductor film 111.

Then, the island-shaped amorphous semiconductor film 111 is subjected to a heat treatment in a nitrogen atmosphere at a temperature of 550 to 600° C. for 4 to 8 hours so that the island-shaped amorphous semiconductor film 111 is crystallized. By the catalytic element, the island-shaped amorphous semiconductor film 111 can be crystallized at a temperature of 550 to 600° C., which is relatively low.

Figure 5D:
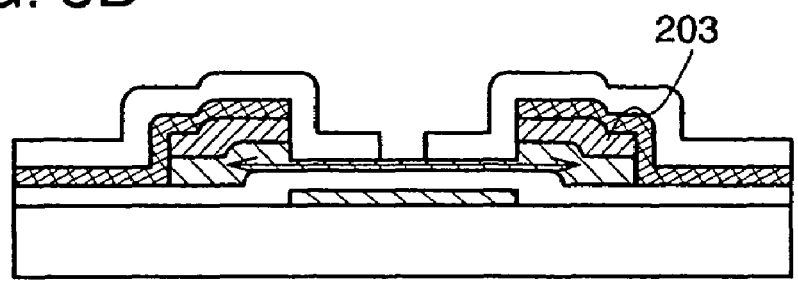
Figure 6A:
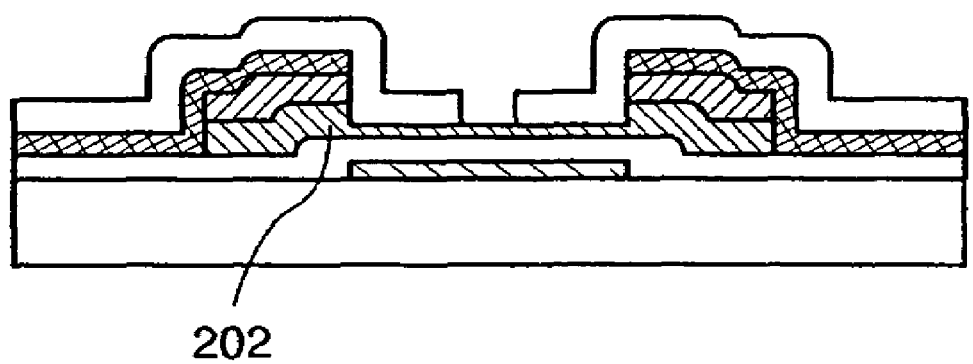
FIGS. 6A and 6B each show a manufacturing step of a semiconductor device according to one aspect of the present invention.

By this heat treatment, the crystallization proceeds parallel to the substrate from the region into which the catalytic element has been added. The added catalytic element moves with the crystallization from the region into which the catalytic element has been added, and the catalytic element is gettered by a source region and/or a drain region 203 (FIG. 5D). Thus, a crystalline semiconductor film 202 in which the catalytic element is reduced can be obtained (FIG. 6A).

By this heat treatment, an element of Group 13 or 15 of the periodic table which is included in the source region and/or the drain region 203 can be activated.

Then, a heat treatment is conducted in a hydrogen atmosphere at a temperature of 350 to 450° C., preferably 410 to 420° C., so as to hydrogenate the crystalline semiconductor film 202. In other words, dangling bonds existing in the crystalline semiconductor film 202 can be terminated.

In addition, instead of the heat treatment in the hydrogen atmosphere, the crystalline semiconductor film 202 can also be hydrogenated by anew forming a silicon nitride film or a silicon nitride film containing oxygen over the mask 201 and heating it at a temperature of 350 to 450° C., preferably 410 to 420° C.

Figure 6B:
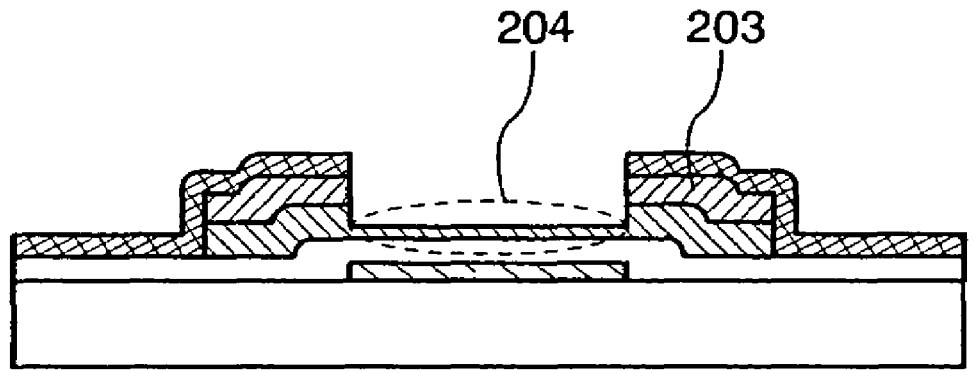

According to this embodiment, an inversely staggered TFT having a channel region 204 and the source region and/or the drain region 203 can be manufactured (FIG. 6B).

In this embodiment, the catalytic element can be added more selectively into the island-shaped amorphous semiconductor film 111 by forming the opening 200 for adding the catalytic element over the region 114 using the mask 201. Therefore, the region in which the catalytic element is added is small. Thus, a lateral growth region of the crystalline semiconductor film 202 can be increased and the amount of the catalytic element to be added can be reduced.

In addition, this embodiment can be freely combined with any content of Embodiment Mode and Embodiment 1 if necessary.

For example, when this embodiment is applied to Embodiment 1, the TFTs and the CMOS circuit having the same structure as that shown in FIG. 9C can be obtained.

In other words, the N-channel TFT 540, the P-channel TFT 541, and the N-channel TFT 542 are formed over the substrate 500. In addition, the CMOS circuit 543 includes the N-channel TFT 540 and the P-channel TFT 541.

The N-channel TFT 540 includes the gate electrode 501, the gate insulating film 504, the channel region 525, the source region and/or the drain region 524, and the intrinsic region 523. The P-channel TFT 541 includes the gate electrode 502, the gate insulating film 504, the channel region 528, the source region and/or the drain region 527, and the intrinsic region 526. The N-channel TFT 542 includes the gate electrode 503, the gate insulating film 504, the channel region 531, the source region and/or the drain region 530, and the intrinsic region 529.

The electrodes 510 and 511 are connected to the source region and/or the drain region 524 of the N-channel TFT 540. The electrodes 511 and 512 are connected to the source region and/or the drain region 527 of the P-channel TFT 541. The electrodes 513 and 514 are connected to the source region and/or the drain region 530 of the N-channel TFT 542.

In addition, the electrodes 510 to 514 may be integrated with a wiring, or the electrodes and the wiring may be formed separately and electrically connected to each other.

Embodiment 3

Figure 10A:
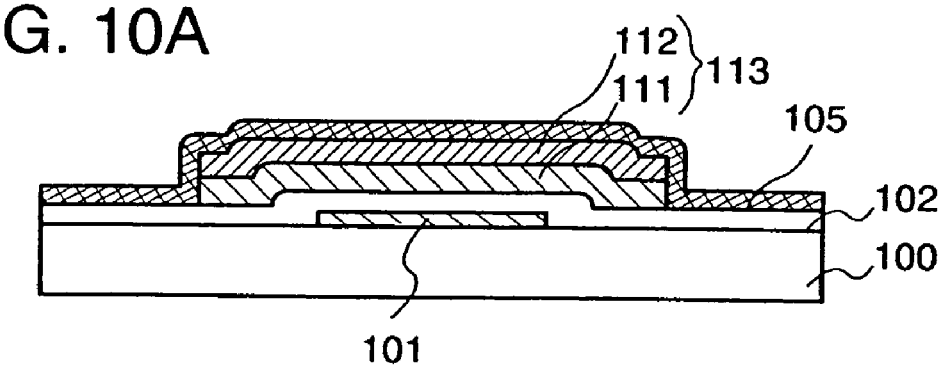
FIGS. 10A to 10D each show a manufacturing step of a semiconductor device according to one aspect of the present invention.

In Embodiment 3, an example of forming wirings connected to a source electrode and/or a drain electrode using a low melting point conductive material is described with reference to FIGS. 10A and 11.

First, the process up to forming the conductive film 105 shown in FIG. 1D is performed according to the process described in Embodiment Mode. Note that the same portions as those in Embodiment Mode are denoted with the same reference numerals (FIG. 10A).

Figure 10B:
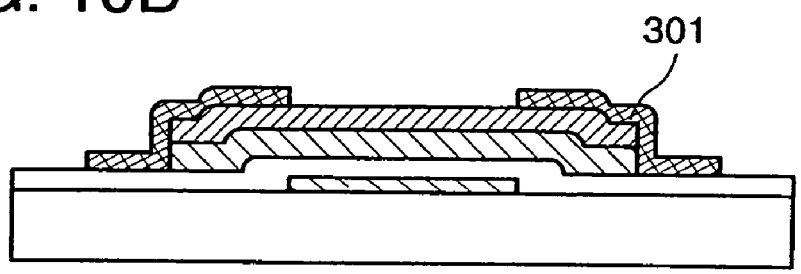

A resist mask is formed over the conductive film 105, and the conductive film 105 is patterned to form a source electrode and/or a drain electrode 301. However, wirings are formed in a later process separately from the source electrode and/or the drain electrode 301. Only the source electrode and/or the drain electrode 301 is formed in this process (FIG. 10B).

Figure 10C:
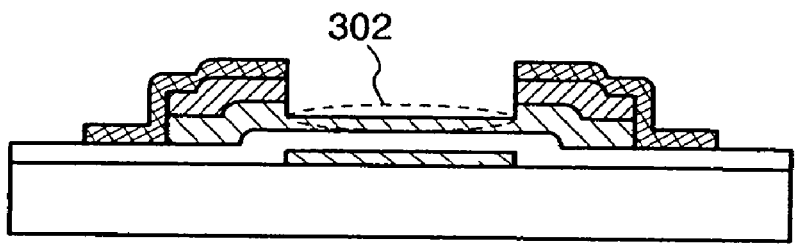

An island-shaped region 113 is etched using the source electrode and/or the drain electrode 301 as a mask. The etching method described in Embodiment Mode may be employed for etching the island-shaped region 113. Thus, a region 302 of an island-shaped amorphous semiconductor film 111, which is not covered with the source electrode and/or the drain electrode 301, is exposed (FIG. 10C).

Figure 10D:
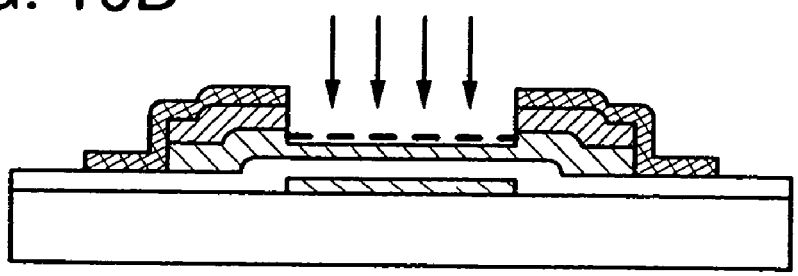

A catalytic element is added into the exposed region 302. The catalytic element and a method for adding the catalytic element are similar to those described in Embodiment Mode (FIG. 10D).

The island-shaped amorphous semiconductor film 111 is kept in a nitrogen atmosphere at a temperature of 450 to 500° C. for 1 hour to dehydrogenate the island-shaped amorphous semiconductor film 111. This is performed to lower the threshold energy in a later crystallization by forming dangling bonds intentionally in the island-shaped amorphous semiconductor film 111.

Then, the island-shaped amorphous semiconductor film 111 is subjected to a heat treatment in a nitrogen atmosphere at a temperature of 550 to 600° C. for 4 to 8 hours so that the island-shaped amorphous semiconductor film 111 is crystallized.

Figure 11A:
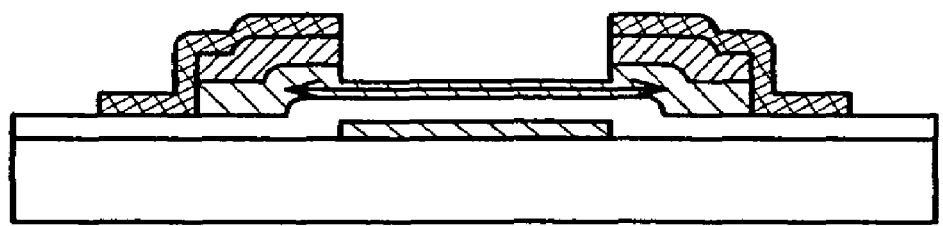
FIGS. 11A to 11C each show a manufacturing step of a semiconductor device according to one aspect of the present invention.
Figure 11B:
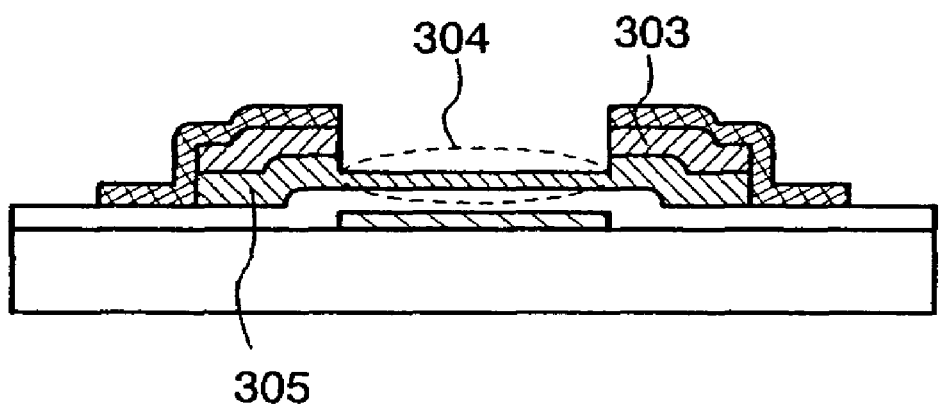

By this heat treatment, the crystallization proceeds parallel to the substrate from the region into which the catalytic element has been added. The added catalytic element moves with the crystallization from the region into which the catalytic element has been added, and the catalytic element is gettered by a source region and/or a drain region 303 (FIG. 11A). Thus, a crystalline semiconductor film 305 in which the catalytic element is reduced can be obtained (FIG. 11B).

In addition, by this heat treatment, an element of Group 13 or 15 of the periodic table which is included in the source region and/or the drain region 303 can be activated.

Figure 11C:
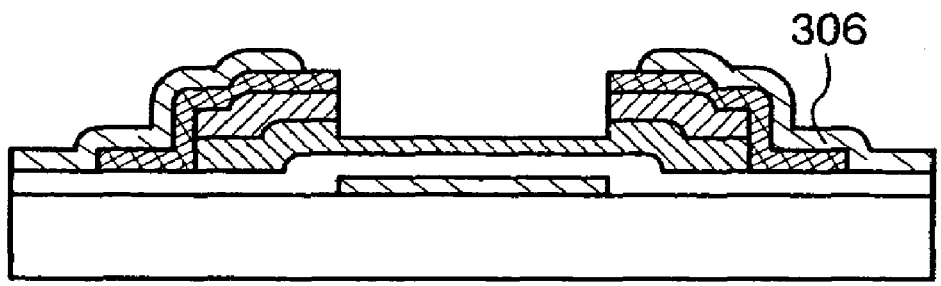

After the crystalline semiconductor film 305 is obtained, a wiring 306 connected to the source electrode or the drain electrode 301 is formed (FIG. 11C).

Because the wiring 306 is formed after the heat treatment, the wiring 306 can be formed with a low melting point conductive material, for example, aluminum (Al), silver (Ag) or the like. In addition, the wiring 306 can be formed by a sputtering method, a droplet discharge method (such as an inkjet method), or a CVD method. In particular, when the wiring 306 is formed by a droplet discharge method, a photomask is not required, thus the process can be shortened.

As described above, an inversely staggered TFT having a channel region 304 and the source region and/or the drain region 303 is formed.

In addition, this embodiment can be freely combined with any content of Embodiment Mode and Embodiment 1 if necessary.

Figure 25:
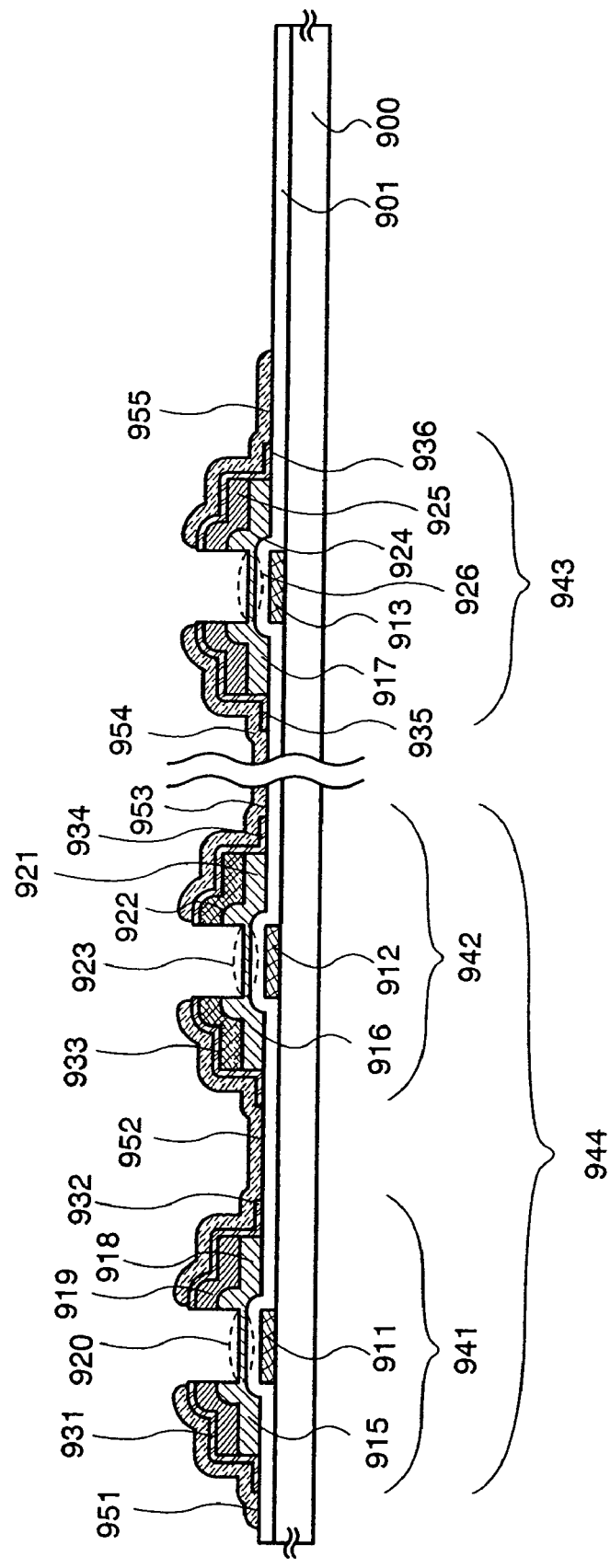
FIG. 25 shows a manufacturing step of a semiconductor device according to one aspect of the present invention.

For example, when this embodiment is applied to Embodiment 1, TFTs and a CMOS circuit shown in FIG. 25 can be obtained.

In other words, an N-channel TFT 941, a P-channel TFT 942, and an N-channel TFT 943 are formed over a substrate 900. In addition, the CMOS circuit 944 includes the N-channel TFT 941 and the P-channel TFT 942.

The N-channel TFT 941 includes a gate electrode 911, a gate insulating film 901, a channel region 920, an island-shaped crystalline semiconductor film 915 having an intrinsic region 918, and a source region and/or a drain region 919. The P-channel TFT 942 includes a gate electrode 912, the gate insulting film 901, a channel region 923, an island-shaped crystalline semiconductor film 916 having an intrinsic region 921, and a source region and/or a drain region 922. The N-channel TFT 943 includes a gate electrode 913, the gate insulating film 901, a channel region 926, an island-shaped crystalline semiconductor film 917 having an intrinsic region 924, and a source region and/or a drain region 925.

In addition, electrodes 931 and 932 are connected to the source region and the drain region 919 of the N-channel TFT 941. Electrodes 933 and 934 are connected to the source region and the drain region 922 of the P-channel TFT 942. Electrodes 935 and 936 are connected to the source region and the drain region 925 of the N-channel TFT 943.

Further, a wiring 951 is electrically connected to the electrode 931; a wiring 952, the electrodes 932 and 933; a wiring 953, the electrode 934; a wiring 954, the electrode 935; a wiring 955, the electrode 936. The wirings are formed with a low melting point conductive material.

Embodiment 4

In Embodiment 4, another example of forming wirings electrically connected to a source electrode and/or a drain electrode by using a low melting point conductive material is described with reference to FIGS. 12A to 13B.

Figure 12A:
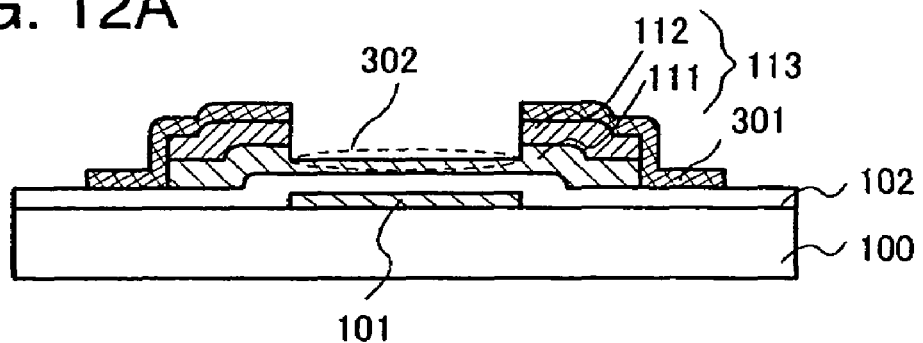
FIGS. 12A to 12D each show a manufacturing step of a semiconductor device according to one aspect of the present invention.
Figure 12B:
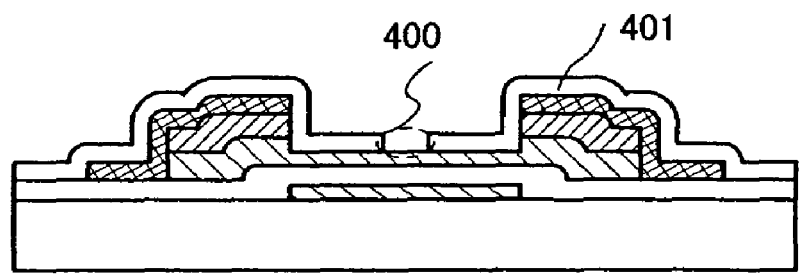

First, the process up to etching the island-shaped amorphous semiconductor film 111 and the island-shaped semiconductor film 112 shown in FIG. 10C is performed according to the process described in Embodiment Mode and Embodiment 3. Note that the same portions as those in Embodiment Mode and Embodiment 3 are denoted with the same reference numerals (FIG. 12A).

A mask 401 is formed to cover the region 302 in which the source electrode and/or the drain electrode 106 and the island-shaped amorphous semiconductor film 111 are exposed. A heat resistant material may be used as the mask 401, because a heat treatment is performed in a later process. For example, silicon oxide, silicon nitride, silicon nitride containing oxygen, silicon oxide containing nitrogen may be used. In this embodiment, silicon oxide is used as the mask 401. In addition, the mask 401 is etched to form an opening 400 for adding a catalytic element over the region 302.

Figure 12C:
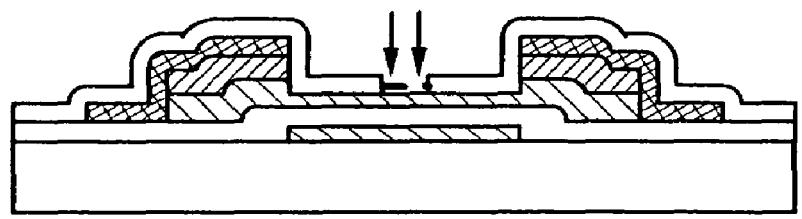

Then, a catalytic element which promotes a crystallization of a semiconductor film is added through the opening 400. A spin coating method for applying a solution dispersed with a catalytic element or a plasma treatment using an electrode including a catalytic element can be used as the method for adding a catalytic element (FIG. 12C).

An element or a plurality of elements selected from nickel (Ni), iron (Fe), palladium (Pd), tin (Sn), lead (Pb), cobalt (Co), platinum (Pt), copper (Cu) and gold (Au) can be used as the catalytic element.

In addition, as the method for adding a catalytic element, a spin coating method for applying a solution dispersed with a catalytic element or a plasma treatment using an electrode including a catalytic element can be employed. In this embodiment, nickel (Ni) is used as the catalytic element, and nickel acetate solution is applied onto the surface of the island-shaped amorphous semiconductor film 111 through the opening 400 by the spin coating method.

In the case of adding the catalytic element by the spin coating method for applying a solution dispersed with a catalytic element, before the catalytic element is added, a thin oxide film is preferably formed on the surface of a region of the island-shaped amorphous semiconductor film 111, which is exposed by the opening 400, so as to improve the wearability of the aqueous solution with respect to the island-shaped amorphous semiconductor film 111. The thin oxide film is formed by an oxidation treatment using water in which ozone is dissolved (ozone water), a heat treatment or UV light irradiation in an oxidation atmosphere, or the like. In this embodiment, the thin oxide film is formed by applying ozone water.

The island-shaped amorphous semiconductor film 111 is kept in a nitrogen atmosphere at a temperature of 450 to 500° C. for 1 hour to dehydrogenate the island-shaped amorphous semiconductor film 111. This is performed to lower the threshold energy in a later crystallization by forming dangling bonds intentionally in the island-shaped amorphous semiconductor film 111.

Then, the island-shaped amorphous semiconductor film 111 is subjected to a heat treatment in a nitrogen atmosphere at a temperature of 550 to 600° C. for 4 to 8 hours so that the island-shaped amorphous semiconductor film 111 is crystallized. By the catalytic element, the island-shaped amorphous semiconductor film 111 can be crystallized at a temperature of 550 to 600° C., which is relatively low.

Figure 12D:
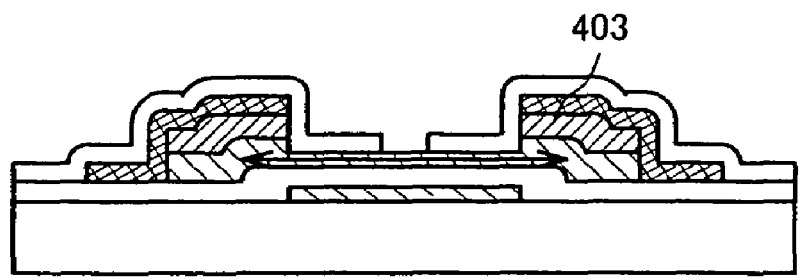
Figure 13A:
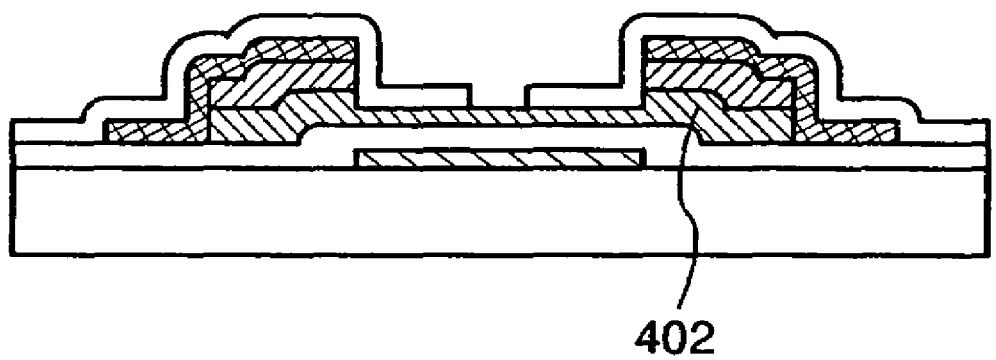
FIGS. 13A and 13B each show a manufacturing step of a semiconductor device according to one aspect of the present invention.

By this heat treatment, the crystallization proceeds parallel to the substrate from the region into which a catalytic element is added. The added catalytic element moves with the crystallization from the region into which the catalytic element is added, and the catalytic element is gettered by a source region and/or a drain region 403 (FIG. 12D). Thus, a crystalline semiconductor film 402 in which the catalytic element is reduced can be obtained (FIG. 13A).

In addition, by this heat treatment, an element of Group 13 or 15 of the periodic table which is included in the source region and/or the drain region 403 can be activated.

Then, a heat treatment is conducted in a hydrogen atmosphere at a temperature of 350 to 450° C., preferably 410 to 420° C. to hydrogenate the crystalline semiconductor film 402. In other words, dangling bonds existing in the crystalline semiconductor film 402 can be terminated.

In addition, instead of the heat treatment in the hydrogen atmosphere, the crystalline semiconductor film 402 can also be hydrogenated by anew forming a silicon nitride film or a silicon nitride film containing oxygen over the mask 401 and heating it at a temperature of 350 to 450° C., preferably 410 to 420° C.

Figure 13B:
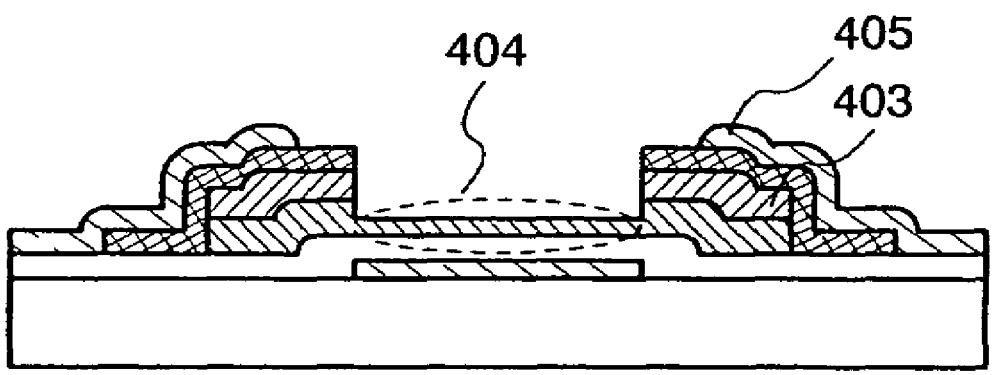

After the crystalline semiconductor film 402 is obtained, a wiring 405 connected to a source electrode or a drain electrode 301 is formed (FIG. 13B).

Because the wiring 405 is formed after the heat treatment, the wiring 405 can be formed with a low melting point conductive material, for example aluminum (Al), silver (Ag) or the like. In addition, the wiring 405 can be formed by a sputtering method, a droplet discharge method (such as an ink-jet method), or a CVD method. In particular, when the wiring 405 is formed by the droplet discharge method, a photomask is not required, thus the process can be shortened.

As described above, an inversely staggered TFT having a channel region 404 and the source region and/or the drain region 403 is formed.

In addition, this embodiment can be freely combined with any content of Embodiment Mode and Embodiment 1 if necessary.

For example, when this embodiment is applied to Embodiment 1, TFTs and the CMOS circuit shown in FIG. 25 can be obtained.

In other words, the N-channel TFT 941, the P-channel TFT 942, and the N-channel TFT 943 are formed over the substrate 900. In addition, the CMOS circuit 944 includes the N-channel TFT 941 and the P-channel TFT 942.

The N-channel TFT 941 includes the gate electrode 911, the gate insulating film 901, the channel region 920, the island-shaped crystalline semiconductor film 915 having the intrinsic region 918, and the source region and/or the drain region 919. The P-channel TFT 942 includes the gate electrode 912, the gate insulating film 901, the channel region 923, the island-shaped crystalline semiconductor film 916 having the intrinsic region 921, and the source region and/or the drain region 922. The N-channel TFT 943 includes the gate electrode 913, the gate insulating film 901, the channel region 926, the island-shaped crystalline semiconductor film 917 having the intrinsic region 924, and the source region and/or the drain region 925.

In addition, the electrodes 931 and 932 are connected to the source region and/or the drain region 919 of the N-channel TFT 941. The electrodes 933 and 934 are connected to the source region and/or the drain region 922 of the P-channel TFT 942. The electrodes 935 and 936 are connected to the source region and/or the drain region 925 of the N-channel TFT 943.

Further, the wiring 951 is electrically connected to the electrode 931; the wiring 952, the electrode 932 and 933; the wiring 953, the electrode 934; the wiring 954, the electrode 935; the wiring 955, the electrode 936. The wirings are formed with a low melting point conductive material.

Embodiment 5

In Embodiment 5, an example of manufacturing an inversely staggered TFT in a manufacturing process different from those of Embodiments 1 to 4 is described with reference to FIGS. 14A to 16C.

Figure 14A:
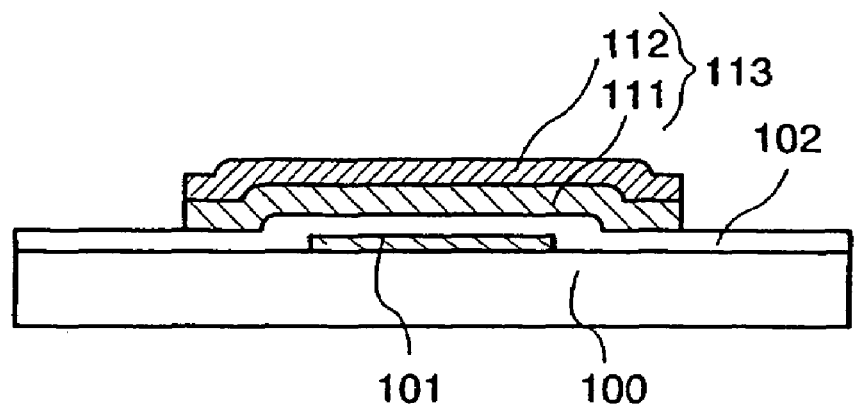
FIGS. 14A to 14C each show a manufacturing step of a semiconductor device according to one aspect of the present invention.

First, the process up to forming the island-shaped region 113 having the island-shaped amorphous semiconductor film 111 and the island-shaped semiconductor film 112 shown in FIG. 1C is performed according to the process described in Embodiment Mode. Note that the same portions as those in Embodiment Mode are denoted with the same reference numerals (FIG. 14A).

Figure 14B:
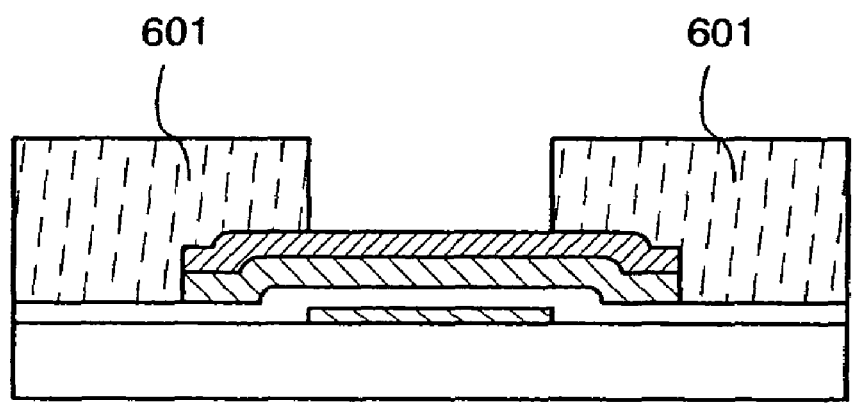

A resist 601 is selectively formed over the island-shaped region 113 using a photomask (FIG. 14B). Further, the island-shaped region 113 is etched using the resist 601 as a mask.

Figure 14C:
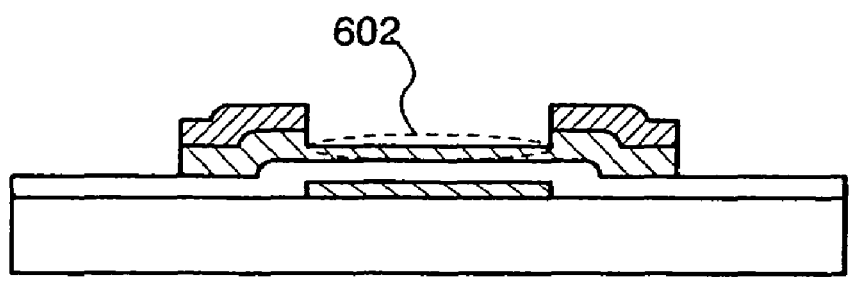

Thus, a whole region which is not covered with the resist 601, of the island-shaped semiconductor film 112, is removed. The thickness of the island-shaped amorphous semiconductor film 111 is reduced, and a region 602 which is not covered with the resist 601 is exposed (FIG. 14C).

Figure 15A:
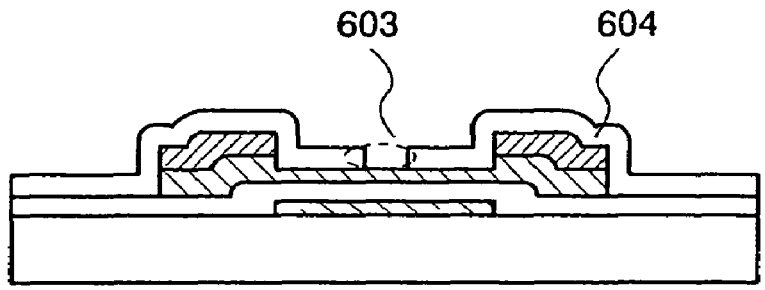
FIGS. 15A to 15D each show a manufacturing step of a semiconductor device according to one aspect of the present invention.

A mask 604 is formed to cover the gate insulating film 102, the source region and/or the drain region, and the exposed region 602. A heat resistant material may be used as the mask 604, because a heat treatment is performed in a later process. For example, silicon oxide, silicon nitride, silicon nitride containing oxygen, or silicon oxide containing nitrogen is used. In this embodiment, silicon oxide is used as the mask 604. In addition, the mask 604 is etched to form an opening 603 for adding a catalytic element over the region 114 (FIG. 15A).

Figure 15B:
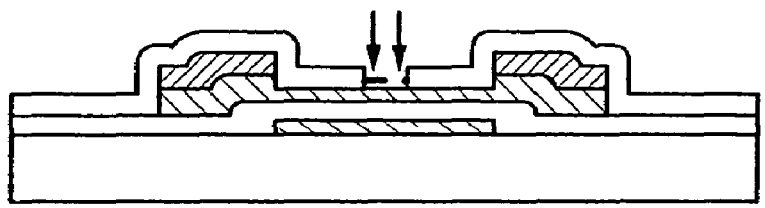

Then, a catalytic element which promotes a crystallization of a semiconductor film is added through the opening 603. As the method for adding the catalytic element, there is a spin coating method for adding a catalytic element dispersed in a solution or a plasma treatment using an electrode including a catalytic element (FIG. 15B).

An element or a plurality of elements selected from nickel (Ni), iron (Fe), palladium (Pd), tin (Sn), lead (Pb), cobalt (Co), platinum (Pt), copper (Cu), and gold (Au) can be used as the catalytic element.

In addition, as the method for adding a catalytic element, a spin coating method for applying a catalytic element dispersed in a solution or plasma heating using an electrode including a catalytic element can be used. In this embodiment, nickel (Ni) is used as the catalytic element, and nickel acetate solution is applied to the surface of the island-shaped amorphous semiconductor film 111 through the opening 603 by the spin coating method.

In the case of adding the catalytic element by the spin coating method for applying a catalytic element dispersed in a solution, before the catalytic element is added, a thin oxide film is preferably formed on the surface of a region of the island-shaped amorphous semiconductor film 111 which is exposed by the opening 603 so as to improve the wearability of the aqueous solution with respect to the island-shaped amorphous semiconductor film 111. The thin oxide film is formed by an oxidation treatment using water in which ozone is dissolved (ozone water), a heat treatment or UV light irradiation in an oxidation atmosphere, or the like. In this embodiment, the thin oxide film is formed by the UV light irradiation.

The island-shaped amorphous semiconductor film 111 is kept in a nitrogen atmosphere at a temperature of 450 to 500° C. for 1 hour to dehydrogenate the island-shaped amorphous semiconductor film 111. This is performed to lower the threshold energy in a later crystallization by forming dangling bonds intentionally in the island-shaped amorphous semiconductor film 111.

The island-shaped amorphous semiconductor film 111 is subjected to a heat treatment in a nitrogen atmosphere at a temperature of 550 to 600° C. for 4 to 8 hours so that the island-shaped amorphous semiconductor film 111 is crystallized. By the catalytic element, the island-shaped amorphous semiconductor film 111 can be crystallized at a temperature of 550 to 600° C., which is relatively low.

Figure 15C:
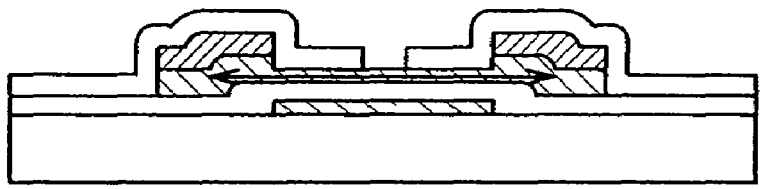
Figure 15D:
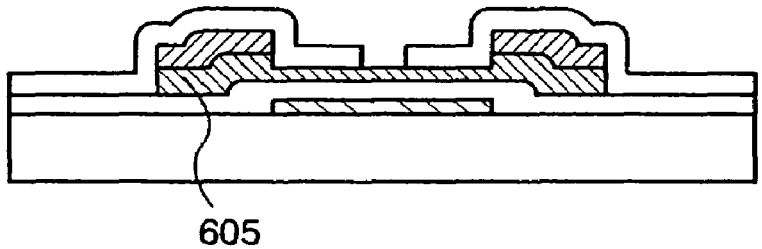

By this heat treatment, the crystallization proceeds parallel to the substrate from the region into which the catalytic element has been added. The added catalytic element moves with the crystallization from the region into which the catalytic element has been added, and the catalytic element is gettered by a source region and/or a drain region 608 (FIG. 15C). Thus, a crystalline semiconductor film 605 in which the catalytic element is reduced can be obtained (FIG. 15D).

In addition, by this heat treatment, an element of Group 13 or 15 of the periodic table which is included in the source region and/or the drain region 608 can be activated.

Then, a heat treatment is conducted in a hydrogen atmosphere at a temperature of 350 to 450° C., preferably 410 to 420° C., to hydrogenate the crystalline semiconductor film 605. In other words, dangling bonds existing in the crystalline semiconductor film 605 can be terminated.

In addition, instead of by the heat treatment in the hydrogen atmosphere, the crystalline semiconductor film 605 can also be hydrogenated by anew forming a silicon nitride film or a silicon nitride film containing oxygen over the mask 604 and heating it at a temperature of 350 to 450° C., preferably 410 to 420° C.

Then, an interlayer insulating film 606 is formed over the gate insulating film 102, the crystalline semiconductor film 605, and the mask 604.

The interlayer insulating film 606 may be formed with an insulating film containing silicon, for example a silicon oxide film (SiO), a silicon nitride film (SiN), or a silicon oxide film containing nitrogen (SiON), or a stacked layer of these films by a plasma CVD method or a sputtering method. Needless to say, the interlayer insulating film 606 is not limited to a silicon oxide film containing nitrogen or a silicon nitride film, or a stacked layer of these films, and it may be formed with a single layer or a stacked layer of other insulating films containing silicon.

In addition, the interlayer insulating film 606 can be formed with a photosensitive or non-photosensitive organic material (polyimide, acrylic, polyamide, polyimide amide, or benzocyclobutene), resist, siloxane, or a stacked layer of these materials. As an organic material, a positive photosensitive organic resin or a negative photosensitive organic resin may be used.

Siloxane is a material having a skeleton structure of a Si—O bond, and having an organic group containing at least hydrogen (for example, alkyl group, aromatic hydrocarbon) as a substituent. In addition, a fluoro group may also be used as a substituent. Further, an organic group containing at least hydrogen and a fluoro group may also be used as a substituent.

Figure 16A:
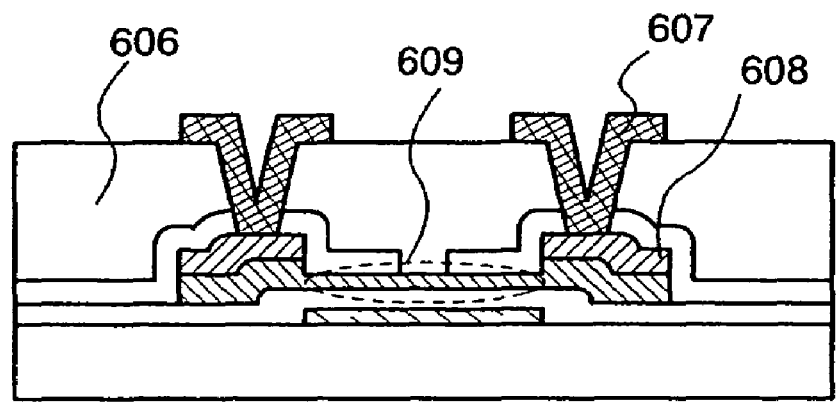
FIGS. 16A to 16C each show a manufacturing step of a semiconductor device according to one aspect of the present invention.

Contact holes are formed in the interlayer insulating film 606, a conductive film is formed over the interlayer insulating film 606, and then patterning is conducted. Thus, a source electrode and/or a drain electrode 607 electrically connected to the source region and/or the drain region 608 are formed. Therefore, an inversely staggered TFT having a channel region 609 and the source region and/or the drain region 608 is manufactured (FIG. 16A).

Before the interlayer insulating film is formed, the mask 604 may be removed by etching. In this case, one step is added. However, the reliability of TFT is more enhanced by removing the mask 604 because the amorphous semiconductor film and an unreacted catalytic element do not remain in the TFT.

In the case of removing the mask 604, an interlayer insulating film 611 is more preferably formed with an inorganic material such as an insulating film containing silicon to prevent an impurity such as carbon or oxygen from mixing into a channel region 614 and a source region and/or a drain region 613.

Figure 16B:
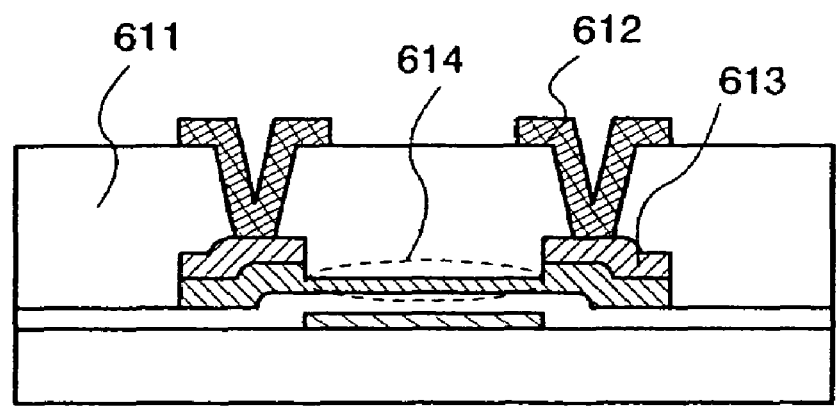

After the interlayer insulating film 611 is formed, contact holes are formed, then, a conductive film is formed over the interlayer insulating film 611 and patterning is conducted. Thus, a source electrode and/or a drain electrode 612 electrically connected to the source region and/or the drain region 613 are formed. Therefore, an inversely staggered TFT having a channel region 614 and the source region and/or the drain region 613 is manufactured (FIG. 16B).

After the mask 604 is formed, a wiring 621 connected to a source region or a drain region 622 may be formed without forming an interlayer insulating film.

The wiring 621 can be formed with a low melting point conductive material, for example aluminum (Al), silver (Ag) or the like. In addition, the wiring 621 can be formed by a sputtering method, a droplet discharge method (such as an ink-jet method), or a CVD method. In particular, when the wiring 621 is formed by the droplet discharge method, a photomask is not required, thus the process can be shortened.

Figure 16C:
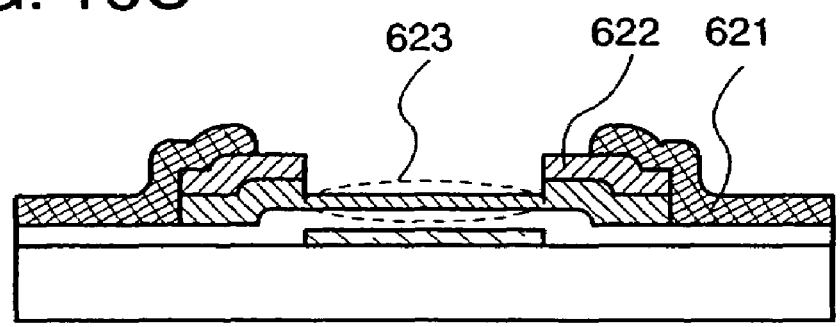

As described above, an inversely staggered TFT having the channel region 623 and the source region and/or the drain region 622 is formed (FIG. 16C).

Figure 26:
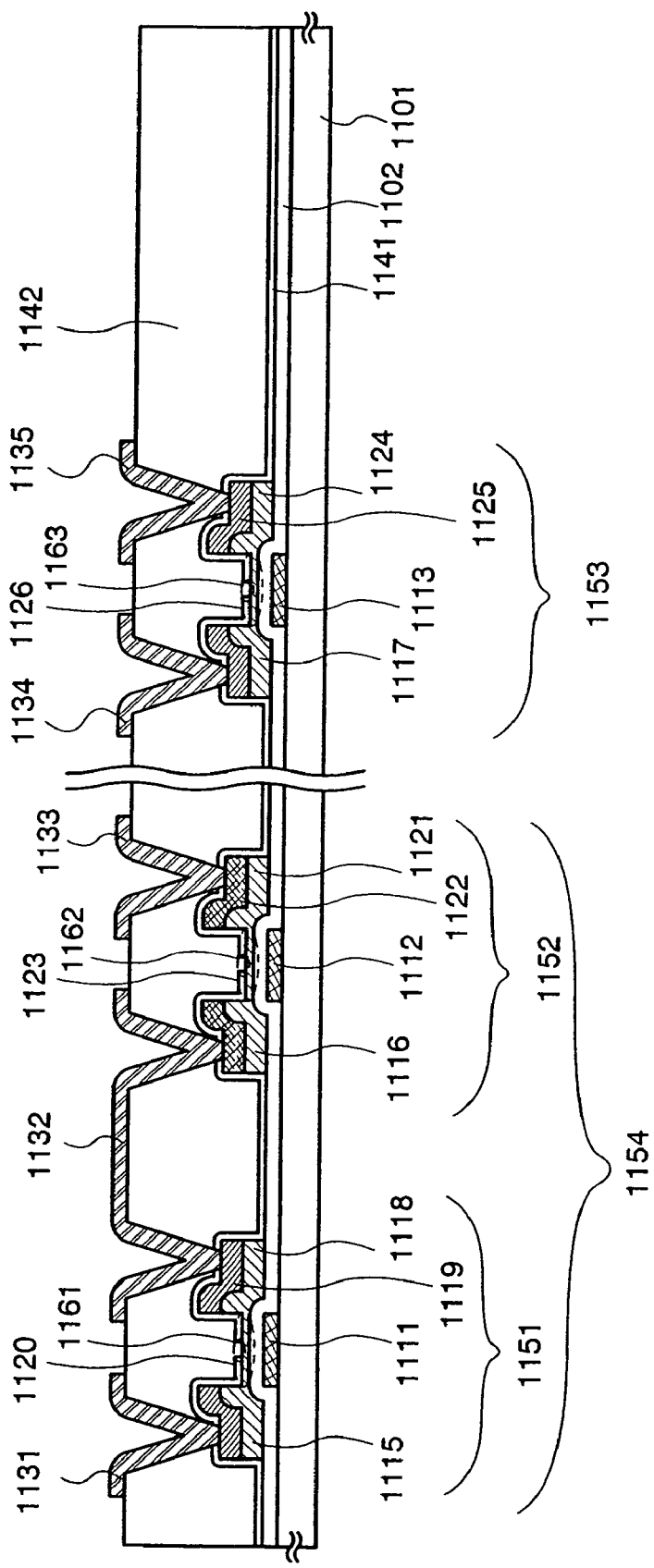
FIG. 26 shows a manufacturing step of a semiconductor device according to one aspect of the present invention.

In addition, this embodiment can be freely combined with any content of Embodiment Mode and Embodiment 1 if necessary For example, when the structure of this embodiment shown in FIG. 16A is applied to Embodiment 1, TFTs and a CMOS circuit shown in FIG. 26 can be obtained.

In other words, an N-channel TFT 1151, a P-channel TFT 1152, and an N-channel TFT 1153 are formed over a substrate 1101. In addition, the CMOS circuit 1154 includes the N-channel TFT 1151 and the P-channel TFT 1152.

The N-channel TFT 1151 includes a gate electrode 1111, a gate insulating film 1102, a channel region 1120, an island-shaped crystalline semiconductor film 1115 having an intrinsic region 1118, and a source region and/or a drain region 1119. The P-channel TFT 1152 includes a gate electrode 1112, the gate insulating film 1102, a channel region 1123, an island-shaped crystalline semiconductor film 1116 having an intrinsic region 1121, and a source region and/or a drain region 1122. The N-channel TFT 1153 includes a gate insulating electrode 1113, the gate insulating film 1102, a channel region 1126, an island-shaped crystalline semiconductor film 1117 having an intrinsic region 1124, and a source region and/or a drain region 1125.

A mask 1141 (corresponding to 604 in FIG. 15A) having windows 1161 to 1163 for a catalytic element, (corresponding to 603 in FIG. 15A) is formed over the TFTs 1151 to 1153. An interlayer insulating film 1142 (corresponding to 606 in FIG. 15A) is formed over the mask 1141, and wirings 1131 to 1135 are formed over the interlayer insulating film 1142.

The wirings 1131 and 1132 are connected to the source region and the drain region 1119 of the N-channel TFT 1151. The wirings 1132 and 1133 are connected to the source region and the drain region 1122 of the P-channel TFT 1152. The wirings 1134 and 1135 are connected to the source region and the drain region 1125 of the N-channel TFT 1153.

Figure 27:
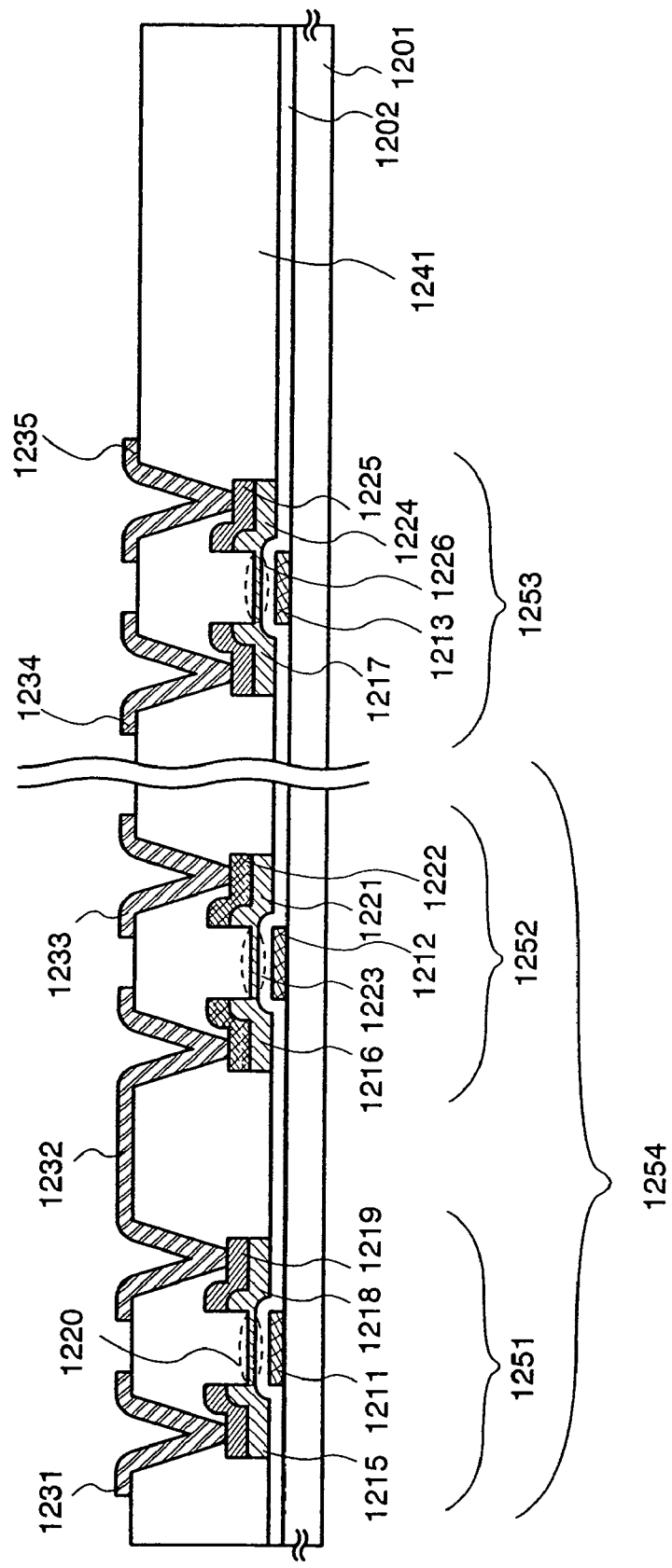
FIG. 27 shows a manufacturing step of a semiconductor device according to one aspect of the present invention.

In addition, when the structure of this embodiment shown in FIG. 16B is applied to Embodiment 1, TFTs and a CMOS circuit shown in FIG. 27 can be obtained.

In other words, an N-channel TFT 1251, a P-channel TFT 1252, and an N-channel TFT 1253 are formed over a substrate 1201. In addition, the CMOS circuit 1254 includes the N-channel TFT 1251 and the P-channel TFT 1252.

The N-channel TFT 1251 includes a gate electrode 1211, a gate insulating film 1202, a channel region 1220, an island-shaped crystalline semiconductor film 1215 having an intrinsic region 1218, and a source region and/or a drain region 1219. The P-channel TFT 1252 includes a gate electrode 1212, the gate insulating film 1202, a channel region 1223, an island-shaped crystalline semiconductor film 1216 having an intrinsic region 1221, and a source region and/or a drain region 1222. The N-channel TFT 1253 includes a gate electrode 1213, the gate insulating film 1202, a channel region 1226, an island-shaped crystalline semiconductor film 1217 having an intrinsic region 1224, and a source region and/or a drain region 1225.

An interlayer insulating film 1241 (corresponding to 611 in FIG. 16B) is formed over the TFTs 1151 to 1153. Wirings 1231 to 1235 are formed over the interlayer insulating film 1241.

The wirings 1231 and 1232 are connected to the source region and the drain region 1219 of the N-channel TFT 1251. The wirings 1232 and 1233 are connected to the source region and the drain region 1222 of the P-channel TFT 1252. The wirings 1234 and 1235 are connected to the source region and the drain region 1225 of the N-channel TFT 1253.

Figure 43:
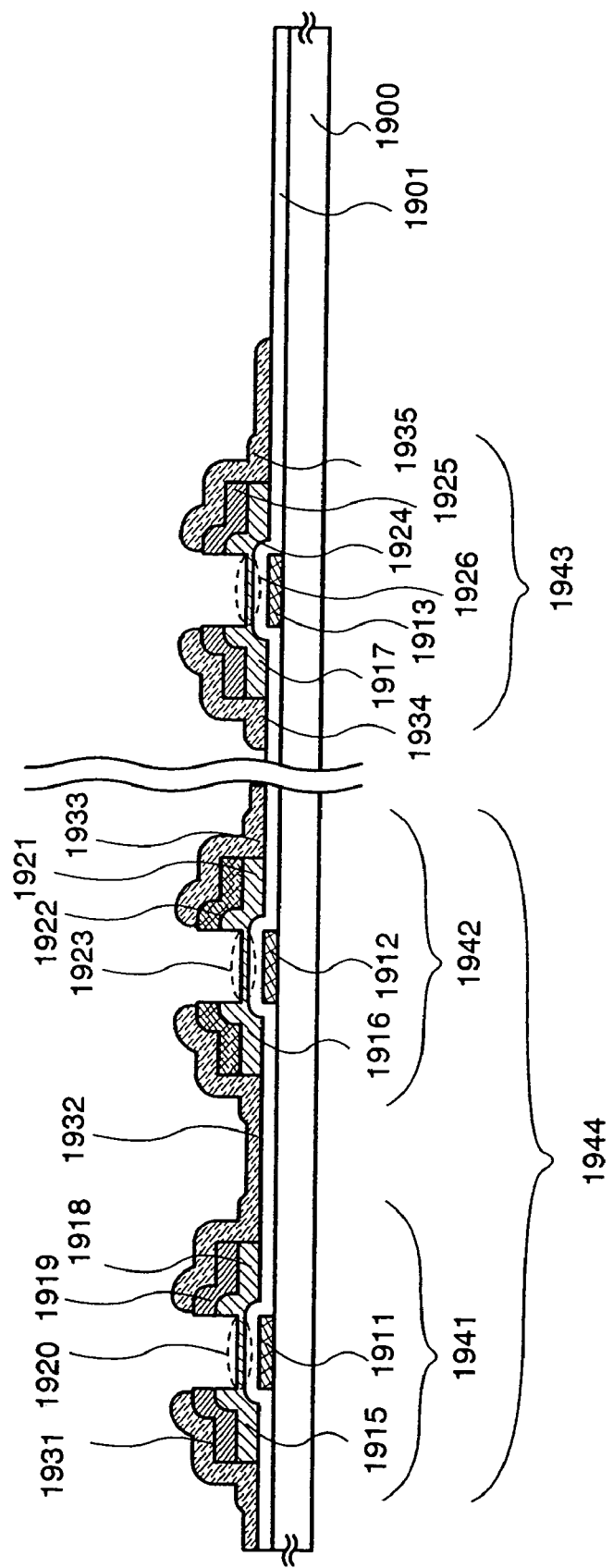
FIG. 43 shows a manufacturing step of a semiconductor device according to one aspect of the present invention.

In addition, when the structure of this embodiment shown in FIG. 16C is applied to Embodiment 1, TFTs and a CMOS circuit shown in FIG. 43 can be obtained.

In other words, an N-channel TFT 1941, a P-channel TFT 1942, and an N-channel TFT 1943 are formed over a substrate 1900. In addition, the CMOS circuit 1944 includes the N-channel TFT 1941 and the P-channel TFT 1942.

The N-channel TFT 1941 includes a gate electrode 1911, a gate insulating film 1901, a channel region 1920, an island-shaped crystalline semiconductor film 1915 having an intrinsic region 1918, and a source region and/or a drain region 1919. The P-channel TFT 1942 includes a gate electrode 1912, the gate insulating film 1901, a channel region 1923, an island-shaped crystalline semiconductor film 1916 having an intrinsic region 1921, and a source region and/or a drain region 1922. The N-channel TFT 1943 includes a gate electrode 1913, the gate insulating film 1901, a channel region 1926, an island-shaped crystalline semiconductor film 1917 having an intrinsic region 1924, and a source region and/or a drain region 1925.

Wirings 1931 and 1932 formed with a low melting point conductive material are connected to the source region and the drain region 1919 of the N-channel TFT 1941. Wirings 1932 and 1933 are connected to the source region and the drain region 1922 of the P-channel TFT 1942. Wirings 1934 and 1935 are connected to the source region and the drain region 1925 of the N-channel TFT 1943.

Embodiment 6

In Embodiment 6, an example of manufacturing a liquid crystal display device (LCD) according to the present invention is described with reference to FIGS. 17A to 24 and FIG. 44.

A manufacturing method of the liquid crystal display device described in this embodiment is a manufacturing method by which a pixel portion including a pixel TFT and a TFT in a driver circuit portion provided in the periphery of the pixel portion are manufactured simultaneously. As for the driver circuit, however, a CMOS circuit including an N-channel TFT and a P-channel TFT, as a base unit, is illustrated in order to simplify the explanation.

Figure 17A:
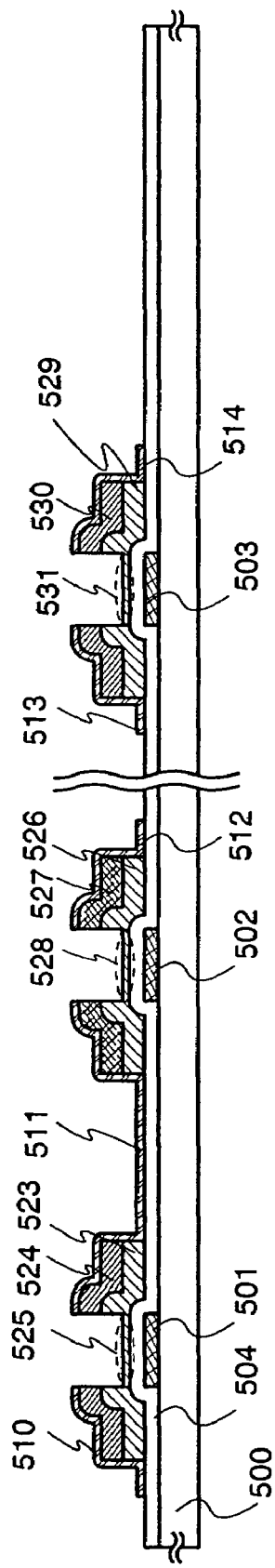
FIGS. 17A and 17B each show a manufacturing step of a liquid crystal display device according to one aspect of the present invention.

First, the CMOS circuit 543 including the N-channel TFT 540 and the P-channel TFT 541, and the N-channel TFT 542 shown in FIG. 9C are formed according to Embodiment 1. In this embodiment, the N-channel TFT 542 is used as a pixel TFT and the CMOS circuit 543 is used as a base unit of a driver circuit (FIG. 17A).

Note that the N-channel TFTs 540 and 542, and the P-channel TFT 541 are not limited to the TFTs manufactured by the method described in Embodiment 1, and they can be manufactured by the method described in any of Embodiments 2 to 5.

Then, a first interlayer insulating film 701 is formed to cover the TFTs 540 to 542.

The first interlayer insulating film 701 is formed with an insulating film containing silicon, for example a silicon oxide film (SiOx), a silicon nitride film (SiN), a silicon oxide film containing nitrogen (SiON), or a stacked film of these films, by a plasma CVD method or a sputtering method. Needless to say, the first interlayer insulating film 701 is not limited to a silicon oxide film containing nitrogen, a silicon nitride film, or a stacked film thereof, and it may be formed with a single layer or a stacked layer of other insulating film containing silicon.

Note that the first interlayer insulating film 701 is formed with a silicon nitride film or a silicon nitride film containing oxygen, and a heat treatment is performed so that island-shaped crystalline semiconductor films 520 to 522 may be hydrogenated by hydrogen from the first interlayer insulating film 701. In other words, dangling bonds existing in the island-shaped crystalline semiconductor films 520 to 522 can be terminated by hydrogen.

Then, a second interlayer insulating film 702 serving as a planarizing film is formed over the first interlayer insulating film 701.

The second interlayer insulating film 702 can be formed with a photosensitive or non-photosensitive organic material (polyimide, acrylic, polyamide, polyimide amide, or benzocyclobutene), resist, siloxane, or a stacked layer of these materials. As an organic material, a positive photosensitive organic resin or a negative photosensitive organic resin can be used.

Siloxane is a material having a skeleton structure of a Si—O bond, and having an organic group containing at least hydrogen (for example, alkyl group, aromatic hydrocarbon) as a substituent. In addition, a fluoro group may also be used as a substituent. Further, an organic group containing at least hydrogen and a fluoro group may also be used as a substituent.

In this embodiment, siloxane is formed by a spin coating method as the second interlayer insulating film 702.

The first interlayer insulating film 701 and the second interlayer insulating film 702 are partially etched to form contact holes that reach the electrode 514. The contact holes are formed using carbon tetrafluoride ($CF_4$) of 50 sccm, oxygen ($O_2$) of 50 sccm, helium (He) of 30 sccm as an etching gas.

Figure 17B:
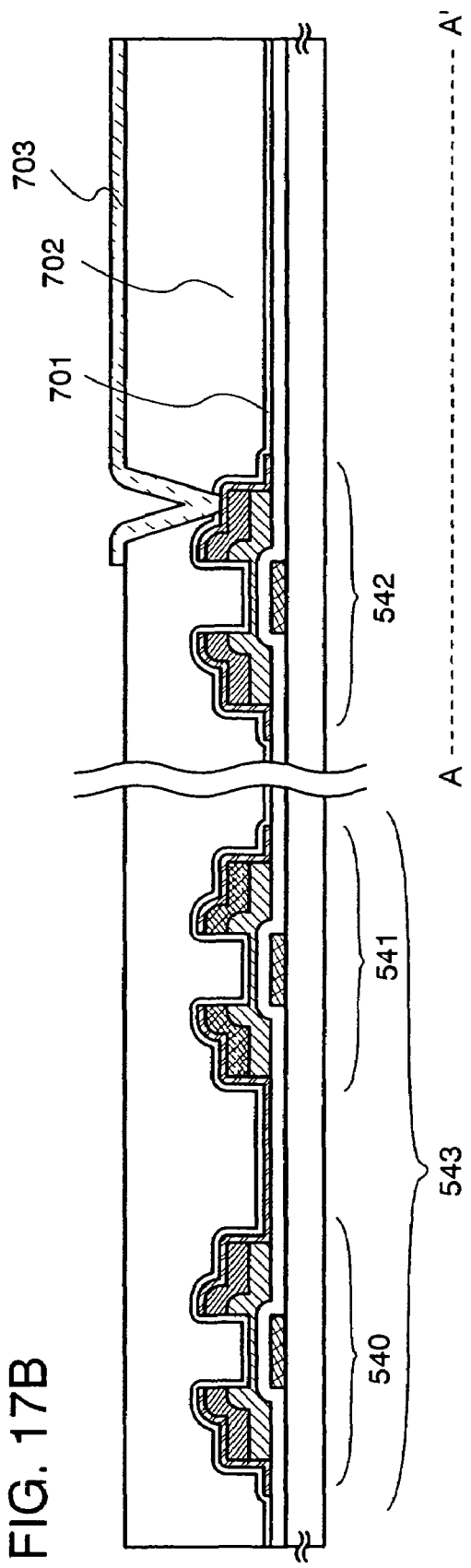

A conductive film is formed over the second interlayer insulating film 702. Then, the conductive film is patterned using a photomask to form a pixel electrode 703 electrically connected to the electrode 514 (FIG. 17B).

In this embodiment, a transmissive liquid crystal display panel is manufactured; therefore the pixel electrode 703 is formed using a transparent conductive film such as indium tin oxide (ITO), indium tin oxide containing silicon oxide, zinc oxide (ZnO), tin oxide ($SnO_2$).

In addition, when such a reflective liquid crystal display panel is manufactured, the pixel electrode 703 may be formed using a metal material having light reflectivity such as silver (Ag), gold (Au), copper (Cu), tungsten (W) or aluminum (Al) by a sputtering method.

Figure 19:
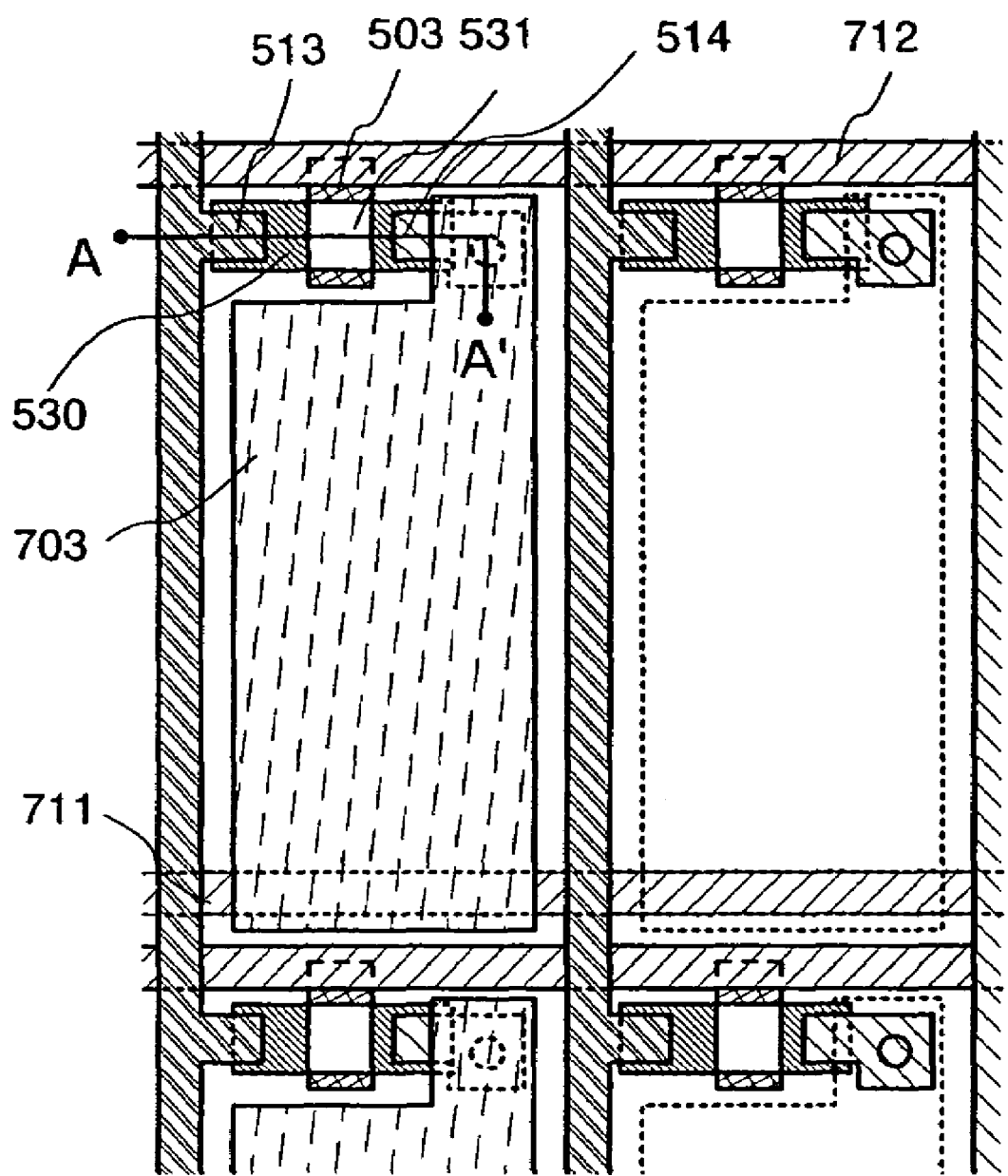
FIG. 19 is a top view of a pixel of a liquid crystal display device according to one aspect of the present invention.

FIG. 19 shows a top view in which a part of a pixel portion 801 is enlarged. FIG. 19 shows the pixel electrodes that are in the halfway of the process. In FIG. 19, the pixel electrode is formed in the left-side pixel; while the pixel electrode is not formed in the right-side pixel. A drawing taken along the solid line A-A' in FIG. 19 corresponds to the cross-sectional view of the pixel TFT 542 in FIG. 17 B, and the portions corresponding to the portions in FIG. 17B are denoted with the same reference numerals. In addition, a capacitor wiring 711 is provided. A storage capacitor is formed with the pixel electrode 703 and the capacitor wiring 711 overlapped with the pixel electrode; and uses the first interlayer insulating film 701 as a dielectric.

In this embodiment, in the region in which the pixel electrode 703 is overlapped with the capacitor wiring 711, the second interlayer insulating film 702 is etched. The storage capacitor is formed with the pixel electrode 703, the first interlayer insulating film 701, and the capacitor wiring 711. However, if the second interlayer insulating film 702 can be used as a dielectric, the second interlayer insulating film 702 is not necessarily be etched. In that case, the first interlayer insulating film 701 and the second interlayer insulating film 702 serve as dielectrics.

In FIG. 19, the gate electrode 503 is connected to a gate wiring 712 which is formed separately from the gate electrode 503. The electrode 503 and the source wiring are integrated; however, the electrode 503 and the source wiring may be formed separately and connected to each other.

According to the above process, a liquid crystal display panel TFT substrate in which the inversely staggered type pixel TFT 542, the CMOS circuit 543 including the inversely staggered N-channel TFT 540 and P-channel TFT 541, and the pixel electrode 703 are formed over the substrate 500, can be completed.

Then, an orientation film 704a is formed to cover the pixel electrode 703. The orientation film 704a is preferably formed by a droplet discharge method, a screen printing method, or an offset printing method. Then, a rubbing treatment is performed on the surface of the orientation film 704a.

Figure 20A:
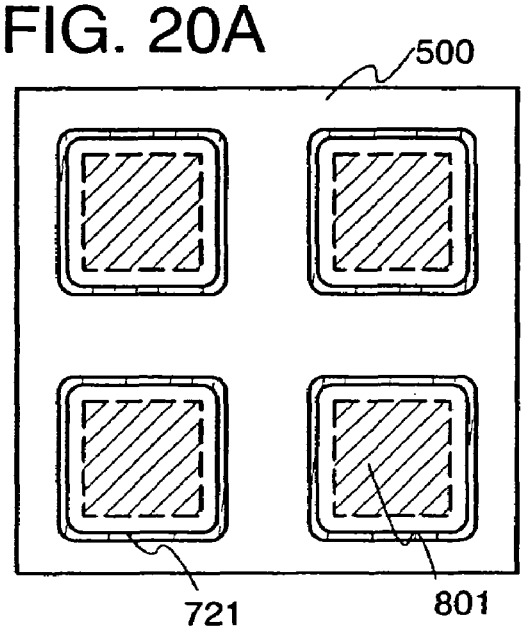
FIGS. 20A to 20D each show a manufacturing step of a liquid crystal display device according to one aspect of the present invention.
Figure 20B:
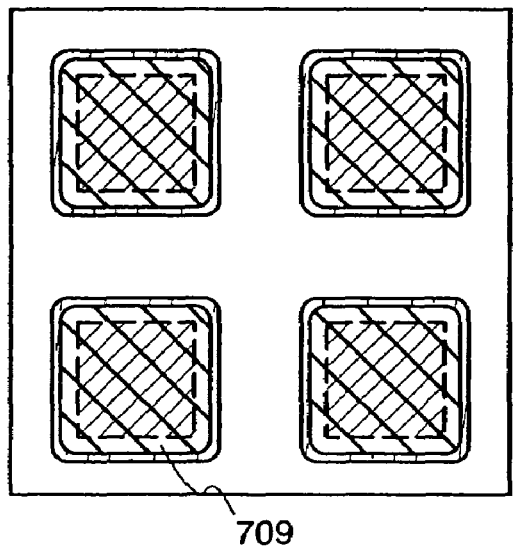

Over an opposite substrate 705, a color filter including a colored layer 706b, a light-shielding layer (black matrix) 706a, and an overcoat layer 707 is formed, and further an opposite electrode 708 that is a transmissive electrode or a reflective electrode is formed, and an orientation film 704b is formed thereover. Then, a sealing agent 721 with a closed pattern is formed by a droplet discharge method to surround a region overlapped with a pixel portion 801. Here, the example of forming the sealing agent 721 with the closed pattern is shown since a liquid crystal 709 is dropped. However, a dip coating method (piping up method) by which liquid crystals are injected using a capillary phenomenon may be employed after providing a seal pattern having an opening portion and attaching the TFT substrate to the opposite substrate (FIG. 20A).

Figure 20C:
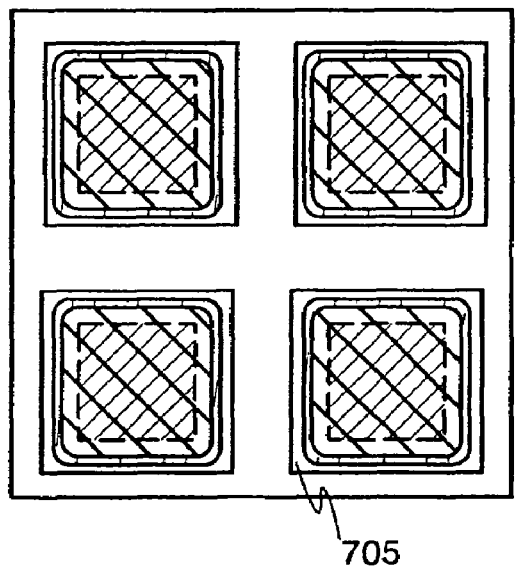

Then, the liquid crystal 709 is dropped under reduced pressure to prevent air bubbles from entering (FIG. 20B), and the both substrates 500 and 705 are attached to each other (FIG. 20C). The liquid crystal is dropped once or several times in the closed-loop seal pattern. A twisted nematic (TN) mode is mostly used as an alignment mode of the liquid crystal. In this TN mode, the alignment direction of liquid crystal molecules is twisted at 90° with respect to the light path from its entrance to exit. In the case of manufacturing a TN mode liquid crystal display device, the substrates are attached to each other so that the rubbing directions thereof are orthogonalized.

The space between the pair of substrates may be maintained by spraying a spherical spacer, forming a columnar spacer formed of resin, or mixing a filler into the sealing agent. The columnar spacer mentioned above is formed of an organic resin material containing at least one material selected from acrylic, polyimide, polyimide amide, and epoxy as its main component; any one of material of silicon oxide, silicon nitride, and silicon oxide containing nitrogen; or an inorganic material including these stacked films.

Figure 20D:
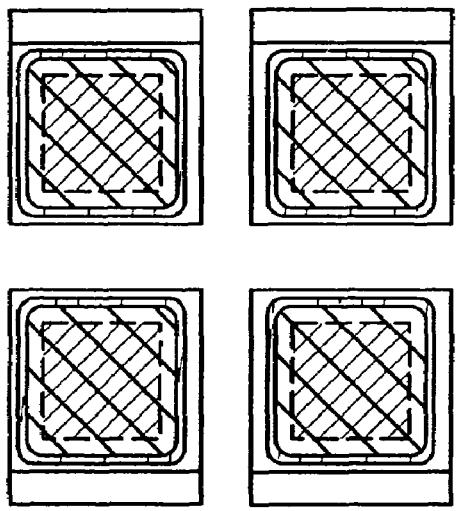

Then, the substrates are sectioned. In the case of obtaining a plurality of panels from one substrate, each panel is sectioned from one another. In the case of obtaining one panel from one substrate, the sectioning process can be omitted by attaching the opposite substrate that is cut in advance (FIG. 20D).

An FPC (Flexible Printed Circuit) 804 is attached with an anisotropic conductive layer by a known method. A liquid crystal display device is completed according to this step. In addition, an optical film may be attached, if necessary. In the case of a transmissive liquid crystal display device, a polarizing plate is attached to both the active matrix substrate and the opposite substrate.

Figure 18:
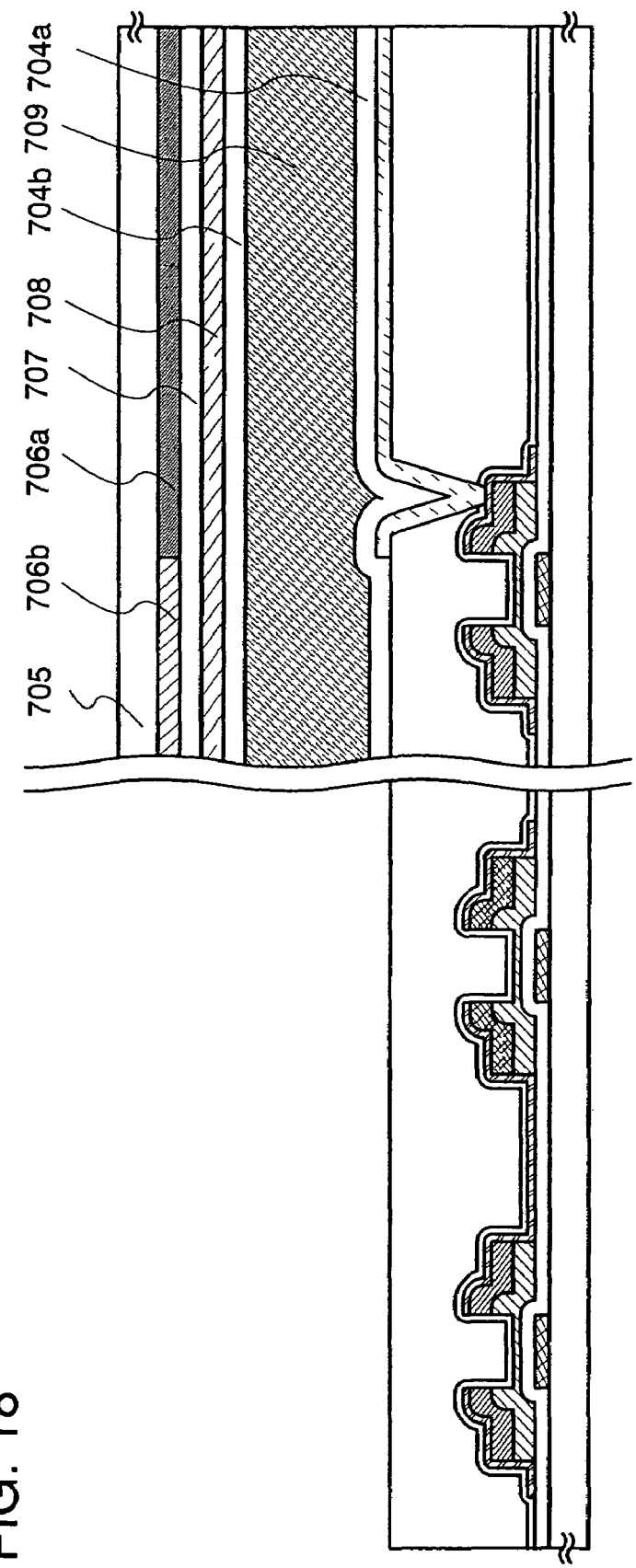
FIG. 18 shows a manufacturing step of a liquid crystal display device according to one aspect of the present invention.
Figure 21A:
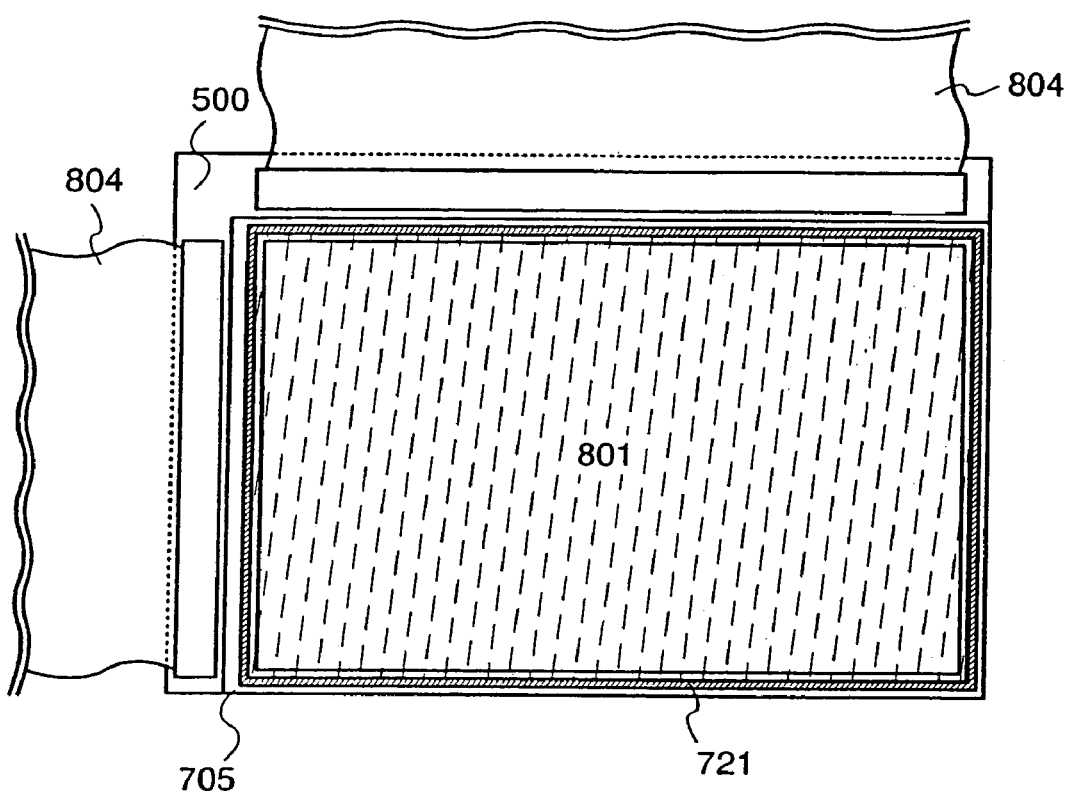
FIGS. 21A and 21B each show a manufacturing step of a liquid crystal display device according to one aspect of the present invention.
Figure 21B:
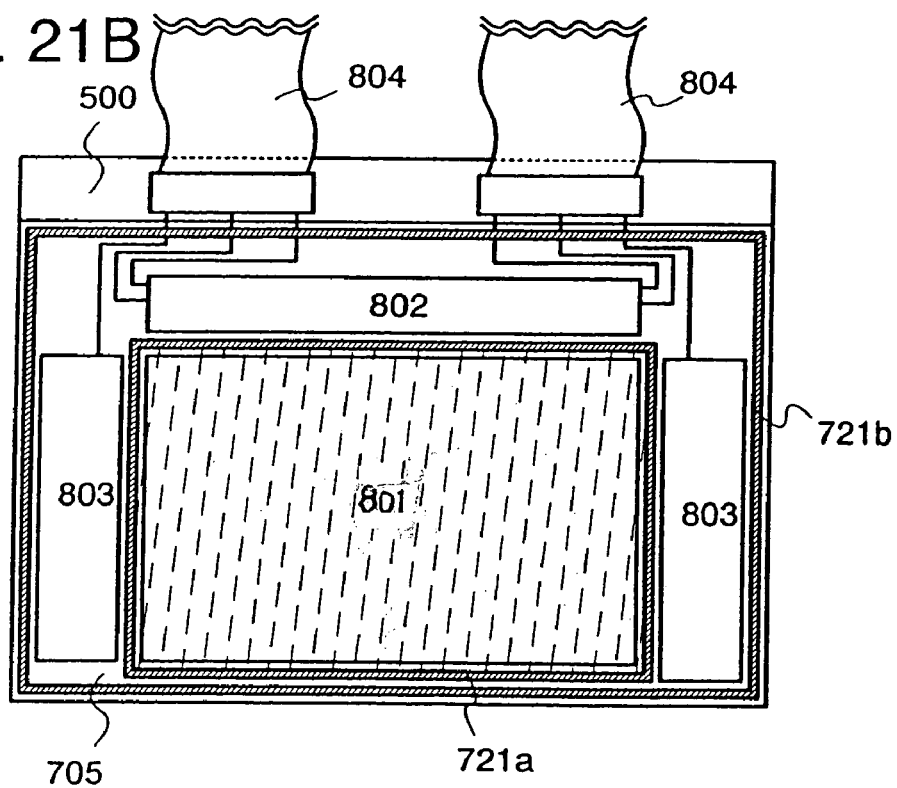

A cross-sectional view of the liquid crystal display device obtained according to the above process is shown in FIG. 18, a top view thereof is shown in FIG. 21A, and a top view of another liquid crystal display device is shown in FIG. 21B as one example.

In FIG. 21A, reference numeral 500 denotes a substrate; 705, a opposite substrate; 801, a pixel portion; 721; a sealing agent; and 804, an FPC. In addition, the liquid crystal is discharged by a droplet discharge method, and the pair of substrates 500 and 705 are attached to each other by the sealing agent 721 under reduced pressure.

In FIG. 21B, reference numeral 802 denotes a source signal line driver circuit; 803, a gate signal line driver circuit; 721a, a first sealing agent; and 721b, a second sealing agent. In addition, the liquid crystal is discharged by a droplet discharge method, and the pair of substrates 500 and 705 are attached to each other by the first sealing agent 721*a* and the second sealing agent 721*b*. The liquid crystal is not required in the driver circuit portions 802 and 803, therefore the liquid crystal is kept only in the pixel portion 801, and the sealing agent 721*b* is provided to reinforce the whole panel.

As described above, the process of manufacturing the TFT can be shortened in this embodiment compared with a conventional process; therefore it is possible to shorten also the process of manufacturing the liquid crystal display device. The liquid crystal display device manufactured according to this embodiment can also be used as display portions of various types electronic devices.

Note that the TFT has a single gate structure in this embodiment; however, without being limited to this, a multi-gate TFT having a plurality of channel regions, for example a double gate TFT, may also be used.

Above shown is the example of manufacturing the liquid crystal display device using the TFT shown in Embodiment 1; however, it is also possible to say that a liquid crystal display device is manufactured using the TFT formed according to Embodiments 2 to 5.

For example, in the case of manufacturing a liquid crystal display device using the TFT formed according to Embodiment 2, the same liquid crystal display device as that in FIG. 18 can be obtained.

Examples of liquid crystal display devices manufactured according to Embodiments 3 to 5 are described with reference to FIGS. 22 to 24, and FIG. 44.

Figure 22:
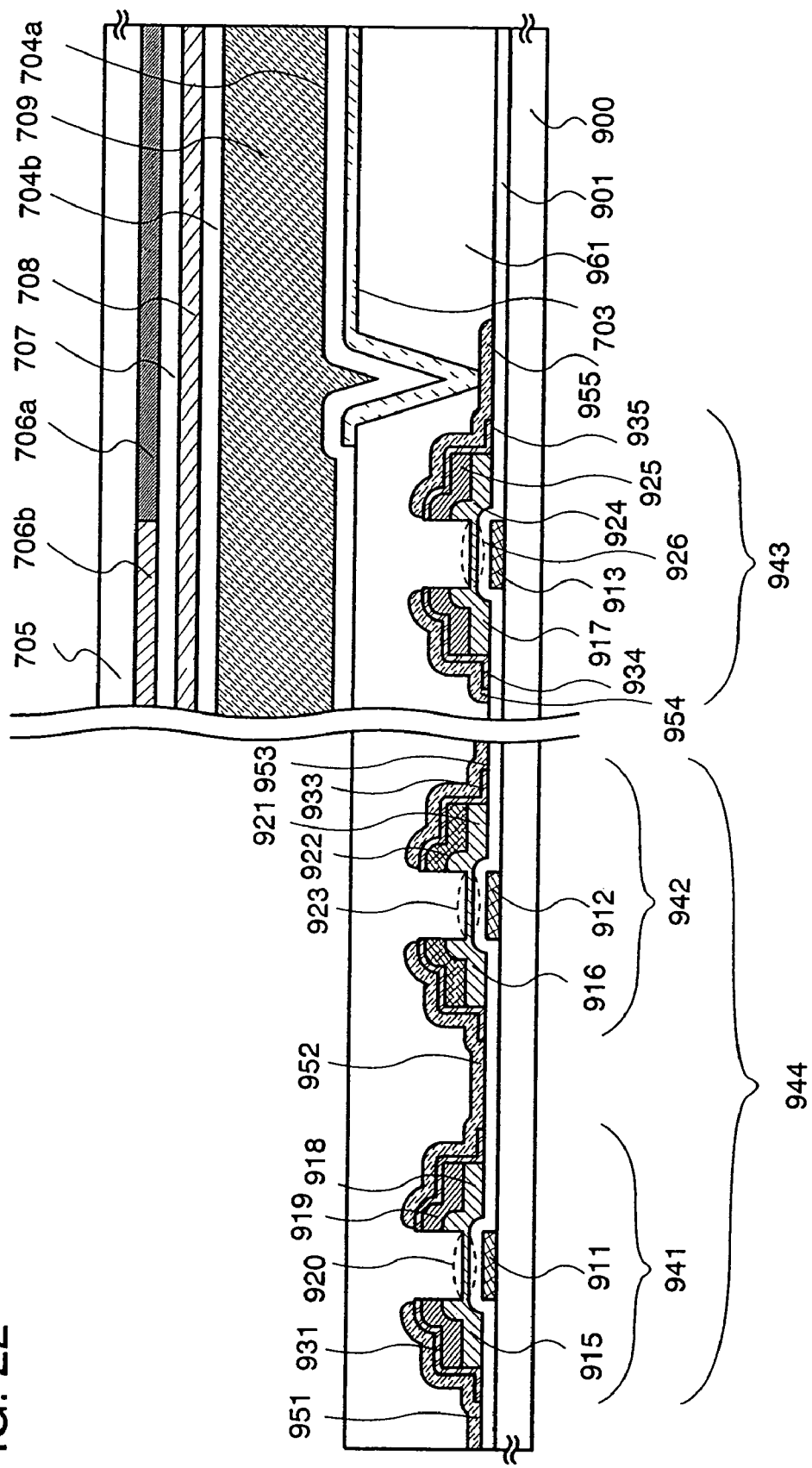
FIG. 22 shows a manufacturing step of a liquid crystal display device according to one aspect of the present invention.

FIG. 22 shows an example in which the TFT and the CMOS circuit shown in FIG. 25 of Embodiments 3 to 5 are applied to the liquid crystal display device of this embodiment. The same portions as those in FIG. 18 and FIG. 25 are denoted with the same reference numerals.

However, an interlayer insulating film 961 also serving as a planarizing film is formed over TFTs 941 to 943. The interlayer insulating film 961 can be formed with a photosensitive or non-photosensitive organic material (polyimide, acrylic, polyamide, polyimide amide, or benzocyclobutene), resist, siloxane, or a stacked layer of these materials. As an organic material, a positive photosensitive organic resin or a negative photosensitive organic resin can be used.

Siloxane is a material having a skeleton structure of a Si—O bond, and having an organic group containing at least hydrogen (for example, alkyl group, aromatic hydrocarbon) as a substituent. In addition, a fluoro group may also be used as a substituent. Further, an organic group containing at least hydrogen and a fluoro group may also be used as a substituent.

Then, a conductive film is formed over the interlayer insulating film 961, and is patterned to form the pixel electrode 703 electrically connected to an electrode 955. The later process is similar to those described above.

Figure 23:
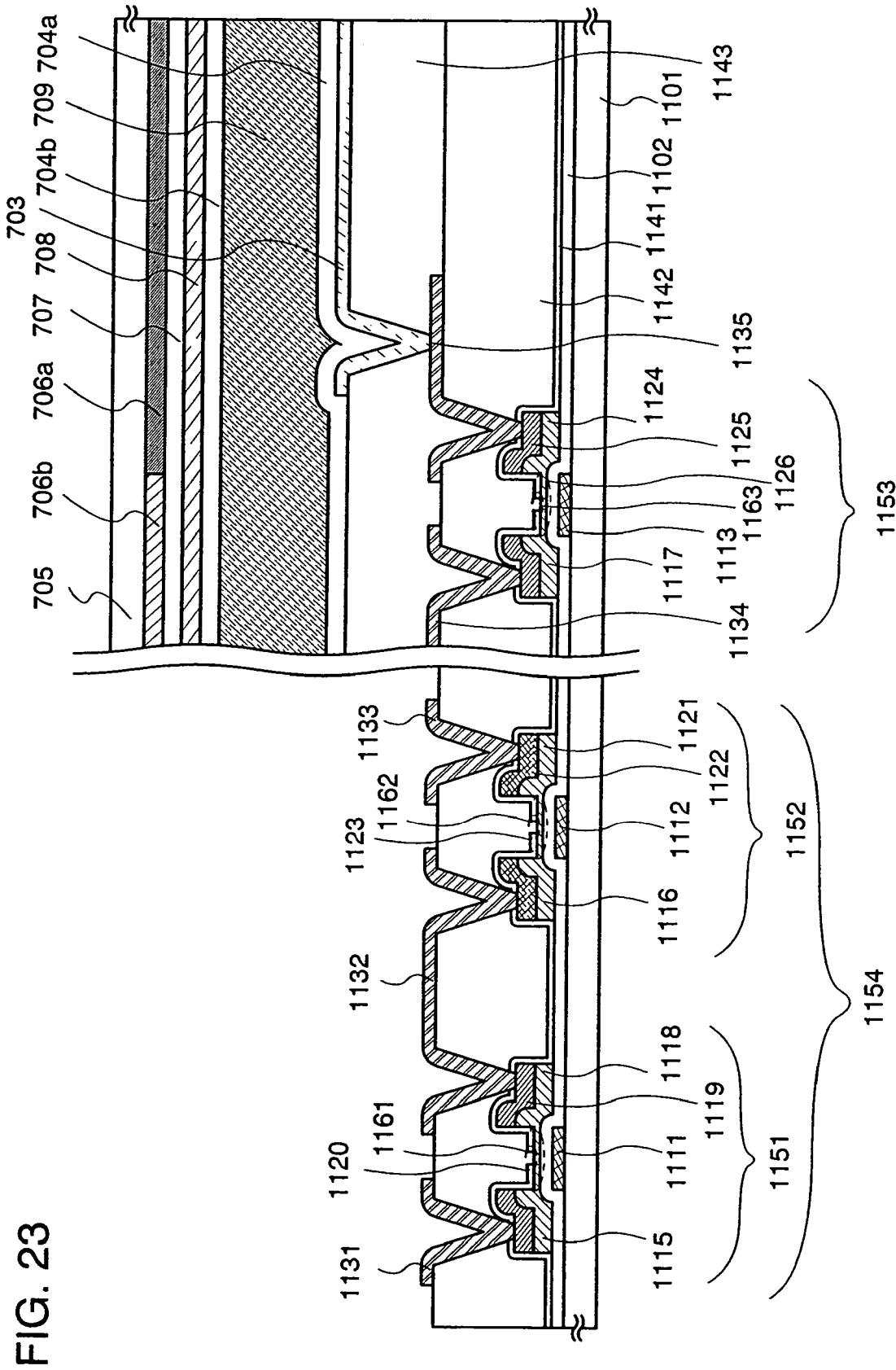
FIG. 23 shows a manufacturing step of a liquid crystal display device according to one aspect of the present invention.

FIG. 23 shows an example in which the TFT and the CMOS circuit shown in FIG. 26 of Embodiment 5 are applied to the liquid crystal display device of this embodiment. The same portions as those in FIG. 18 and FIG. 26 are denoted with the same reference numerals.

However, a second interlayer insulating film 1143 also serving as a planarizing film is formed over wirings 1134 and 1135 and the interlayer insulating film 1142. The second interlayer insulating film 1143 can be formed with a photosensitive or non-photosensitive organic material (polyimide, acrylic, polyamide, polyimide amide, or benzocyclobutene), resist, siloxane, or a stacked layer of these materials. As an organic material, a positive photosensitive organic resin or a negative photosensitive organic resin can be used.

Siloxane is a material having a skeleton structure of a Si—O bond, and having an organic group containing at least hydrogen (for example, alkyl group, aromatic hydrocarbon) as a substituent. In addition, a fluoro group may also be used as a substituent. Further, an organic group containing at least hydrogen and a fluoro group may also be used as a substituent.

Then, a conductive film is formed over the interlayer insulating film 1143, and is patterned to form the pixel electrode 703 electrically connected to the wiring 1135. The later process is similar to those described above.

Figure 24:
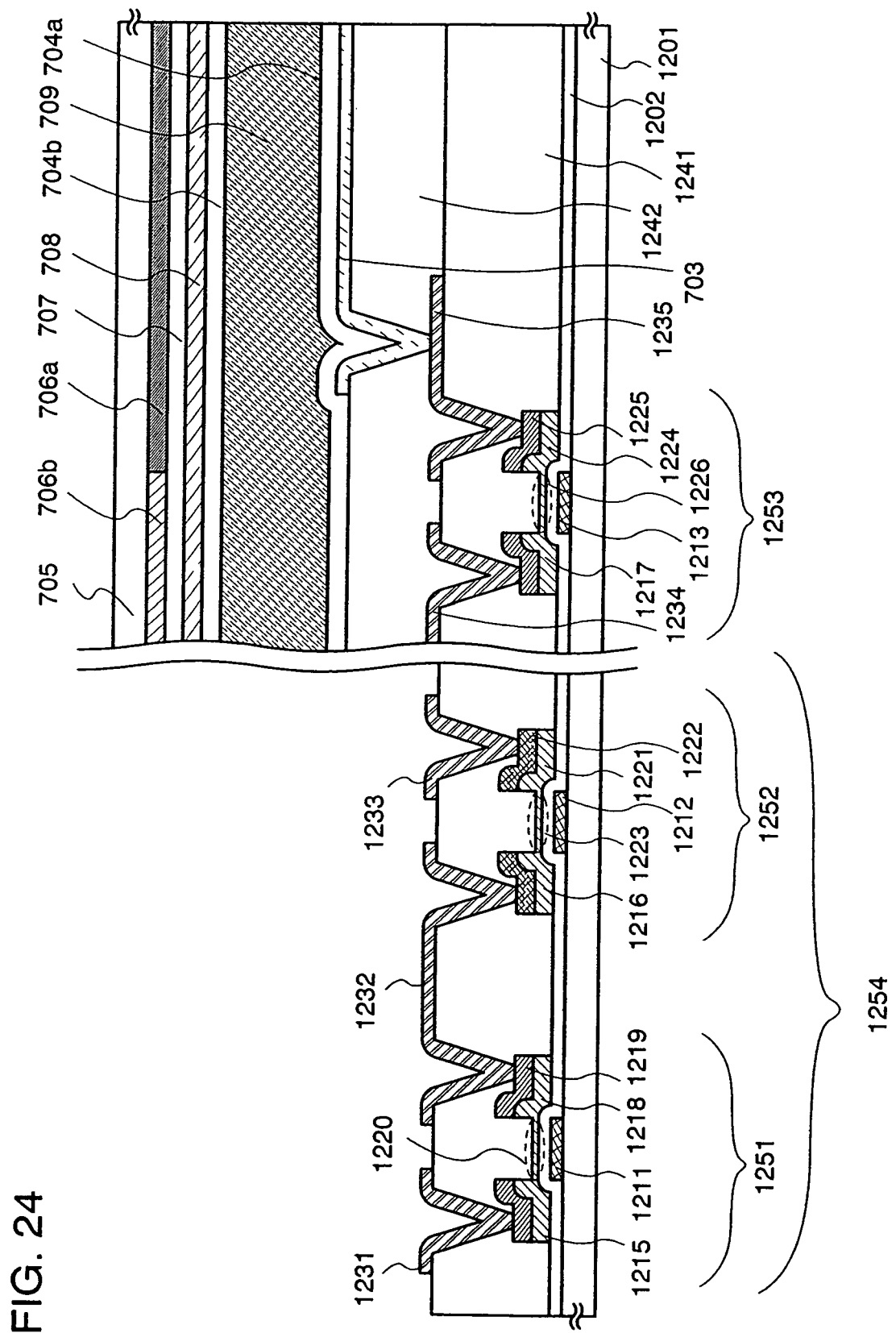
FIG. 24 shows a manufacturing step of a liquid crystal display device according to one aspect of the present invention.

FIG. 24 shows an example in which the TFT and the CMOS circuit shown in FIG. 27 of Embodiment 5 are applied to the liquid crystal display device of this embodiment. The same portions as those in FIG. 18 and FIG. 27 are denoted with the same reference numerals.

However, a second interlayer insulating film 1242 also serving as a planarizing film is formed over wirings 1234 and 1235, and the interlayer insulating film 1241. The second interlayer insulating film 1242 can be formed with a photosensitive or non-photosensitive organic material (polyimide, acrylic, polyamide, polyimide amide, or benzocyclobutene), resist, siloxane, or a stacked layer of these materials. As an organic material, a positive photosensitive organic resin or a negative photosensitive organic resin can be used.

Siloxane is a material having a skeleton structure of a Si—O bond, and having an organic group containing at least hydrogen (for example, alkyl group, aromatic hydrocarbon) as a substituent. In addition, a fluoro group may also be used as a substituent. Further, an organic group containing at least hydrogen and a fluoro group may also be used as a substituent.

Then, a conductive film is formed over the interlayer insulating film 1242, and is patterned to form the pixel electrode 703 electrically connected to the wiring 1235. The later process is similar to those described above.

Figure 44:
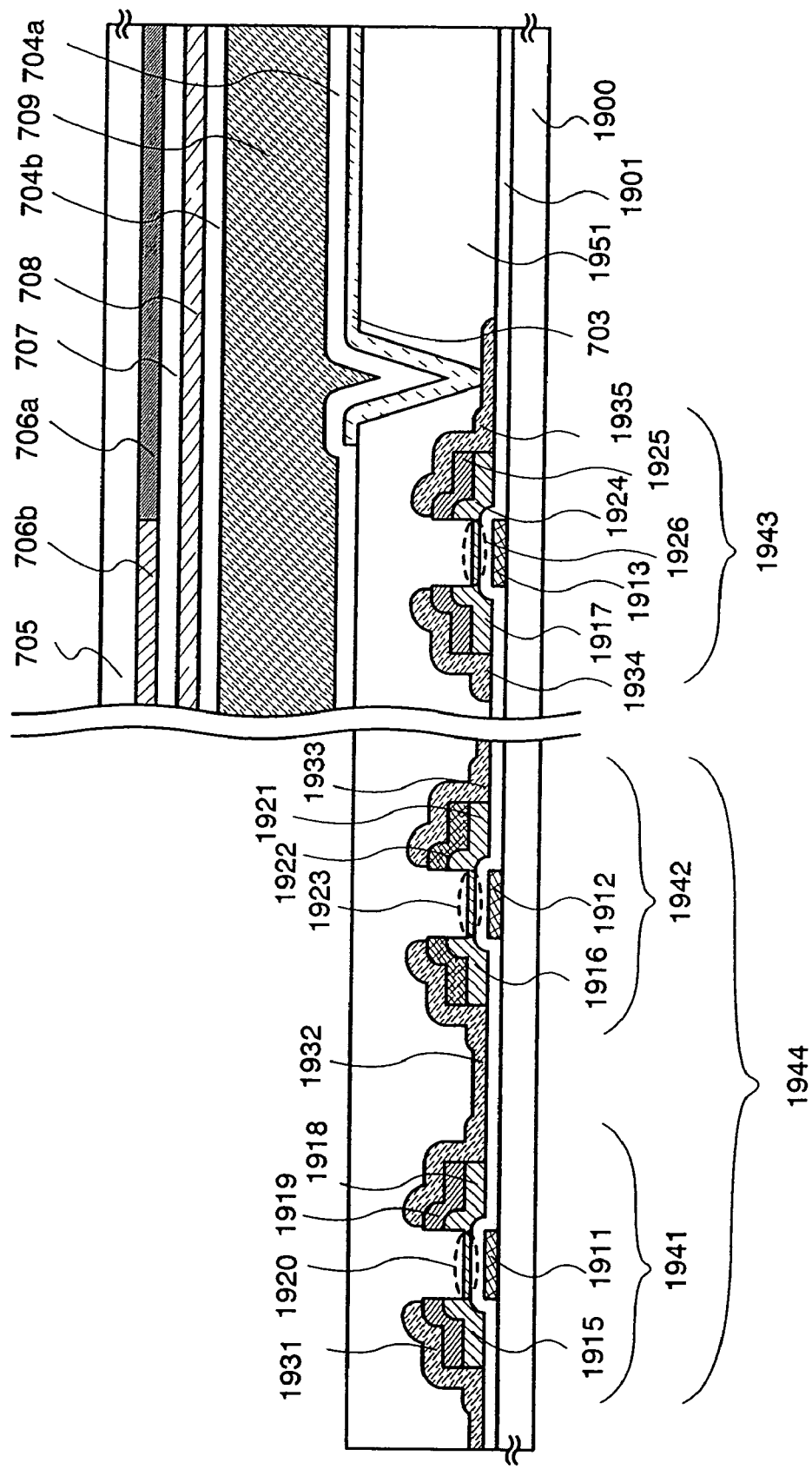
FIG. 44 shows a manufacturing step of a liquid crystal display device according to one aspect of the present invention.

FIG. 44 shows an example in which the TFT and the CMOS circuit shown in FIG. 43 of Embodiment 5 are applied to the liquid crystal display device of this embodiment. The same portions as those in FIG. 18 and FIG. 43 are denoted with the same reference numerals.

However, an interlayer insulating film 1951 also serving as a planarizing film is formed over the TFTs 1941 to 1943. The interlayer insulating film 1951 can be formed with a photosensitive or non-photosensitive organic material (polyimide, acrylic, polyamide, polyimide amide, or benzocyclobutene), resist, siloxane, or a stacked layer of these materials. As an organic material, a positive photosensitive organic resin or a negative photosensitive organic resin can be used.

Siloxane is a material having a skeleton structure of a Si—O bond, and having an organic group containing at least hydrogen (for example, alkyl group, aromatic hydrocarbon) as a substituent. In addition, a fluoro group may also be used as a substituent. Further, an organic group containing at least hydrogen and a fluoro group may also be used as a substituent.

Then, a conductive film is formed over the interlayer insulating film 1951, and is patterned to form the pixel electrode 703 electrically connected to the electrode 1935. The later process is similar to those described above.

In addition, this embodiment can be freely combined with any content of Embodiment Mode and Embodiments 1 to 5.

Embodiment 7

Embodiment 7 describes an example of using a droplet discharge method for dropping liquid crystals. In this embodiment, FIGS. 28A to 31B each illustrate an example of manufacturing four panels from one large-sized substrate 1310.

Figure 28A:
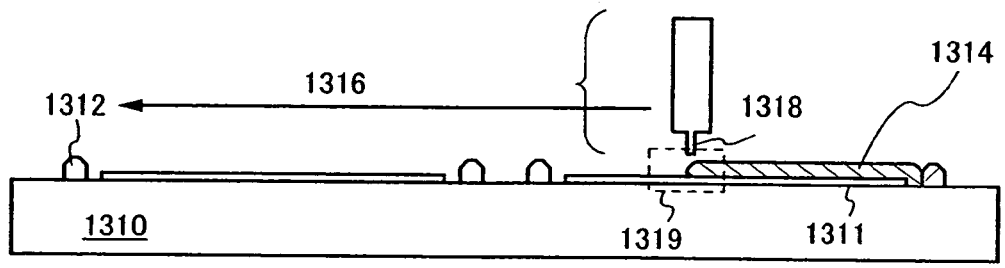
FIGS. 28A to 28D each show a manufacturing step of a liquid crystal display device using a liquid-crystal dropping method, according to one aspect of the present invention.

FIG. 28A illustrates a cross-sectional view in forming a liquid crystal layer by a dispenser (or ink jet). A liquid crystal material 1314 is discharged, sprayed, or dropped from a nozzle 1318 of a droplet discharging apparatus 1316 to cover a pixel portion 1311 surrounded by a sealing agent 1312. The droplet discharging apparatus 1316 is moved in the direction indicated by an arrow in FIG. 28A. An example of moving the nozzle 1318 is described here; however, the nozzle may be fixed and the substrate may be moved to form the liquid crystal layer.

Figure 28B:
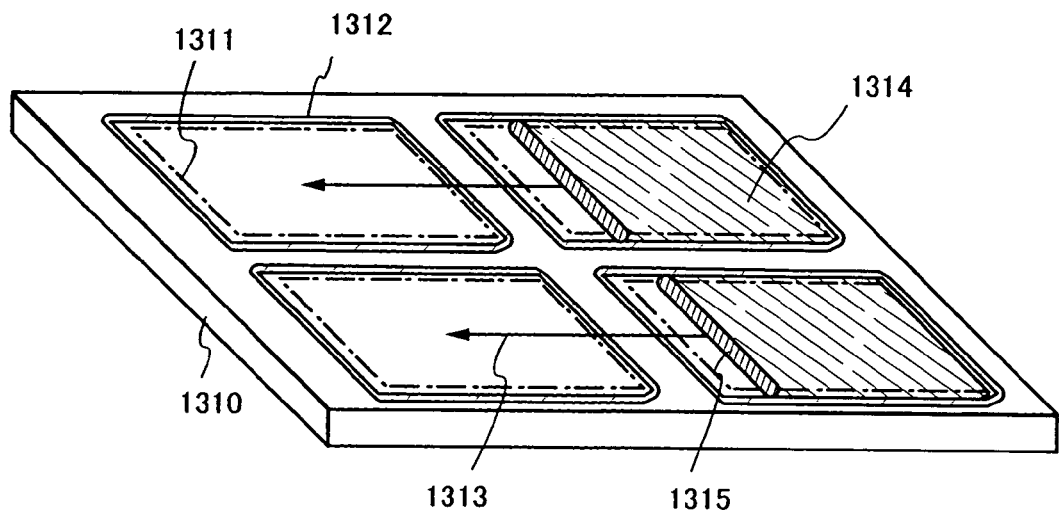

FIG. 28B illustrates a perspective view. In FIG. 28B, the liquid crystal material 1314 is selectively discharged, sprayed, or dropped only to the region surrounded by the sealing agent 1312, and a drop surface 1315 is moved in accordance with a nozzle moving direction 1313.

Figure 28C:
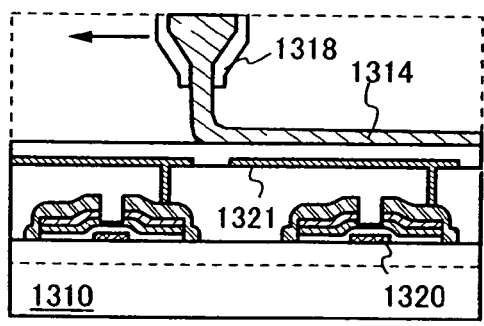
Figure 28D:
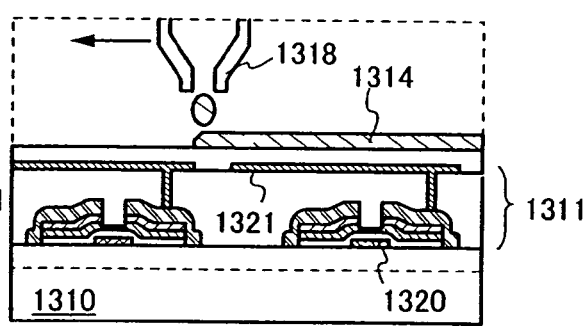

FIGS. 28C and 28D are enlarged cross-sectional views of a region surrounded by the dotted line 1319 in FIG. 28A. When the liquid crystal material has high viscosity, the liquid crystal material is discharged continuously and, as shown in FIG. 28C, is attached to the surface in a manner where droplets of the liquid crystal material are joined to one another. On the other hand, when the liquid crystal material has low viscosity, the liquid crystal material is discharged intermittently; in other words, droplets are dropped one by one as illustrated in FIG. 28D.

In FIGS. 28C and 28D, reference numeral 1310 denotes a large-sized substrate; 1320, a pixel TFT; and 1321, a pixel electrode. The pixel portion 1311 includes a pixel electrode arranged in matrix, a switching element connected to the pixel electrode, a TFT manufactured according to the description in Embodiment 1 to 6, and a storage capacitor.

A manufacturing flow of a panel is hereinafter described with reference to FIGS. 29A to 30B.

Figure 29A:
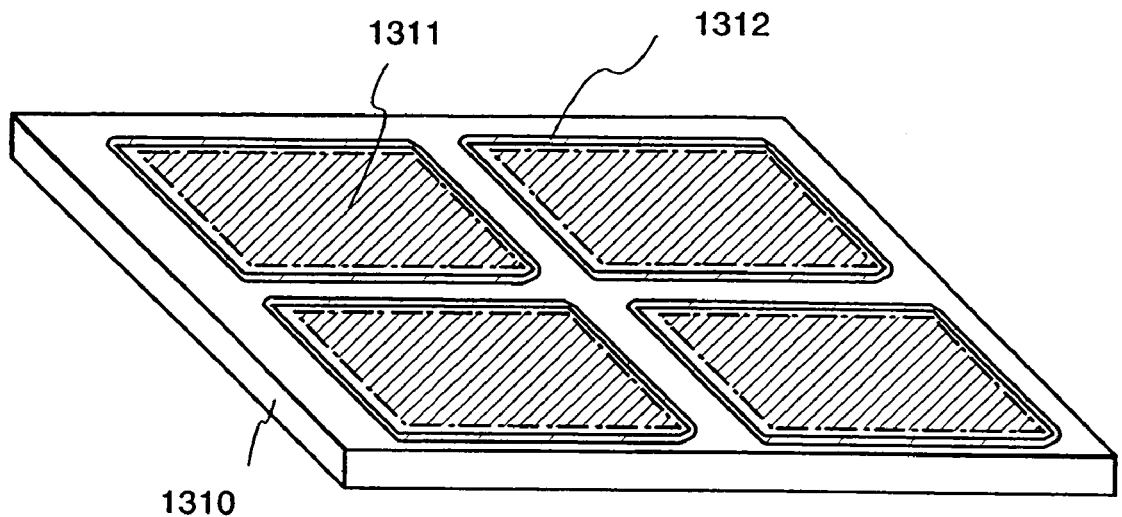
FIGS. 29A and 29B each show a manufacturing step of a liquid crystal display device using a liquid-crystal dropping method, according to one aspect of the present invention.

First, a first substrate 1310 that is provided with a pixel portion 1311 over the insulating surface is prepared. Formation of an orientation film, a rubbing treatment, spraying of a spherical spacer, or formation of a columnar spacer, or formation of a color filter are, in advance, performed on the first substrate 1310. Then, as illustrated in FIG. 29A, a sealing agent 1312 is formed at the predetermined position (pattern surrounding the pixel portion 1311) over the first substrate 1310 in an inert gas atmosphere or under reduced pressure by a dispenser apparatus or an ink jet apparatus. A material including a filler (diameter of from 6 μm to 24 μm) and having viscosity of 40 Pa·s to 400 Pa·s is used as the semi-transparent sealing agent 1312. Further, a material that is not dissolved in a liquid crystal that is to be in contact with the sealing agent is preferably selected. An acrylic-based photo-curing rein or an acrylic-based thermosetting resin may be used as the sealing agent. The sealing agent 1312 can also be formed by a printing method because the pattern is simple.

Figure 29B:
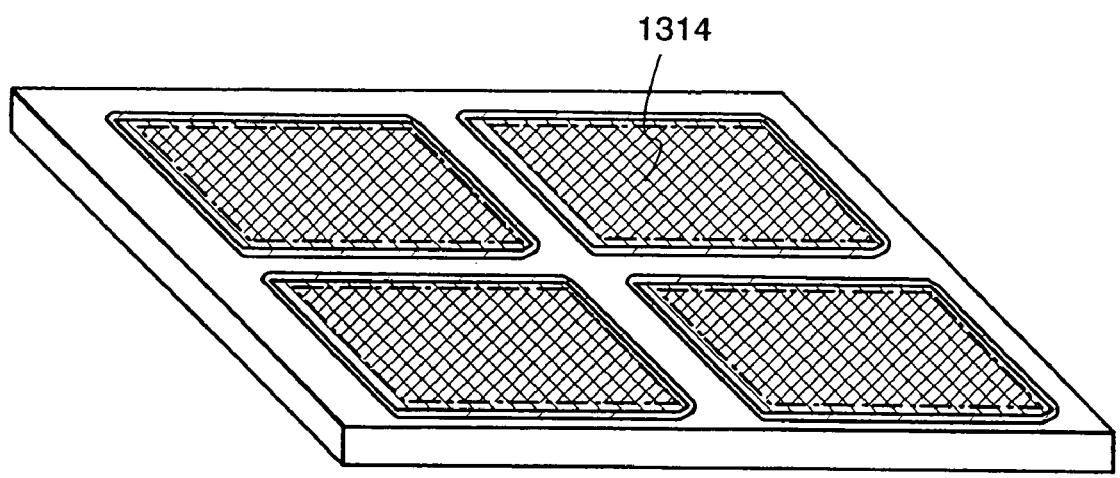

A liquid crystal material 1314 is dropped by an ink-jet method in the region surrounded by the sealing agent 1312 (FIG. 29B). A known liquid crystal material that has an appropriate viscosity for discharging by an ink-jet method may be used as the liquid crystal material 1314. Since the viscosity of the liquid crystal material can be set by controlling the temperature, the liquid crystal material is suitable for an ink-jet method. A necessary amount of the liquid crystal material 1314 can be held without waste in the region surrounded by the sealing agent 1312 by an ink-jet method.

Then, the first substrate 1310 provided with the pixel portion 1311 is attached to a second substrate 1331 provided with an opposite electrode or an orientation film under reduced pressure so that air bubbles are not interposed between the two substrates (FIG. 30A). Herein, the sealing agent 1312 is cured by ultraviolet irradiation or a heat treatment simultaneously with the attachment. In addition to the ultraviolet irradiation, a heat treatment may also be performed.

Figure 31A:
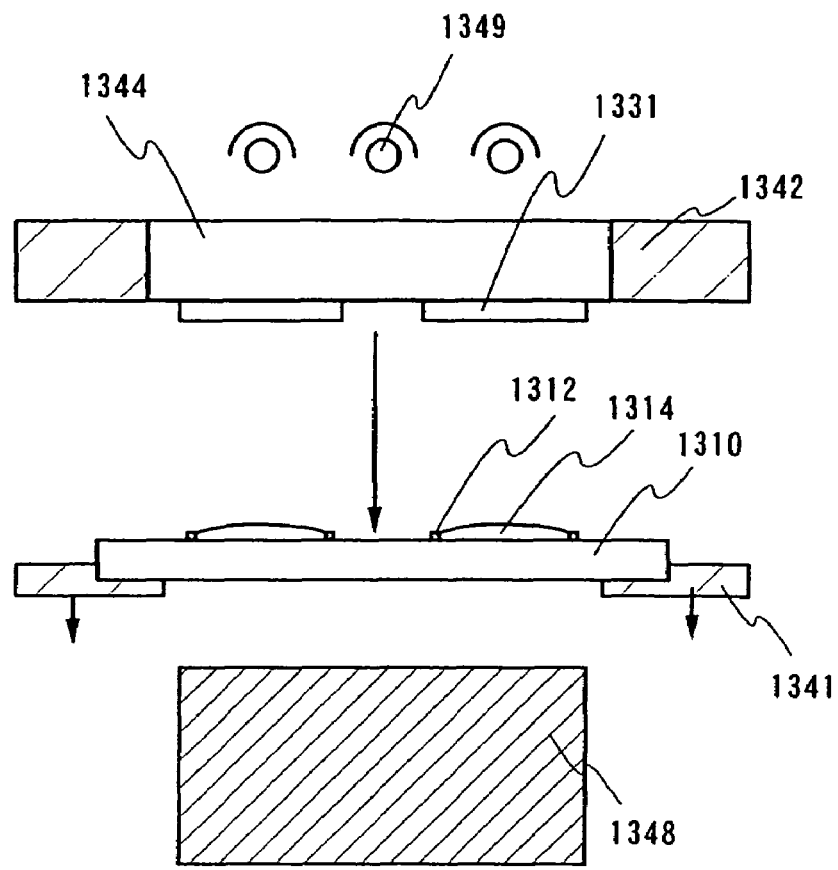
FIGS. 31A and 31B each show attachment of substrates in a liquid crystal display device according to one aspect of the present invention.
Figure 31B:
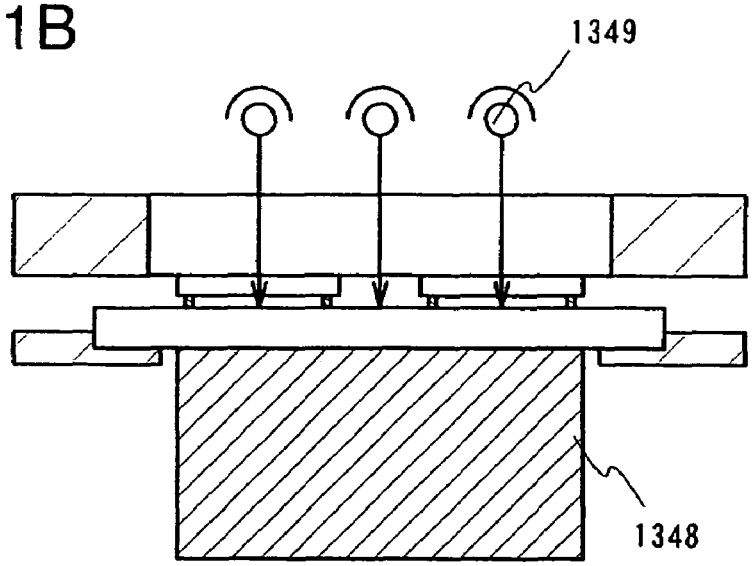

FIGS. 31A and 31B illustrate an example of an attachment apparatus capable of performing the ultraviolet irradiation or the heat treatment during attachment or after attachment.

In FIGS. 31A and 31B, reference numeral 1341 denotes a first substrate support; 1342, a second substrate support; 1344, a window; 1348, a lower platen; and 1349, a light source. In FIGS. 31A and 31B, the same components are denoted by the same reference numerals as of FIGS. 28 to 30.

A heater for curing the sealing agent is installed in the lower platen 1348. The second substrate support 1342 is provided with a window 1344 to pass ultraviolet light or the like from the light source 1349. Although not shown here, alignment of a substrate is performed through the window 1344. The second substrate 1331 serving as an opposite substrate is preliminary cut into a desired size and secured to the second substrate support 1342 by a vacuum chuck. FIG. 31A illustrates the state before attachment.

At the time of attachment, the first substrate support 1341 and the second substrate support 1342 are moved down, and the first substrate 1310 and the second substrate 1331 are attached to each other by being applied with pressure; then, the attached substrates are irradiated with ultraviolet light to cure the sealing agent. FIG. 31B illustrates the state after attachment.

Then, the first substrate 1310 is cut using a cutting apparatus such as a scriber apparatus, a breaker apparatus, or a roll cutter apparatus (FIG. 30B). In this manner, four panels can be manufactured from one substrate. Then, an FPC is attached to the panels by a known technique.

A glass substrate or a plastic substrate can be used as the first substrate 1310 and the second substrate 1331.

According to the foregoing processes, the liquid crystal display device is manufactured using such a large-sized substrate.

In addition, this embodiment can be freely combined with any content of Embodiment Mode and Embodiment 1 to 6, if necessary.

Embodiment 8

Embodiment 8 describes an example of manufacturing a dual emission EL (Electro-Luminescence) display device according to the present invention with reference to FIGS. 32A to 36.

First, according to the Embodiment 1, the process up to forming the semiconductor film into which an element selected from Group 15 of the periodic table is added shown in FIG. 7A is peformed (FIG. 32A). The same manufacturing condition, manufacturing process, and film forming materials, and the like as those in Embodiment 1 are used unless any description is given.

Note that TFTs 1451 to 1453 may be formed according to Embodiment 2 to Embodiment 5. In that case, the same manufacturing condition, manufacturing process, and materials for forming a film, and the like as those in each Embodiment are used.

In FIG. 32A, reference numeral 1401 denotes a substrate; 1402 to 1404, gate electrodes; 1405, a gate insulating film; 1406, an amorphous semiconductor film; and 1407, a semiconductor film into which an element selected from Group 15 of the periodic table is added.

A region of a semiconductor film 1407 except a region to be a P-channel TFT 1453 in later process is covered with a mask 1408, and an element selected from Group 13 of the periodic table is added thereto (FIG. 32B). In this embodiment, boron (B) is used as the element selected from Group 13 of the periodic table. A concentration thereof in the semiconductor film 1407 is adjusted to be $1 \times 10^{19}$ cm$^{-3}$ to $5 \times 10^{21}$ cm$^{-3}$ by adding boron by an ion implantation method or an ion doping method to form a P-type impurity region 1409 (FIG. 32C).

As shown in FIG. 32D, the amorphous semiconductor film 1406 and the semiconductor film 1407 are patterned to form an island-shaped region 1421 including an island-shaped amorphous semiconductor film 1411 and an island-shaped semiconductor film 1412; an island-shaped region 1422 including an island-shaped amorphous semiconductor film 1413 and an island-shaped semiconductor film 1414; and an island-shaped region 1423 including an island-shaped amorphous semiconductor film 1415 and an island-shaped semiconductor film 1416.

Next, a conductive film is formed to cover the island-shaped regions 1421 to 1423 and patterned to form electrodes 1431 to 1436 to be connected to a source region and a drain region in a TFT (FIG. 33A). The conductive film has a stacked structure of an element selected from tantalum (Ta), tungsten (W), titanium (Ti), and molybdenum (Mo), an alloy material or a compound material including the element as its main component.

The island-shaped regions 1421 to 1423 are etched using the electrodes 1431 to 1436 as masks (FIG. 33B).

Accordingly, each region of the island-shaped semiconductor films 1412, 1414, and 1416 which is not covered with the source electrodes and the drain electrodes 1431 to 1436 is removed entirely. The thickness of the island-shaped amorphous semiconductor films 1411, 1413, and 1415 is reduced, and regions which are not covered with the source electrodes and the drain electrodes 1431 to 1436 are exposed.

Subsequently, a catalytic element is added into the regions of the island-shaped amorphous semiconductor films 1411, 1413, and 1415 which are not covered with the electrodes 1431 to 1436 and exposed by etching (FIG. 33B).

An element selected from nickel (Ni), iron (Fe), palladium (Pd), tin (Sn), lead (Pb), cobalt (Co), platinum (Pt), copper (Cu), and gold (Au), or a plurality of the elements may be used as the catalytic element.

The catalytic element can be added by a spin coating method for applying a catalytic element dispersed in a solution, or a plasma treatment using an electrode including the catalytic element.

The island-shaped amorphous semiconductor films 1411, 1413, and 1415 are crystallized by performing a heat treatment at a temperature of 550 to 600° C. for 4 to 8 hours in a nitrogen atmosphere to form island-shaped crystalline semiconductor films 1434 to 1436. By this heat treatment, the catalytic element moves simultaneously with crystallization from the region into which the catalytic element is added, and getterd by the source regions and/or the drain regions 1442, 1445, and 1448. Accordingly, the island-shaped crystalline semiconductor films 1434 to 1436 where the catalytic element is reduced can be obtained.

By this heat treatment, the element selected from Group 15 or 13 of the periodic table which is contained in the source regions and drain regions 1442, 1445, or 1448 can be activated.

Thus, an inversely staggered N-channel TFTs 1451 and 1452, and P-channel TFT 1453 is formed.

The N-channel TFT 1451 includes a channel region 1443, a source and/or drain region 1442, and an intrinsic region 1441. The N-channel TFT 1452 includes a channel region 1446, a source and/or drain region 1445, and an intrinsic region 1444. The P-channel TFT 1453 includes a channel region 1449, a source and/or drain region 1448, and an intrinsic region 1447 (FIG. 33C).

In this embodiment, the P-channel TFT 1453 is used as a pixel TFT of this dual emission EL display device. The N-channel TFTs 1451 and 1452 are also used as TFTs of a drive circuit for driving the pixel TFT 1453. However, the pixel TFT is not necessarily a P-channel TFT, and an N-channel TFT may be used. The driver circuit does not necessarily have a combination of a plurality of N-channel TFTs. A circuit in which an N-channel TFT and a P-channel TFT are combined in a complementary manner, or a circuit in combination with a plurality of P-channel TFTs may be used.

Then, a first interlayer insulating film 1461 is formed to cover the TFTs 1451 to 1453.

The first interlayer insulating film 1461 is formed of an insulating film including silicon, for example a silicon oxide film (SiO$_x$), a silicon nitride film (SiN), a silicon oxide film including nitrogen (SiON), or a stacked film thereof, using a plasma CVD method or a sputtering method. Naturally, the material of the first interlayer insulating film 1461 is not limited to a silicon oxide film including nitrogen or a silicon nitride film, or a stacked film thereof. Another insulating film including silicon may be used as a single-layered structure or a stacked-layered structure.

Note that in the case of forming the first interlayer insulating film 1461 from silicon nitride or silicon nitride including oxygen, a heat treatment is performed to hydrogenate the island-shaped crystalline semiconductor films 1434 to 1436 by hydrogen from the first interlayer insulating film 1461. In other words, dangling bonds, which exist in the island-shaped crystalline semiconductor films 1434 to 1436, can be terminated.

Then, a second interlayer insulating film 1462 functioning as a planarizing film is formed over the first interlayer insulating film 1461.

A photosensitive or non-photosensitive organic material (polyimide, acrylic, polyamide, polyimide amide, or benzocyclobutene), resist, siloxane, or stacked structure thereof can be used for the second interlayer insulating film 1462. A positive type photosensitive organic resin or a negative type photosensitive organic resin can be used as the organic material.

Siloxane is a material having a skeleton structure of a Si—O bond, and having an organic group containing at least hydrogen (for example, alkyl group, aromatic hydrocarbon) as a substituent. In addition, a fluoro group may also be used as a substituent. Further, an organic group containing at least hydrogen and a fluoro group may also be used as a substituent.

In this embodiment, the second interlayer insulating film 1462 is formed with siloxane by a spin coating method.

Then, a light-transmitting third interlayer insulating film 1463 is formed over the second interlayer insulating film 1462. The third interlayer insulating film 1463 is provided as an etching stopper film in order to protect the planarizing film that is the second interlayer insulating film 1462 when a pixel electrode 1464 is patterned in a later process. The third interlayer insulating film 1463 is not required in the case where the second interlayer insulating film 1462 can serve as the etching stopper film when the pixel electrode 1464 is patterned.

A contact hole is formed in the first interlayer insulating film 1461, the second interlayer insulating film 1462, and the third interlayer insulating film 1463.

The pixel electrode (a transparent electrode in this embodiment) 1464, in other words, an anode of an organic light-emitting element is formed to have a thickness of 10 to 800 nm over the third interlayer insulating film 1463 (FIG. 34A).

A transparent conductive material having a high work function (work function of 4.0 eV or higher) such as indium tin oxide including Si element, or indium zinc oxide (IZO) that is a mixture of zinc oxide (ZnO) of 2 to 20 atomic % and indium oxide can be used as well as indium tin oxide (ITO) as the pixel electrode (FIG. 34A).

An insulator 1465 (also referred to as a bank, a barrier, a partition wall, a mound and the like) covering an edge of the pixel electrode is formed using another mask. A photosensitive or non-photosensitive organic material (polyimide, acrylic, polyamide, polyimide amide, or benzocyclobutene), resist, or an SOG (Spin On Glass) film (for example, a $SiO_x$ film including an alkyl group), each of which is obtained by a coating method, is used with a thickness of 0.8 to 1 μm as the insulator 1465.

Next, layers containing organic compounds 1471, 1472, 1473, 1474, and 1475 are formed by an evaporation method or a coating method. In order to improve the reliability of the light-emitting element, it is preferable to perform deaeration by performing vacuum heating before forming the layer containing an organic compound 1471. For example, it is preferable to perform a heat treatment at a temperature of 200 to 300° C. in a reduced pressure atmosphere or inert atmosphere in order to remove gas included in the substrate before depositing an organic compound material. In the case where the interlayer insulating film and the bank are formed with a $SiO_x$ film having high heat resistance, a heat treatment at a higher temperature (410° C.) can be performed.

Over the pixel electrode, molybdenum oxide ($MoO_x$), 4,4'-bis[N-(1-naphthyl)-N-phenyl-amino]-biphenyl (α-NPD), and rubrene are selectively co-evaporated using an evaporation mask to form a first layer containing an organic compound 1471 (a hole injection layer).

In addition to $MoO_x$, a material having a high hole injecting property such as copper phthalocyanine (CuPc), vanadium oxide ($VO_x$), ruthenium oxide ($RuO_x$), or tungsten oxide ($WO_x$) can be used. Alternatively, a film formed from a high-molecular material having a high hole injecting property such as a poly(ethylenedioxythiophene)/poly(styrenesulfonic acid) solution (PEDOT/PSS) by a coating method may be used as the hole injection layer 1471.

α-NPD is selectively deposited using an evaporation mask to form a second layer containing an organic compound (hole transporting layer) 1472 over the first layer containing an organic compound 1471. In addition to α-NPD, a material having a high hole transporting property typified by an aromatic amine based compound such as 4,4'-bis[N-(3-methylphenyl)-N-phenyl-amino]-biphenyl (TPD), 4,4',4"-tris(N,N-diphenyl-amino)-triphenylamine (TDATA), or 4,4',4"-tris[N-(3-methylphenyl)-N-phenyl-amino]-triphenylamine (MTDATA) can be used.

A third layer containing an organic compound (light-emitting layer) 1473 is selectively formed. Light-emitting materials for each light-emitting color (R, G, and B) are selectively deposited in the layer containing an organic compound after aligning an evaporation mask for each light-emitting color (R, G, and B) to realize full-color display.

$Alq_3$(tris(8-quinolinolato)aluminum) is selectively deposited using an evaporation mask to form a fourth layer containing an organic compound (electron transporting layer) 1474 over the light-emitting layers 1473. In addition to $Alq_3$, a material having a high electron transporting property typified by a metal complex having a quinoline skeleton or benzoquinoline skeleton such as tris(4-methyl-8-quinolinolate) aluminum ($Almq_3$), bis(10-hydroxybenzo[h]-quinolinato) beryllium ($BeBq_2$), or bis(2-methyl-8-quinolinolato)(4-phenyl phenolato)aluminum (BAlq) can be used. In addition, a metal complex having oxazole-based or thiazole-based ligand such as bis[2-(2-hydroxyphenyl)-benzoxazolato]zinc ($Zn(BOX)_2$) and bis[2-(2-hydroxyphenyl)-benzothiazolato] zinc ($Zn(BTZ)_2$) can also be used. Further, in addition to the metal complexes, 2-(4-biphenylyl)-5-(4-tert-butylphenyl)-1,3,4-oxadiazole (PBD), 1,3-bis[5-(p-tert-butylphenyl)-1,3,4-oxadiazole-2-yl]benzene (OXD-7); 3-(4-tert-butylphenyl)-4-phenyl-5-(4-biphenylyl)-1,2,4-triazole (TAZ); 3-(4-tert-butylphenyl)-4-(4-ethylphenyl)-5-(4-biphenylyl)-1,2,4-triazole (p-EtTAZ); bathophenanthroline (BPhen); bathocuproin (BCP); and the like can be used as the electron transporting layer 1474 since they have a high electron transporting property.

Next, 4,4-bis(5-methylbenzoxazol-2-yl)stilbene (BzOs) and lithium (Li) are co-evaporated to form a fifth layer containing an organic compound (electron injection layer) 1475 entirely covering the electron transporting layer 1474 and the insulator 1465. Damages due to a sputtering method performed in a later process of forming a transparent electrode 1476 can be reduced by using a benzoxazole derivative (BzOs). In addition to BzOs: Li, a compound of an alkali metal, an alkaline earth metal or the like that has a high electron injecting property such as $CaF_2$, lithium fluoride (LiF), or cesium fluoride (CsF) can be used. Further, a mixture of $Alq_3$ and magnesium (Mg) can also be used.

A transparent electrode 1476, in other words, a cathode of the organic light-emitting element, is formed over the electron injection layer 1475 to have a thickness of 10 to 800 nm. Indium tin oxide including Si element or indium zinc oxide (IZO), that is a mixture of zinc oxide (ZnO) of 2 atomic % to 20 atomic % and indium oxide, for example, can be used as well as indium tin oxide (ITO).

In this manner, a light-emitting element is manufactured. Each material for the anode, the first to fifth layers containing organic compounds and the cathode, which consititute the light-emitting element, is appropriately selected, and each thickness thereof is adjusted. It is desired that the anode and the cathode are formed from the same material and have almost the same thickness, preferably, a thin thickness of approximately 100 nm.

If necessary, a transparent protective layer 1477 for preventing water from penetrating into the light-emitting element is formed to cover the light-emitting element. A silicon nitride film, a silicon oxide film, a silicon nitride film containing oxygen (SiNO film having a composition ratio: N>O), a silicon oxide film containing nitrogen (SiON film having a composition ratio: N<O), a thin film mainly containing carbon (for example, a DLC film or a CN film), or the like, each of which can be obtained by a sputtering method or a CVD method, can be used as the transparent protective layer 1477 (FIG. 34B).

Next, a second substrate 1481 is attached to the substrate 1401 with a sealing agent containing a gap material for keeping a gap between the substrates. The second substrate 1481 may also be formed of a glass substrate or a quartz substrate, each of which has a light-transmitting property. Further, the gap between the pair of the substrates may be an air gap (an inert gas) and provided with a drying agent, or filled with a transparent sealing agent (an ultraviolet curing or thermosetting epoxy resin, or the like).

In the light-emitting element, since the pixel electrodes 1464 and 1476 are each formed from a light-transmitting material, light can be emitted from one light-emitting element in two directions, in other words, light can be emitted from both sides.

By forming a panel to have the foregoing structure, the light intensity of light-emission from a top face and a bottom face can be almost the same.

Figure 35:
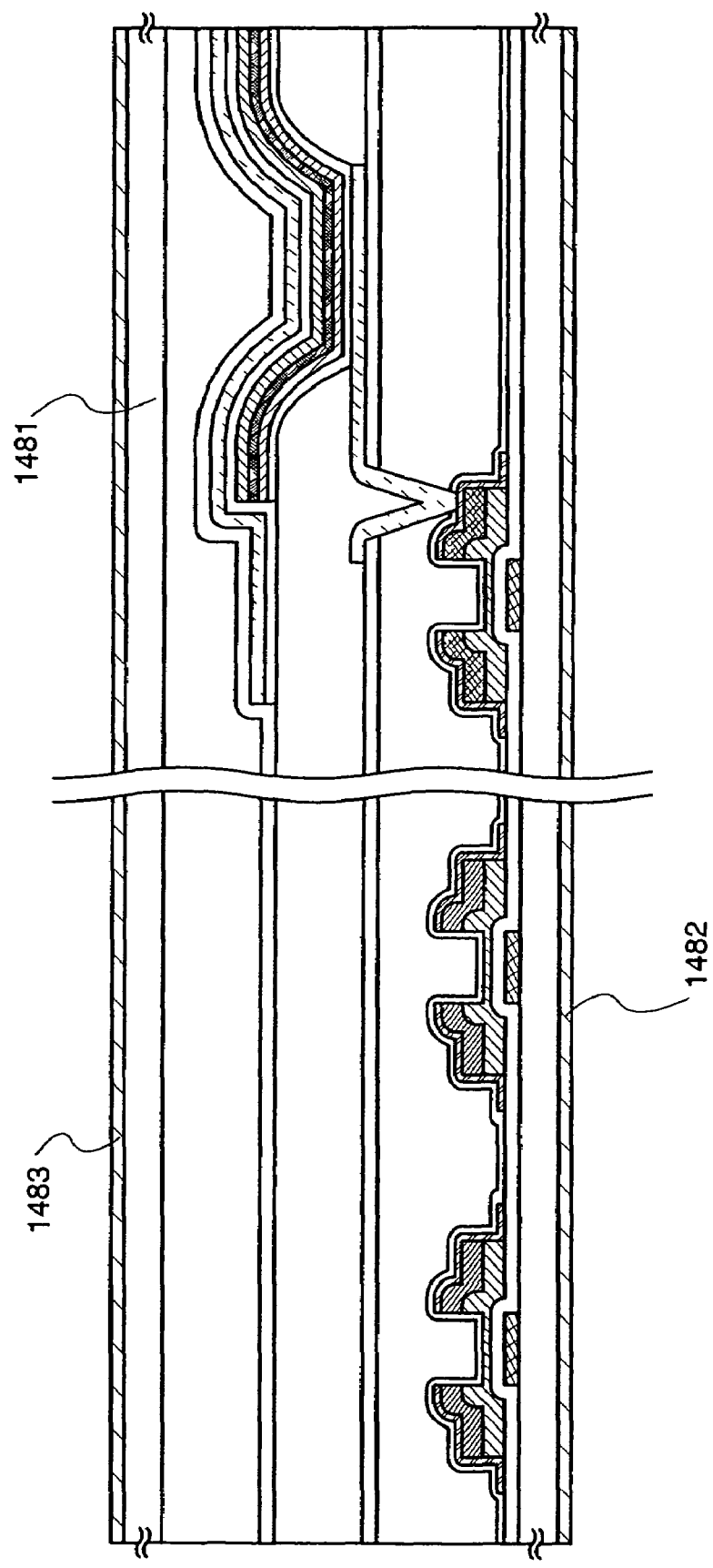
FIG. 35 shows a manufacturing step of an EL display device according to one aspect of the present invention.

Last, optical films (a polarizing plate or a circularly polarizing plate) 1482 and 1483 are provided to improve contrast (FIG. 35).

Figure 36:
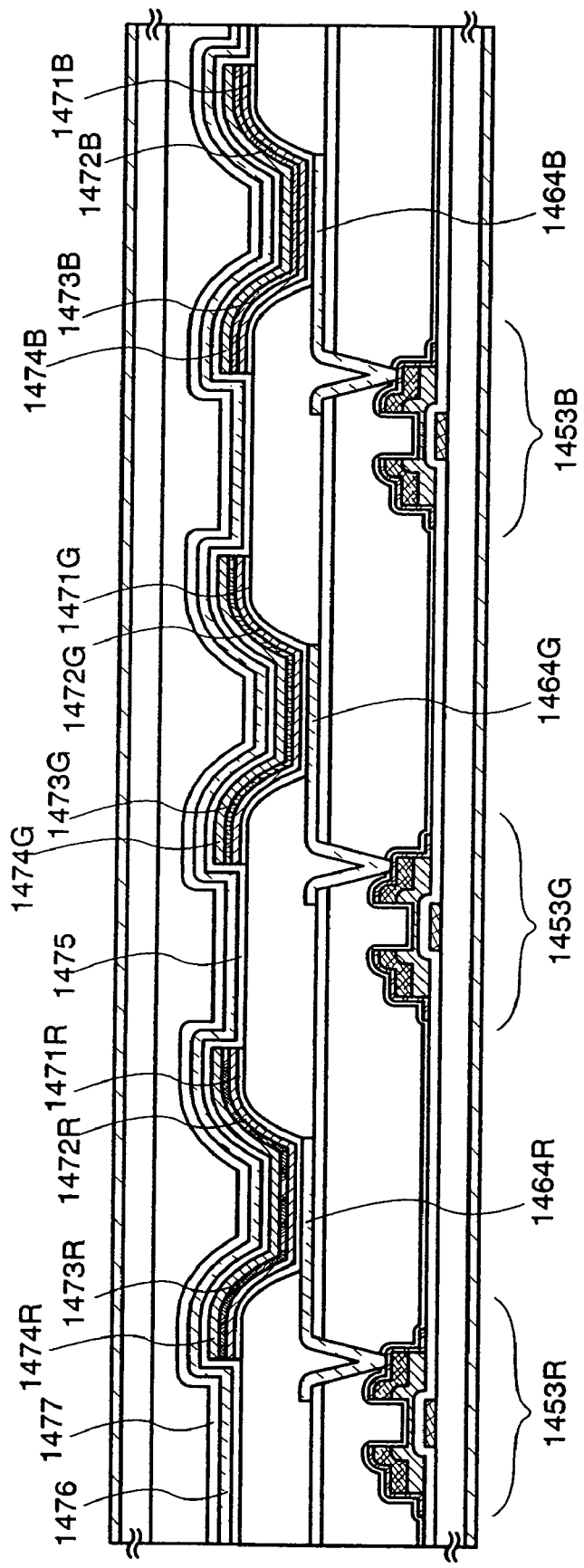
FIG. 36 shows a manufacturing step of an EL display device according to one aspect of the present invention.

An example of manufacturing a pixel TFT for each color of a pixel portion depending on RGB is described in FIG. 36. In a pixel for red color (R), a pixel TFT 1453R is connected to a pixel electrode 1464R. A first layer containing an organic compound (a hole injection layer) 1471R, a second layer containing an organic compound (a hole transporting layer) 1472R, a third layer containing an organic compound (a light-emitting layer) 1473R, a fourth layer containing an organic compound (an electron transporting layer) 1474R, a fifth layer containing an organic compound (an electron injection layer) 1475, a transparent electrode (cathode) 1476, and a transparent protective layer 1477 are formed.

In a pixel for green color (G), a pixel TFT 1453G is connected to a pixel electrode 1464G A first layer containing an organic compound (a hole injection layer) 1471G, a second layer containing an organic compound (a hole transporting layer) 1472G, a third layer containing an organic compound (a light-emitting layer) 1473G, a fourth layer containing an orgnic compound (an electron transporting layer) 1474G, the fifth layer containing an organic compound (an electron injection layer) 1475, the transparent electrode (cathod) 1476, and the transparent protective layer 1477 are formed.

Further, in a pixel for blue color (B), a pixel TFT 1453B is connected to a pixel electrode 1464B. A first layer containing an organic compound (a hole injection layer) 1471B, a second layer containing an organic compound (a hole transporting layer) 1472B, a third layer containing an organic compound (a light-emitting layer) 1473B, a fourth layer containing an organic compound (an electron transporting layer) 1474B, the fifth layer containing an organic compound (an electron injection layer) 1475, the transparent electrode (cathode) 1476, and the transparent protective layer 1477 are formed.

As to the light-emitting layers 1473R, 1473G, and 1473B, a material such as $Alq_3$: DCM or $Alq_3$: rubrene: BisDCJTM is used for the light-emitting layer 1473R exhibiting red emission. A material such as $Alq_3$: DMQD (N,N'-dimethyl quinacridone) or $Alq_3$: coumarin 6 is used for the light-emitting layer 1473G exhibiting green emission. A material such as α-NPD or tBu-DNA is used as the light-emitting layer 1473B exhibiting blue emission.

In this embodiment, the TFT has a single gate structure. However, without being limted thereto, a multi-gate TFT having a plurality of channel regions, for example, a double gate TFT may be employed.

In this embodiment, a dual emission panel has been described. Alternatively, a top emission panel or a bottom emission panel, each of which is a single-side emission panel, can also be used.

When a top emission panel is manufactured, an anode of an organic light-emitting element may be formed from a material having a light-shielding property instead of a transparent electrode. For instance, in case of forming the anode to have a three layered structure including a titanium nitride film, a film containing aluminum as its main component, and a titanium nitride film, the anode can have low resistance as a wiring, have a favorable ohmic contact, and serve as an anode. Further, the anode of an organic light-emitting element may be formed with a single layer such as a titanium nitride film, a chromium film, a tungsten film, a Zn film, a Pt film; or a stacked layer of three or more layers.

A cathode of the top emission panel is preferably transparent or semi-transparent, and can be formed from the same material as that used for forming the pixel electrode.

When a bottom emission panel is manufactured, an anode of an organic light-emitting element can be formed from the same material as that used for forming the pixel electrode.

On the other hand, a material having a light-shielding property and low work function (Al, Ag, Li, Ca, or an alloy of the element such as MgAg, MgIn, AlLi, $CaF_2$, or CaN) may be used as a cathode of the bottom emission panel.

In manufacturing the top emission panel or the bottom emission panel, a layer containing an organic compound in an organic light-emitting element can be appropriately changed depending on a material for each of the anode and the cathode.

Light emitted from a light-emitting element includes light generated in returning to a ground state from a singlet excited state (fluorescence) and light generated in returning to a ground state from a triplet excited state (phosphorescence). In this embodiment, either or both of such light can be used.

As the above described, the embodiment is performed using the process of Embodiment 1. This embodiment can be freely combined with any content of Embodiment Mode and Embodiments 2 to 5, if necessary.

Embodiment 9

Embodiment 9 describes an example of manufacturing an ID chip according to the present invention with reference to FIGS. 37A to 40B.

Further, in this embodiment, an insulated TFT is described as an example of a semiconductor element; however, a semiconductor element used for an integrated circuit is not limited thereto, and any kind of circuit elements can be used. For example, a memory element, a diode, a photoelectric conversion element, a resistor element, a coil, a capacitor element, an inductor, or the like can be given typically, in addition to a TFT.

Further, herein, an ID chip indicates an integrated circuit utilized to identify an object, and stores information for identification in itself. The ID chip can transmit and/or receive information to/from a control system or a reader device by an electric wave or an electromagnetic wave. A production area, an expiration date, distribution channel, or the like of an object to which an ID chip is attached can be known by information which the ID chip has. In addition, in the case of applying to a medical field, safety can be managed by attaching an ID chip to a medicine or a patient.

As illustrated in FIG. 37A, a peeling layer 4001 is formed over a heat-resistant substrate (first substrate) 4000 by a sputtering method. A glass substrate such as barium borosilicate glass or alumino borosilicate glass, a quartz substrate, a ceramic substrate, or the like can be used as the first substrate 4000. In addition, a metal substrate including a stainless steel substrate or a semiconductor substrate with an insulating film formed over its surface may be used. Although a flexible substrate formed from a synthetic resin such as plastic generally tends to be inferior to the above substrates in the heat resistance, the flexible substrate can be used as long as the substrate can resist the processing temperature in the manufacturing process.

The peeling layer 4001 can be a layer containing silicon as its main component such as amorphous silicon, polycrystalline silicon, single-crystal silicon, or microcrystal silicon (including semi-amorphous silicon). The peeling layer 4001 can be formed by a sputtering method, a low pressure thermal CVD method, a plasma CVD method, or the like. In this embodiment, the peeling layer 4001 is formed of amorphous silicon with approximately 50 nm by a low pressure thermal CVD method. The material of the peeling layer 4001 is not limited to silicon, and a material that can be selectively etched may be used. It is preferable that the peeling layer 4001 has the thickness of 50 to 60 nm. In the case of using the semi-amorphous silicon, the peeling layer 4001 may be formed to have a thickness of 30 to 50 nm.

Next, a base film 4002 is formed over the peeling layer 4001. The base film 4002 is provided in order to prevent an alkali metal such as Na or an alkaline earth metal in the first substrate 4000 from diffusing into the semiconductor film. The alkaline earth metal and the alkali metal have an adverse effect on the characteristic of a semiconductor element such as a TFT when they are diffused in the semiconductor. Another purpose of providing the base film 4002 is to protect the semiconductor element in peeling the semiconductor element. The base film 4002 may be a single insulating film or a stacked layer of a plurality of insulating films. Accordingly, the base film 4002 is formed of an insulating film such as silicon oxide, silicon nitride, or silicon nitride oxide, each of which can suppress the diffusion of the alkali metal or the alkaline earth metal into the semiconductor film.

In this embodiment, the base film 4002 is formed by sequentially stacking a silicon oxide film containing nitrogen (SiON film) having a thickness of 100 nm as a first base film (bottom base film) 4002*a*, a silicon nitride film containing oxygen (SiNO film) having a thickness of 50 nm as a second base film (middle base film) 4002*b*, and a silicon oxide film containing nitrogen (SiON film) having a thickness of 100 nm as a third base film (top base film) 4002*c*. However, the material or the thickness of each film, and the number of the stacked films are not limited to the examples. For example, a siloxane-based resin having a thickness of 0.5 to 3 µm may be formed by a spin coating method, a slit coating method, a droplet discharge method, or the like instead of the SiON film, as the bottom base film 4002*a*. A silicon nitride film (SiN$_x$, Si$_3$N$_4$, or the like) may be used instead of the SiNO film, as the middle base film 4002*b*. A silicon oxide film may be used instead of the SiON film, as the top base film 4002*c*. The thickness of each film is desirably in the range of 0.05 to 3 µm, and the thickness may be selected arbitrarily in this range.

Alternatively, the bottom base film 4002*a* of the base film 4002, which is the closest to the peeling layer 4001, may be formed of the SiON film or the silicon oxide film, the middle base film 4002*b* may be formed of a siloxane-based resin, and the top base film 4002*c* may be formed of the silicon oxide film.

The silicon oxide film can be formed by a method such as thermal CVD, plasma CVD, normal-pressure CVD, or bias ECRCVD, using a mixed gas of SiH$_4$ and O$_2$ or a mixed gas of TEOS (tetraethoxysilane), O$_2$, or the like. The silicon nitride film can be formed by a plasma CVD method, typically using a mixed gas of SiH$_4$ and NH$_3$. The silicon oxide film containing nitrogen (SiON: O>N) and the silicon nitride film containing oxygen (SiNO: N>O) can be formed by a plasma CVD method, typically using a mixed gas of SiH$_4$ and N$_2$O.

After forming the base film 4002, the process up to forming a TFT, as described in FIG. 7A to FIG. 9C are peformed according to the same manufacturing process as that in Embodiment 1. The same manufacturing condition, manufacturing process, and materials for forming a film, and the like as those in Embodiment 1 are used unless any description is given (FIG. 37A).

However, in the embodiment, N-channel TFTs 4011 and 4013 and a P-channel TFT 4012 are formed over the substrate 4000. The N-channel TFT 4011 includes a gate electrode 4101, a gate insulating film 4104, an island-shaped crystalline semiconductor film 4111 including a channel region 4113, and a source region and/or a drain region 4112 over the base film 4002.

The P-channel TFT 4012 includes a gate electrode 4102, the gate insulating film 4104, an island-shaped crystalline semiconductor film 4114 including a channel region 4116, and a source region and/or a drain region 4115 over the base film 4002.

The N-channel TFT 4013 includes a gate electrode 4103, the gate insulating film 4104, an island-shaped crystalline semiconductor film 4117 including a channel region 4119, and a source and/or drain region 4118 over the base film 4002.

Wirings 4300 and 4301 are connected to the source region and the drain region 4112 of the N-channel TFT 4011, wirings 4301 and 4302 are connected to the source region and the drain region 4115 of the P-channel TFT 4012, and the wirings 4303 and 4304 are connected to the source or drain region 4118 of the N-channel TFT 4013. Although not shown here, the wiring 4304 is also connected to the gate electrode 4103 of the N-channel TFT 4013. The N-channel TFT 4013 can be used as a memory element of a random ROM.

After that, a first interlayer insulating film 4200 is formed to protect the TFTs 4011 to 4013 and the wirings 4300 to 4304. It is desirable that the first interlayer insulating film is formed using silicon nitride, silicon oxide including nitrogen, aluminum nitride, aluminum oxide, silicon oxide, or the like, each of which can prevent the penetration of the alkali metal or the alkaline earth metal into the TFTs 4011 to 4013. Specifically, for example, a SiON film having a thickness of approximately 600 nm can be used as the first interlayer insulating film 4200. In this case, the hydrogenation treatment may be performed after forming the SiON film. In this manner, the insulating film including three layers of SiON, SiN$_x$, and SiON is formed over the TFTs 4011 to 4013. However, the structure and the materials of these films are not limited thereto. With the above structure, since the TFTs 4011 to 4013 are covered by the base film 4002 and the first interlayer insulating film 4200, it is possible to prevent the alkali metal such as Na or the alkaline earth metal from diffusing into the semiconductor film used for the semiconductor element. The alkali metal such as Na or the alkaline earth metal has an adverse effect on the characteristic of the semiconductor element when it is diffused in the semiconductor, Next, a second interlayer insulating film 4201 is formed over the first interlayer insulating film 4200. The second interlayer insulating film 4201 can be formed from an organic resin having heat resistance such as polyimide, acrylic, or polyamide. Besides, a low dielectric constant material (low-k material), a resin including a Si—O—Si bond formed from a siloxane-based material as a starting material (hereinafter, referred to as a siloxane-based resin), or the like can be used as well as such organic resin. The siloxane is a material having a skeleton structure of a Si—O bond, and having an organic group containing at least hydrogen (for example, alkyl group, aromatic hydrocarbon) as a substituent. In addition, a fluoro group may also be used as a substituent. Further, an organic group containing at least hydrogen and a fluoro group may also be used as a substituent.

The second interlayer insulating film 4201 can be formed by a spin coating method, a dipping method, a spray coating method, a droplet discharge method (an ink-jet method, a screen printing method, an offset printing method, or the like), a doctor knife method, a roller coating method, a curtain coating method, a knife coating method, or the like depending on the material. In addition, an inorganic material may be used, and in this case, silicon oxide, silicon nitride, silicon oxynitride, PSG (phosphosilicate glass), BPSG (borophosphosilicate glass), an alumina film, or the like can be used. Further, the second interlayer insulating film 4201 may be formed by stacking the above insulating films.

In this embodiment, a third interlayer insulating film 4202 is formed over the second interlayer insulating film 4201 (FIG. 37B). The third interlayer insulating film 4202 can be formed of a film including carbon such as DLC (diamond-like carbon) or carbon nitride (CN), a silicon oxide film, a silicon nitride film, or a silicon nitride oxide film by a plasma CVD method, an atmospheric-pressure plasma CVD method, or the like. In addition, a photosensitive or non-photosensitive organic material such as polyimide, acrylic, polyamide, benzocyclobutene, or a resist, a siloxane-based resin, or the like may be used.

A filler may be mixed into the second interlayer insulating film 4201 or the third interlayer insulating film 4202 in order to prevent the second interlayer insulating film 4201 and the third interlayer insulating film 4202 from being peeled and damaged.

Figure 38A:
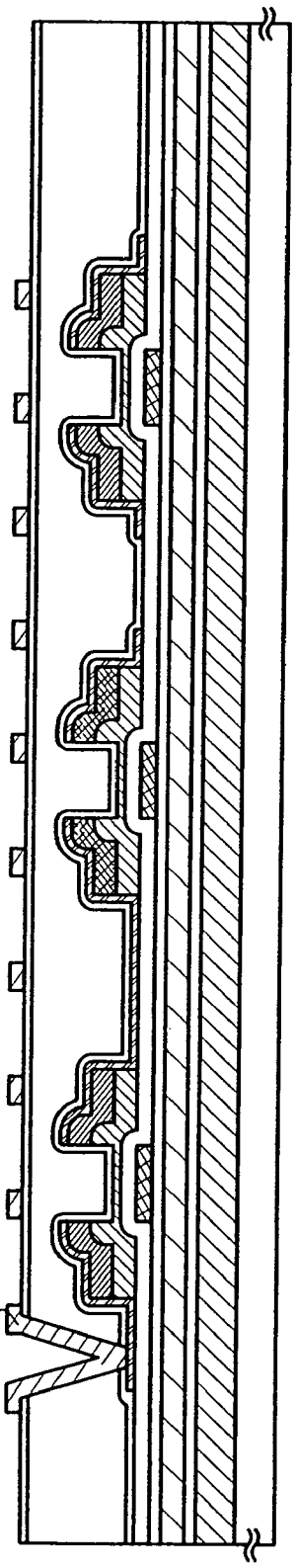
FIGS. 38A and 38B each show a manufacturing step of an ID chip according to one aspect of the present invention.

Next, a contact hole is formed in the first interlayer insulating film 4200, the second interlayer insulating film 4201, and the third interlayer insulating film 4202. A conductive material film is formed over the third interlayer insulating film 4202, and an antenna 4305 is formed by patterning (FIG. 38A). The antenna 4305 can be formed using a conductive material having one or a plurality of metals or metal compounds of Ag, Au, Cu, Pd, Cr, Mo, Ti, Ta, W, Al, Fe, Co, Zn, Sn, Ni, and the like.

The antenna 4305 is connected to the wiring 4300. Although the antenna 4305 is directly connected to the wiring 4300 in FIG. 38A, the ID chip of the present invention is not limited to this structure. For example, the antenna 4305 may be electrically connected to the wiring 4300 using a separately formed wiring.

The antenna 4305 can be formed by a printing method, a photolithography method, an evaporation method, a droplet discharge method, or the like. In this embodiment, the antenna 4305 is formed of a single conductive film, however, the antenna 4305 can be formed by stacking a plurality of conductive films. For example, the antenna 4305 may be formed with a wiring, which is made from Ni or the like and coated with Cu by electroless plating.

The droplet discharge method means a method for forming a predetermined pattern by discharging a droplet including a predetermined composition from a small opening. An ink-jet method is given as an example of the droplet discharge method. The printing method includes a screen printing method, an offset printing method, and the like. When the printing method or the droplet discharge method is employed, the antenna 4305 can be formed without using a mask for light exposure. In addition, if the droplet discharge method and the printing method employed, a wasted material is not generated, such as a material to be removed by etching in the photolithography method. Further, since an expensive mask for the light exposure is not required, the cost spent on manufacturing the ID chip can be reduced.

In the case of using the droplet discharge method or various printing methods, for example, a conductive particle or the like obtained by coating Cu with Ag can be used. When the antenna 4305 is formed by a droplet discharge method, it is desirable to perform a treatment for improving the adhesiveness of the antenna 4305 on a surface of the third interlayer insulating film 4202.

Several methods to improve the adhesiveness are given as follows: a method by which a metal or a metal compound that can improve the adhesiveness of a conductive film or an insulating film due to the catalysis is attached to the surface of the third interlayer insulting film 4202; a method by which an organic insulating film, metal, or metal compound having high adhesiveness to a conductive film or an insulating film is attached to the surface of the third interlayer insulating film 4202; and further a method by which a plasma treatment is performed on the surface of the third interlayer insulating film 4202 under the atmospheric pressure or reduced pressure, so that the surface thereof is modified. Sc, Ti, V, Cr, Mn, Fe, Co, Ni, Cu, or Zn which is a 3d transition element, or the like in addition to titanium or titanium oxide is given as an example of the metal having high adhesiveness to the conductive film or the insulating film. Oxide, nitride, oxynitride, or the like of the above-mentioned metal is given as an example of the metal compound. For example, polyimide, a siloxane-based resin, or the like is given as an example of the organic insulating film.

When the metal or the metal compound attached to the third interlayer insulating film 4202 is conductive, the sheet resistance is controlled so that the antenna can operate normally. Specifically, the average thickness of the conductive metal or metal compound may be adjusted to be, e.g., in the range of from 1 to 10 nm. In addition, the metal or the metal compound may be insulated partially or entirely by oxidization. Furthermore, the metal or the metal compound attached to the region in which the adhesiveness is not required to be improved may be removed selectively by etching. The metal or the metal compound may be attached selectively only to a particular region by a droplet discharge method, a printing method, or a sol-gel method, instead of attaching the metal or the metal compound all over the substrate. The metal or the metal compound does not need to be in a state of completely continuous film on the surface of the third interlayer insulating film 4202 but may be dispersed to some extent.

Figure 38B:
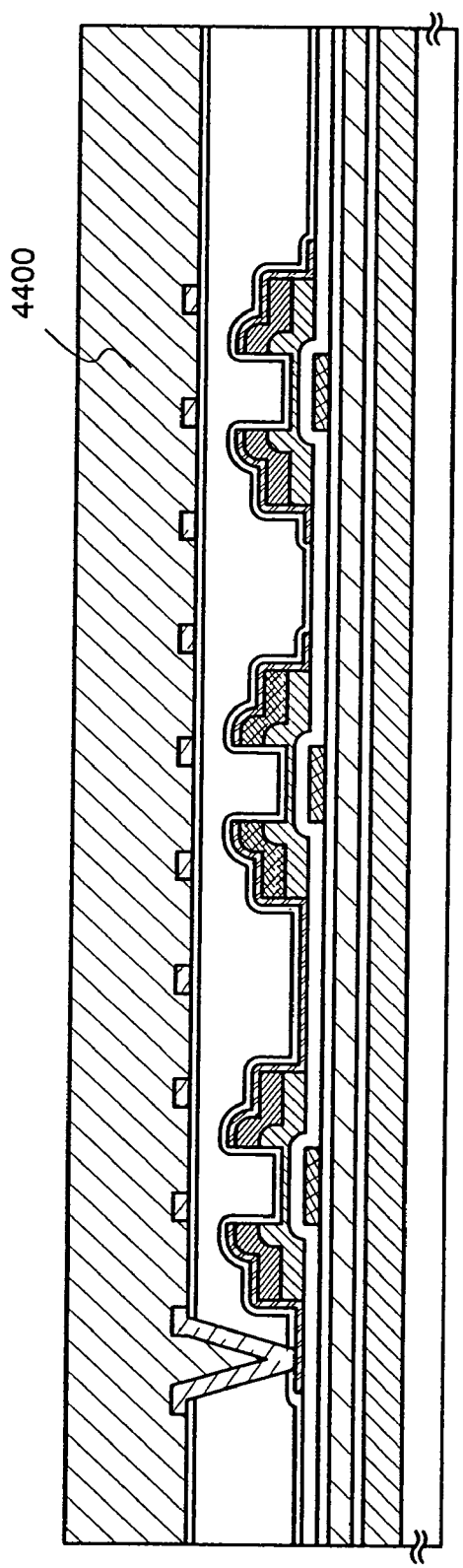

Then, as illustrated in FIG. 38B, after forming the antenna 4305, a protective layer 4400 is formed over the third interlayer insulating film 4202 so as to cover the antenna 4305. The protective layer 4400 is formed using the material that can protect the antenna 4305 when the peeling layer 4001 is etched afterward. For example, the protective layer 4400 can be formed by coating the entire surface with an epoxy-based resin, an acrylate-based resin, or a silicon-based resin soluble in water or alcohols.

In this embodiment, water-soluble resin (VL-WSHL10 manufactured by Toagosei Co., Ltd.) is applied to be 30 μm thick by a spin coating method. After the resin is exposed to light for 2 minutes in order to provisionally cure the resin, the backside of the substrate is irradiated with ultraviolet light for 2.5 minutes temporarily, then, the frontside of the substrate is irradiated with ultraviolet light for 10 minutes, namely 12.5 minutes in total, in order to cure the resin completely. In this manner, the protective layer 4400 is formed. In the case where a plurality of organic resin is stacked, there is a risk that the adhesiveness may become too high or the organic resin may melt partially into each other during coating or baking, depending on the used solvent. Therefore, when the third interlayer insulating film 4202 and the protective layer 4400 are formed of organic resin that can be dissolved in the same solvent, it is preferable to form an inorganic insulating film (a $SiN_x$ film, a $SiN_xO_Y$ film, an $AlN_x$ film, or an $AlN_xO_Y$ film) to cover the third interlayer insulating film 4202 so that the protective layer 4400 can be removed smoothly in a later process.

Next, as illustrated in FIG. 39A, a groove 4401 is formed in order to separate the ID chips from one another. The groove 4401 may have a depth sufficient for exposing the peeling layer 4001. The groove 4401 can be formed by a dicing method, a scribing method, or the like. Further, the groove 4401 is not necessarily formed when it is not required to separate the ID chips formed over the first substrate 4000 from one another.

As illustrated in FIG. 39B, the peeling layer 4001 is etched. In this embodiment, halogen fluoride is used as an etching gas and the gas is added through the groove 4401. In this embodiment, $ClF_3$ (chlorine trifluoride) is used under the condition where the temperature is 350° C., the flow rate is 300 sccm, the pressure is 800 Pa, and the etching time is 3 hours. Furhter, the $ClF_3$ gas mixed with nitrogen may be used. The peeling layer 4001 can be selectively etched by using the halogen fluoride such as $ClF_3$, so that the first substrate 4000 can be peeled from the TFTs 4011 to 4013. The halogen fluoride may be gaseous or liquid.

As illustrated in FIG. 40A, the peeled TFTs 4011 to 4013 and the antenna 4305 are attached to a second substrate 4500 using an adhesive agent 4501. The adhesive agent 4501 is formed of a material that can attach the second substrate 4500 and the base film 4002 to each other. The adhesive agent 4501 may be various types of curable adhesive agents, for example, a reactive-curing type, a thermosetting type, a photo-curing type such as an ultraviolet-curable type, or an anaerobic type.

The second substrate 4500 can be formed of an organic material such as flexible paper or plastic. Alternatively, a flexible inorganic material may be used as the second substrate 4500. The plastic substrate may be formed of ARTON including poly-norbornene that has a polar group (manufactured by JSR). In addition, polyester typified by polyethylene terephthalate (PET), polyether sulfone (PES), polyethylene naphthalate (PEN), polycarbonate (PC), nylon, polyether etherketone (PEEK), polysulfone (PSF), polyether imide (PEI), polyarylate (PAR), polybutylene terephthalate (PBT), polyimide, an acrylonitrile-butadiene-styrene resin, polyvinyl chloride, polypropylene, polyvinyl acetate, an acrylic resin, or the like can be given as an example of the material of the plastic substrate. It is desirable that the second substrate 4500 has heat conductivity as high as approximately 2 to 30 W/mK in order to diffuse the heat generated in the integrated circuit.

As illustrated in FIG. 40B, after removing the protective layer 4400, an adhesive agent 4503 is applied over the third interlayer insulating film 4202 so as to cover the antenna 4305, and then the cover member 4502 is attached. The organic material such as flexible paper or plastic can be used as the cover member 4502 similarly to the second substrate 4500. The thickness of the adhesive agent 4503 may range from 10 to 200 μm, for example.

A material that can attach the cover member 4502 to the third interlayer insulating film 4202 and the antenna 4305 is used as the adhesive agent 4503. The adhesive agent 4503 can be various types of curable adhesive agents, for example, a reactive-curing type, a thermosetting type, photo-curing type such as an ultraviolet-curing type, or an anaerobic type.

According to the foregoing processes, the ID chip is completed. Through the above manufacturing method, an extremely thin integrated circuit having the total thickness in the range of 0.3 to 3 μm, typically approximately 2 μm, can be formed between the second substrate 4500 and the cover member 4502. The thickness of the integrated circuit includes not only the thickness of the semiconductor element but also the thickness of the insulating films and the interlayer insulating films formed between the adhesive agent 4501 and the adhesive agent 4503. The integrated circuit included in the ID chip can be formed to occupy an area of approximately 5 mm square (25 mm$^2$) or less, more preferably approximately 0.3 mm square (0.09 mm$^2$) to 4 mm square (16 mm$^2$).

A mechanical strength of the ID chip can be heightened by more centrally positioning the integrated circuit between the second substrate 4500 and the cover member 4502. Specifically, when the distance between the second substrate 4500 and the cover member 4502 is denoted by d, it is desirable to control the thickness of the adhesive agent 4501 and the adhesive agent 4503 so that a distance between the second substrate 4500 and the center of the integrated-circuit in a thickness direction, x, satisfies Formula 1.

$$\frac{1}{2}d - 30 \ \mu m < x < \frac{1}{2}d + 30 \ \mu m \qquad \text{[Formula 1]}$$

It is preferable that the thickness of the adhesive agent 4501 and the adhesive agent 4503 is controlled so as to satisfy Formula 2.

$$\frac{1}{2}d - 10 \ \mu m < x < \frac{1}{2}d + 10 \ \mu m \qquad \text{[Formula 2]}$$

Although an example of using the cover member 4502 is illustrated in FIG. 40B, the present invention is not limited to this structure. For example, the process may be finished when the process illustrated in FIG. 40A is conducted.

Although this embodiment describes the method for peeling the substrate and the integrated circuit by providing the peeling layer between the first substrate 4000 having high heat resistance and the integrated circuit and removing the peeling layer through the etching, a method for manufacturing the ID chip of the present invention is not limited to this structure. For example, a metal oxide film may be provided between the integrated circuit and the substrate having high heat resistance, and the metal oxide film may be weakened by crystallization so that the integrated circuit is peeled. Alternatively, the peeling layer including an amorphous semiconductor film including hydrogen may be provided between the integrated circuit and the substrate having high heat resistance, and the substrate and the integrated circuit may be peeled by removing the peeling layer by laser irradiation. Alternatively, the integrated circuit may be peeled from the substrate by mechanically removing the substrate having high heat resistance with the integrated circuit formed thereon or by etching the substrate using a solution or gas.

When the adhesive agent 4501 in contact with the base film 4002 is formed of an organic resin in order to secure the flexibility of the ID chip, the diffusion of the alkali metal such as Na or the alkaline earth metal from the organic resin into the semiconductor film can be prevented by using a silicon nitride film or a silicon oxide film containing nitrogen as the base film 4002.

When an ID chip is attached to an object having a curved surface created by movement of a generatrix such as a conical surface or a cylindrical surface, the second substrate 4500 of the ID chip curves is also curved. At this time, it is desirable to make the direction of the generatrix parallel with the moving direction of the carriers in the TFTs 4011 to 4013. With the above structure, even when the second substrate 4500 is bent, it is possible to suppress an adverse effect on characteristics of the TFTs 4011 to 4013. When the proportion of the area occupied by the island-shaped semiconductor film in the integrated circuit is 1% to 30%, it is possible to further suppress the influence on the characteristics of the TFTs 4011 to 4013 due to the bending of the second substrate 4500.

Although this embodiment describes an example for forming the antenna and the integrated circuit on the same substrate, the present invention is not limited to this structure. The antenna and the integrated circuit, which are formed over different substrates, may be attached to each other afterward so that they may be connected electrically.

The frequency of the electric wave usually applied to the ID chip is 13.56 MHz or 2.45 GHz, and it is considerably preferable to form the ID chip so that these frequencies can be detected in order to enhance the versatility.

The ID chip of this embodiment has advantages in that the electric wave is hard to be blocked compared to the ID chip formed over the semiconductor substrate and that attenuation of the signal due to the block of the electric wave can be prevented. Since using the glass substrate can make the cost of the ID chip drastically less than using the semiconductor substrate. For example, the case of using a silicon substrate having a diameter of 12 inches is compared with the case of using a glass substrate having a size of 730×920 $mm^2$. The former, i.e., the silicon substrate, has an area of approximately 73,000 $mm^2$ while the latter, i.e., glass substrate, has an area of approximately 672,000 $mm^2$. Therefore, the glass substrate is approximately 9.2 times larger than the silicon substrate. From the glass substrate having the size of approximately 672,000 $mm^2$, approximately 672,000 ID chips, each of which is 1 mm square, can be obtained when the area wasted by sectioning the substrate is ignored. The number of ID chips is approximately 9.2 times larger than that formed using the silicon substrate. In addition, since fewer steps are required when the glass substrate sized 730×920 $mm^2$ is used than when the semiconductor substrate with a 12-inch diameter is used, the amount of the facility investment for the mass production of the ID chip can be reduced to one-third. Further, after peeling the integrated circuit from the glass substrate, the glass substrate can be reused. Even after considering all the costs for compensating for a damaged glass substrate and washing the surface of the glass substrate, the cost can be decreased to a large degree compared with the case of using the silicon substrate. Even when the glass substrate is disposed without being reused, the cost of the glass substrate having a size of 730×920 $mm^2$ is about half that of the silicon substrate having a diameter of 12 inches. Therefore, it can be understood that the cost for the ID chip can be reduced drastically.

As a result, when the glass substrate having a size of 730×920 $mm^2$ is used, the price of the ID chip can be made approximately one-thirtieth of that of the ID chip formed over the silicon substrate having a diameter of 12 inches. Since the ID chip is expected to be used as a disposable chip, the ID chip of the present invention, whose cost can be drastically reduced, is much suitable for the application.

Although this embodiment describes the example in which the peeled integrated circuit is attached to the flexible substrate, the present invention is not limited to this structure. For example, in the case of using a substrate that can withstand a heat treatment in a process of manufacturing an integrated circuit, like a glass substrate, the integrated circuit is not necessarily peeled.

Moreover, this embodiment can be freely combined with any content of Embodiment Mode and Embodiments 1 to 8, if necessary.

Embodiment 10

Examples of electronic devices to which the present invention can be applied include a video camera, a digital camera, a goggle type display, a navigation system, an audio reproducing device (e.g., a car audio component system), a computer, a game machine, a portable information terminal (e.g., a mobile computer, a cellular phone, a portable game machine, an electronic book, and the like), and an image reproducing device provided with a recording medium (specifically, a device which is capable of reproducing a recording medium such as a Digital Versatile Disc (DVD) and provided with a display capable of displaying the reproduced image). FIGS. 41A to 42D each illustrate specific examples thereof.

Figure 41A:
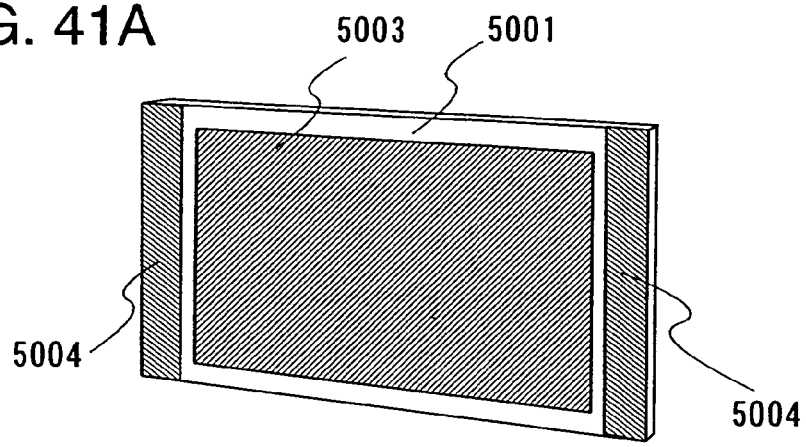
FIGS. 41A to 41D each show an example of an electronic device to which the present invention is applied.

FIG. 41A illustrates a light-emitting display device such as a TV receiver, which includes a casing 5001, a display portion 5003, a speaker portion 5004, and the like. The present invention can be applied to the display portion 5003, a control circuit portion, and the like. A polarizing plate or a circularly polarizing plate may be provided in the pixel portion in order to enhance the contrast. For example, a quarter-wave plate, a half-wave plate, and a polarizing plate may be sequentially provided over the sealing substrate. Further, an anti-reflective film may be provided over the polarizing plate. According to the present invention, the light-emitting display device can be manufactured with fewer steps, and the manufacturing time, the manufacturing cost, and the like can be reduced. In addition, a distribution channel and the like can be clarified when an ID chip manufactured by the method described in Embodiment 9 is attached to the light-emitting display device.

Figure 41B:
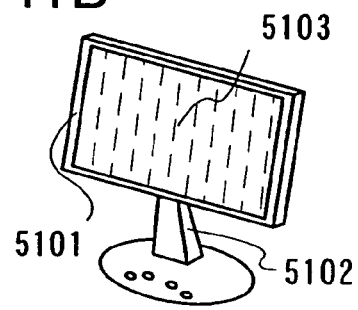

FIG. 41B illustrates a liquid crystal display or an OLED display, which includes a casing 5101, a support 5102, a display portion 5103, and the like. The present invention can be applied to the display portion 5103, a control circuit portion, and the like. According to the present invention, the display can be manufactured with fewer steps, and the manufacturing time, the manufacturing cost, and the like can be reduced. In addition, a distribution channel and the like can be clarified when an ID chip manufactured by the method described in Embodiment 9 is attached to the display.

Figure 41C:
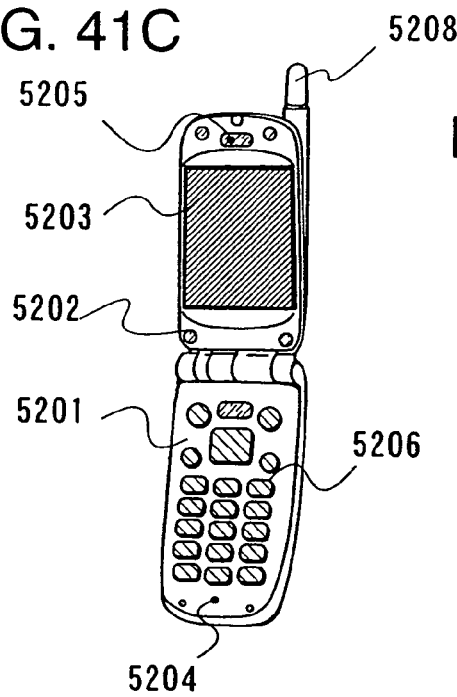

FIG. 41C illustrates a cellular phone, which includes a main body 5201, a casing 5202, a display portion 5203, an audio input portion 5204, an audio output portion 5205, an operation key 5206, an antenna 5208, and the like. The present invention can be applied to the display portion 5203, a control circuit portion, and the like. According to the present invention, the cellular phone can be manufactured with fewer steps, and the manufacturing time, the manufacturing cost, and the like can be reduced. In addition, a distribution channel and the like can be clarified when an ID chip manufactured by the method described in Embodiment 9 is attached to the cellular phone.

Figure 41D:
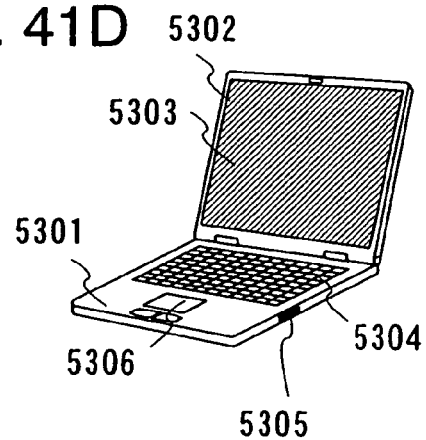

FIG. 41D illustrates a computer, which includes a main body 5301, a casing 5302, a display portion 5303, a keyboard 5304, an external connection port 5305, a pointing mouse 5306, and the like. The present invention can be applied to the display portion 5303, a control circuit portion, and the like. According to the present invention, the computer can be manufactured with fewer steps, and the manufacturing time, the manufacturing cost, and the like can be reduced. In addition, a distribution channel and the like can be clarified when an ID chip manufactured by the method described in Embodiment 9 is attached to the computer.

Figure 42A:
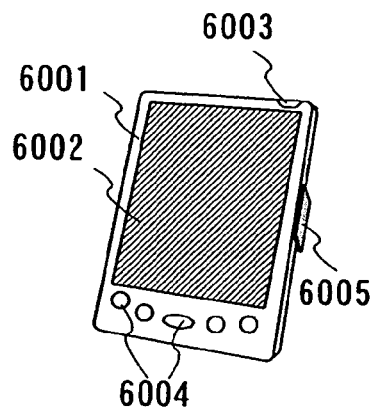
FIGS. 42A to 42D each show an example of an electronic device to which the present invention is applied.

FIG. 42A illustrates a portable computer, which includes a main body 6001, a display portion 6002, a switch 6003, operation keys 6004, an infrared port 6005, and the like. The present invention can be applied to the display portion 6002, a control circuit portion, and the like. According to the present invention, the computer can be manufactured with fewer steps, and the manufacturing time, the manufacturing cost, and the like can be reduced. In addition, a distribution channel and the like can be clarified when an ID chip manufactured by the method described in Embodiment 9 is attached to the portable computer.

Figure 42B:
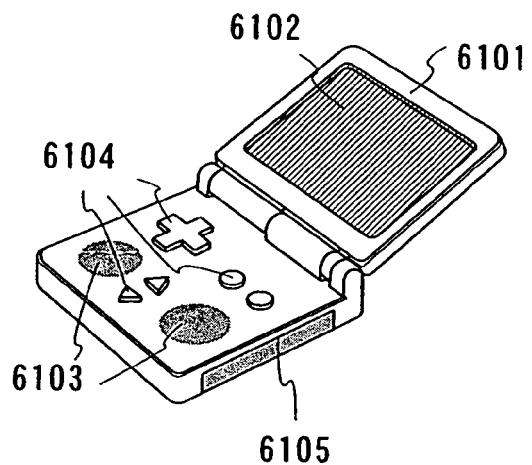

FIG. 42B illustrates a portable game machine, which includes a casing 6101, a display portion 6102, speaker portions 6103, operation keys 6104, a recording medium insert portion 6105, and the like. The present invention can be applied to the display portion 6102, a control circuit portion, and the like. According to the present invention, the game machine can be manufactured with fewer steps, and the manufacturing time, the manufacturing cost, and the like can be reduced. In addition, a distribution channel and the like can be clarified when an ID chip manufactured by the method described in Embodiment 9 attached to on the portable game machine.

Figure 42C:
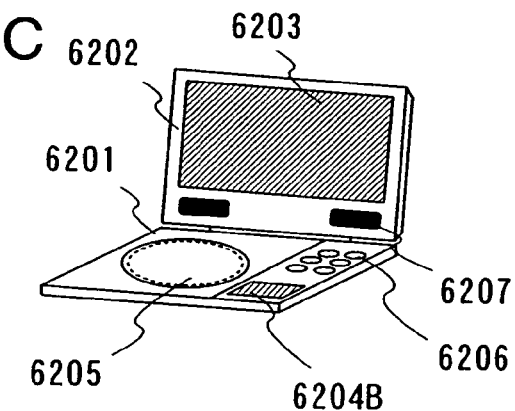

FIG. 42C illustrates a portable image-reproducing device equipped with a recording medium (specifically, a DVD player), which includes a main body 6201, a casing 6202, a display portion A 6203, a display portion B 6204, a recording medium (such as a DVD) loading portion 6205, operation keys 6206, speaker portions 6207, and the like. The display portion A 6203 mainly displays image information, and the display portion B 6204 mainly displays character information. The present invention can be applied to the display portion A 6203, the display portion B 6204, a control circuit portion, and the like. Further, the image-reproducing device equipped with a recording medium includes a home video game machine and the like. According to the present invention, the image-reproducing device can be manufactured with fewer steps, and the manufacturing time, the manufacturing cost, and the like can be reduced. In addition, a distribution channel and the like can be clarified when an ID chip manufactured by the method described in Embodiment 9 is attached to the image-reproducing device.

Figure 42D:
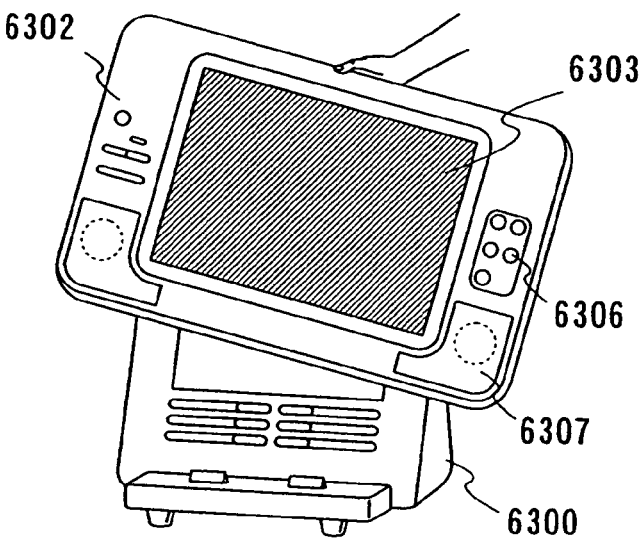

FIG. 42D illustrates a TV set having a wireless portable display. A casing 6302 has a built-in battery and a built-in signal receiver, and a display portion 6303 or a speaker portion 6307 is driven by the battery. The buttery can be charged repeatedly by a battery charger 6300. The battery charger 6300 can transmit and receive an image signal, and transmit an image signal to the signal receiver of the display. The casing 6302 is controlled by operation keys 6306. The device illustrated in FIG. 42D can also be referred to as a video-audio bidirectional communication device, since a signal can also be transmitted to the battery charger 6300 from the casing 6302 by operating the operation keys 6306. Further, the device can be also referred to as a versatile remote-control device, since a signal is transmitted to the battery charger 6300 from the casing 6302 and a signal that the battery charger 6300 can transmit is received by another electronic device by operating the operation keys 6306, thereby controlling communication of another electronic device. The present invention can be applied to the display portion 6303, a control circuit portion, and the like. According to the present invention, the TV set can be manufactured with fewer steps, and the manufacturing time, the manufacturing cost, and the like can be reduced. In addition, a distribution channel and the like can be clarified when an ID chip manufactured by the method described in Embodiment 9 is attached to the TV.

A plastic substrate having heat resistance, in addition to a glass substrate, can be used for a display device used for these electronic devices depending on its size, intensity, or intended use. Accordingly, the weight can be further reduced.

Further, the examples described in this embodiment are just examples, and the present invention is not limited to these uses.

This embodiment can be arbitrarily combined with any content of Embodiment Mode and Embodiments 1 to 9.

According to the present invention, one-time heat treatment step for crystallization and gettering is performed simultaneously, and the number of steps is reduced drastically. By decreasing the number of steps, high production costs and decrease in yield can be suppressed.

The present application is based on Japanese Priority Application No. 2004-260846 filed on Sep. 8, 2004 with the Japan Patent Office, the entire contents of which are hereby incorporated by reference.

What is claimed is:

1. A method for manufacturing a semiconductor device, comprising the steps of:
    forming a gate electrode over a substrate;
    forming a gate insulating film over the gate electrode;
    forming a first amorphous semiconductor film over the gate insulating film;
    forming a second semiconductor film including an element selected from Group 15 of the periodic table over the first amorphous semiconductor film;
    patterning the first amorphous semiconductor film and the second semiconductor film including the element selected from Group 15 of the periodic table to form a first island-shaped amorphous semiconductor film and a second island-shaped semiconductor film, respectively;
    forming at least one of a source electrode and a drain electrode over the second island-shaped semiconductor film;
    removing a portion of the second island-shaped semiconductor film to form at least one of a source region and a drain region using said at least one of the source electrode and the drain electrode as a mask and reducing a thickness of the first island-shaped amorphous semiconductor film to partially expose the first island-shaped amorphous semiconductor film;
    adding a catalytic element, which promotes crystallization of the first island-shaped amorphous semiconductor film, into a region where the first island-shaped amorphous semiconductor film is exposed; and
    gettering the catalytic element by said at least one of the source region and the drain region simultaneously with crystallizing the first island-shaped amorphous semiconductor film to form an island-shaped crystalline semiconductor film by heating said at least one of the source region and the drain region and the first island-shaped amorphous semiconductor film.

2. A method for manufacturing a semiconductor device, comprising the steps of:
    forming a gate electrode over a substrate;
    forming a gate insulating film over the gate electrode;
    forming a first amorphous semiconductor film over the gate insulating film;
    forming a second semiconductor film including an element selected from Group 15 of the periodic table over the first amorphous semiconductor film;
    patterning the first amorphous semiconductor film and the second semiconductor film including the element selected from Group 15 of the periodic table to form a first island-shaped amorphous semiconductor film and a second island-shaped semiconductor film, respectively;
    forming at least one of a source electrode and a drain electrode over the second island-shaped semiconductor film;
    removing a portion of the second island-shaped semiconductor film to form at least one of a source region and a drain region using said at least one of the source electrode and the drain electrode as a mask and reducing a thickness of the first island-shaped amorphous semiconductor film to partially expose the first island-shaped amorphous semiconductor film;

forming a mask to cover said at least one of the source electrode and the drain electrode and a region in which the first island-shaped amorphous semiconductor film is exposed;

forming an opening by etching the mask over a region in which the first island-shaped amorphous semiconductor film is exposed to expose a portion of the first island-shaped amorphous semiconductor film;

adding a catalytic element promoting crystallization of the first island-shaped amorphous semiconductor film into the portion of the first island-shaped amorphous semiconductor film through the opening; and gettering the catalytic element to said at least one of the source region or the drain region simultaneously with crystallizing the first island-shaped amorphous semiconductor film to form an island-shaped crystalline semiconductor film by heating said at least one of the source region or the drain region and the first island-shaped amorphous semiconductor film.

3. A method for manufacturing a semiconductor device, comprising the steps of:

forming a gate electrode over a substrate;
forming a gate insulating film over the gate electrode;
forming a first amorphous semiconductor film over the gate insulating film;
forming a second semiconductor film including an element selected from Group 15 of the periodic table over the first amorphous semiconductor film;
patterning the first amorphous semiconductor film and the second semiconductor film including the element selected from Group 15 of the periodic table to form a first island-shaped amorphous semiconductor film and a second island-shaped semiconductor film, respectively;
forming at least one of a source electrode and a drain electrode over the second island-shaped semiconductor film;
removing a portion of the second island-shaped semiconductor film to form at least one of a source region and a drain region using said at least one of the source electrode and the drain electrode as a mask and reducing a thickness of the first island-shaped amorphous semiconductor film to partially expose the first island-shaped amorphous semiconductor film;
adding a catalytic element promoting crystallization of the first island-shaped amorphous semiconductor film into a region where the first island-shaped amorphous semiconductor film is exposed;
gettering the catalytic element by said at least one of the source region and the drain region simultaneously with crystallizing the first island-shaped amorphous semiconductor film to form an island-shaped crystalline semiconductor film by heating said at least one of the source region and the drain region and the first island-shaped amorphous semiconductor film; and
forming a wiring which electrically connects to said at least one of the source electrode and the drain electrode.

4. A method for manufacturing a semiconductor device, comprising the steps of:

forming a gate electrode over a substrate;
forming a gate insulating film over the gate electrode;
forming a first amorphous semiconductor film over the gate insulating film;
forming a second semiconductor film including an element selected from Group 15 of the periodic table over the first amorphous semiconductor film;
patterning the first amorphous semiconductor film and the second semiconductor film including the element selected from Group 15 of the periodic table to form a first island-shaped amorphous semiconductor film and a second island-shaped semiconductor film, respectively;
forming a mask over the second island-shaped semiconductor film;
removing a portion of the second island-shaped semiconductor film to form at least one of a source region and a drain region using the mask and reducing a thickness of the island-shaped amorphous semiconductor film to partially expose the island-shaped amorphous semiconductor film;
adding a catalytic element promoting crystallization of the island-shaped amorphous semiconductor film into the region where the island-shaped amorphous semiconductor film is exposed;
gettering the catalytic element by said at least one of the source region and the drain region simultaneously with crystallizing the island-shaped amorphous semiconductor film to form an island-shaped crystalline semiconductor film by heating said at least one of the source region and the drain region and the island-shaped amorphous semiconductor film; and
forming a wiring which electrically connects to said at least one of the source region or the drain region.

5. The method for manufacturing the semiconductor device according to claim 3, wherein the wiring is formed using a low-melting point conductive material.

6. The method for manufacturing the semiconductor device according to claim 5, wherein the wiring is formed by a sputtering method, a droplet discharge method, or a CVD method.

7. The method for manufacturing the semiconductor device according to claim 1, wherein the element selected from Group 15 of the periodic table is activated by the step of heating.

8. A method for manufacturing a semiconductor device, comprising the steps of:

forming a gate electrode over a substrate;
forming a gate insulating film over the gate insulating film;
forming an amorphous semiconductor film over the gate insulating film;
forming a semiconductor film including an element selected from Group 15 of the periodic table over the amorphous semiconductor film;
adding an element selected from Group 13 of the periodic table into the semiconductor film including the element selected from Group 15 of the periodic table;
patterning the amorphous semiconductor film and the semiconductor film including the elements selected from Group 15 and Group 13 of the periodic table to form an island-shaped amorphous semiconductor film and an island-shaped semiconductor film, respectively;
forming at least one of a source electrode and a drain electrode over the island-shaped semiconductor film;
removing a portion of the island-shaped semiconductor film to form at least one of a source region and a drain region using said at least one of the source electrode and the drain electrode as a mask and exposing a portion of the island-shaped amorphous semiconductor film by reducing the thickness of the island-shaped amorphous semiconductor film;

adding a catalytic element promoting crystallization of the island-shaped amorphous semiconductor film into a region where the island-shaped amorphous semiconductor film is exposed; and gettering the catalytic element by said at least one of the source region and the drain region simultaneously with crystallizing the island-shaped amorphous semiconductor film to form an island-shaped crystalline semiconductor film by heating said at least one of the source region and the drain region and the island-shaped amorphous semiconductor film.

9. The method for manufacturing the semiconductor device according to claim 8, wherein the elements selected from Group 15 and Group 13 of the periodic table are activated by the step of heating.

10. The method for manufacturing the semiconductor device according to claim 1, wherein the catalytic element is an element or a plurality of elements selected from nickel (Ni), iron (Fe), palladium (Pd), tin (Sn), lead (Pb), cobalt (Co), platinum (Pt), copper (Cu), and gold (Au).

11. The method for manufacturing the semiconductor device according to any one of claim 1 to 10, wherein said at least one of the source electrode and the drain electrode is formed with an element selected from tantalum (Ta), tungsten (W), titanium (Ti), and molybdenum (Mo); or an alloy material or a compound material containing the element as its main component.

12. The method for manufacturing the semiconductor device according to claim 4, wherein the wiring is formed using a low-melting point conductive material.

13. The method for manufacturing the semiconductor device according to claim 2, wherein the element selected from Group 15 of the periodic table is activated by the step of heating.

14. The method for manufacturing the semiconductor device according to claim 3, wherein the element selected from Group 15 of the periodic table is activated by the step of heating.

15. The method for manufacturing the semiconductor device according to claim 4, wherein the element selected from Group 15 of the periodic table is activated by the step of heating.

16. The method for manufacturing the semiconductor device according to claim 2, wherein the catalytic element is an element or a plurality of elements selected from nickel (Ni), iron (Fe), palladium (Pd), tin (Sn), lead (Pb), cobalt (Co), platinum (Pt), copper (Cu), and gold (Au).

17. The method for manufacturing the semiconductor device according to claim 3, wherein the catalytic element is an element or a plurality of elements selected from nickel (Ni), iron (Fe), palladium (Pd), tin (Sn), lead (Pb), cobalt (Go), platinum (Pt), copper (Cu), and gold (Au).

18. The method for manufacturing the semiconductor device according to claim 4, wherein the catalytic element is an element or a plurality of elements selected from nickel (Ni), iron (Fe), palladium (Pd), tin (Sn), lead (Pb), cobalt (Co), platinum (Pt), copper (Cu), and gold (Au).

19. The method for manufacturing the semiconductor device according to claim 8, wherein the catalytic element is an element or a plurality of elements selected from nickel (Ni), iron (Fe), palladium (Pd), tin (Sn), lead (Pb), cobalt (Co), platinum (Pt), copper (Cu), and gold (Au).

* * * * *